United States Patent
Diep et al.

(10) Patent No.: US 10,566,059 B2
(45) Date of Patent: Feb. 18, 2020

(54) THREE DIMENSIONAL NAND MEMORY DEVICE WITH DRAIN SELECT GATE ELECTRODE SHARED BETWEEN MULTIPLE STRINGS

(71) Applicant: SANDISK TECHNOLOGIES LLC, Addison, TX (US)

(72) Inventors: Vinh Diep, San Jose, CA (US); Ching Huang Lu, Fremont, CA (US); Henry Chin, Fremont, CA (US); Changyuan Chen, San Ramon, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/014,028

(22) Filed: Jun. 21, 2018

(65) Prior Publication Data

US 2019/0333581 A1    Oct. 31, 2019

Related U.S. Application Data

(60) Provisional application No. 62/664,441, filed on Apr. 30, 2018.

(51) Int. Cl.
*G11C 11/34* (2006.01)
*G11C 16/04* (2006.01)
(Continued)

(52) U.S. Cl.
CPC ...... *G11C 16/0483* (2013.01); *H01L 27/1157* (2013.01); *H01L 27/11573* (2013.01);
(Continued)

(58) Field of Classification Search
CPC ............ G11C 16/0483; H01L 27/1157; H01L 27/11573; H01L 27/11582; H01L 29/42344; H01L 29/7926
(Continued)

(56) References Cited

U.S. PATENT DOCUMENTS 5,191,556 A * 3/1993 Radjy .................... G11C 16/10
365/182
5,915,167 A     6/1999 Leedy
(Continued)

FOREIGN PATENT DOCUMENTS

KR     10-2011-0010 A     1/2011

OTHER PUBLICATIONS

Notification of Transmittal of the International Search Report and Written Opinion of the International Search Authority for International Patent Application No. PCTU/US2019/017103, dated May 30, 2019, 2 pages.
(Continued)

*Primary Examiner* — Viet Q Nguyen
(74) *Attorney, Agent, or Firm* — The Marbury Law Group PLLC

(57) ABSTRACT

Systems, methods, and devices of the various embodiments provide both "string-sharing" drain select gate electrodes and "string-selective" drain select gate electrodes in vertical NAND strings. Various embodiments may provide two or more vertical NAND strings sharing a common drain select gate electrode while also having separate additional drain select gate electrodes not electrically connected across the two or more vertical NAND strings.

15 Claims, 31 Drawing Sheets

(51) Int. Cl.
  *H01L 27/1157* (2017.01)
  *H01L 29/423* (2006.01)
  *H01L 27/11573* (2017.01)
  *H01L 29/792* (2006.01)
  *H01L 27/11582* (2017.01)

(52) U.S. Cl.
  CPC .. *H01L 27/11582* (2013.01); *H01L 29/42344* (2013.01); *H01L 29/7926* (2013.01)

(58) Field of Classification Search
  USPC ................................ 365/185.17, 63, 185.05
  See application file for complete search history.

(56) References Cited

U.S. PATENT DOCUMENTS

| | | | | |
|---|---|---|---|---|
| 8,861,275 | B2* | 10/2014 | Maeda | G11C 16/0483 365/185.17 |
| 9,595,331 | B1* | 3/2017 | Lee | G11C 16/08 |
| 10,008,271 | B1* | 6/2018 | Diep | G11C 16/10 |
| 10,020,062 | B1* | 7/2018 | Oh | G11C 16/3418 |
| 10,170,188 | B1* | 1/2019 | Yip | G11C 16/0483 |
| 10,204,689 | B1* | 2/2019 | Lu | G11C 16/3427 |
| 10,235,294 | B1* | 3/2019 | Lu | G06F 12/0866 |
| 2003/0039146 | A1* | 2/2003 | Choi | G11C 16/0433 365/185.33 |
| 2007/0187749 | A1 | 8/2007 | Sugimae et al. | |
| 2012/0300547 | A1* | 11/2012 | Choi | H01L 27/11565 365/185.05 |
| 2012/0320698 | A1* | 12/2012 | Itagaki | G11C 16/16 365/218 |
| 2013/0001701 | A1 | 1/2013 | Christensen et al. | |
| 2014/0063947 | A1* | 3/2014 | Ghodsi | G11C 16/0483 365/185.11 |
| 2014/0269100 | A1* | 9/2014 | Sel | G11C 16/24 365/185.24 |
| 2015/0003157 | A1* | 1/2015 | Aritome | G11C 16/0408 365/185.11 |
| 2015/0003158 | A1* | 1/2015 | Aritome | G11C 16/0483 365/185.11 |
| 2015/0023103 | A1* | 1/2015 | Aritome | G11C 16/04 365/185.12 |
| 2016/0012893 | A1* | 1/2016 | Ahn | G11C 16/0483 365/185.2 |
| 2016/0055911 | A1* | 2/2016 | Nguyen | G11C 16/10 365/185.17 |
| 2016/0056210 | A1 | 2/2016 | Takaki | |
| 2016/0099063 | A1* | 4/2016 | Shim | G11C 16/14 365/185.19 |
| 2016/0163390 | A1* | 6/2016 | Park | G11C 16/10 365/185.11 |
| 2016/0203872 | A1* | 7/2016 | Kim | G11C 16/26 365/185.11 |
| 2016/0365354 | A1* | 12/2016 | Lee | H01L 27/11582 |
| 2017/0278571 | A1* | 9/2017 | Chowdhury | G11C 16/0483 |
| 2018/0075910 | A1* | 3/2018 | Seong | G11C 11/063 |
| 2018/0233513 | A1* | 8/2018 | Zhang | H01L 27/11582 |
| 2018/0254282 | A1* | 9/2018 | Tanzawa | H01L 27/11526 |
| 2019/0074061 | A1* | 3/2019 | Ghodsi | G11C 16/0483 |
| 2019/0156894 | A1* | 5/2019 | Park | G11C 16/10 |
| 2019/0189216 | A1* | 6/2019 | Baek | G11C 16/10 |

OTHER PUBLICATIONS

International Search Report from the International Searching Authority for International Patent Application No. PCTU/US2019/017103, dated May 30, 2019, 3 pages.

Written Opinion of the International Searching Authority for International Patent Application No. PCTU/US2019/017103, dated May 30, 2019, 4 pages.

U.S. Appl. No. 15/948,737, filed Apr. 9, 2018, SanDisk Technologies LLC.

* cited by examiner

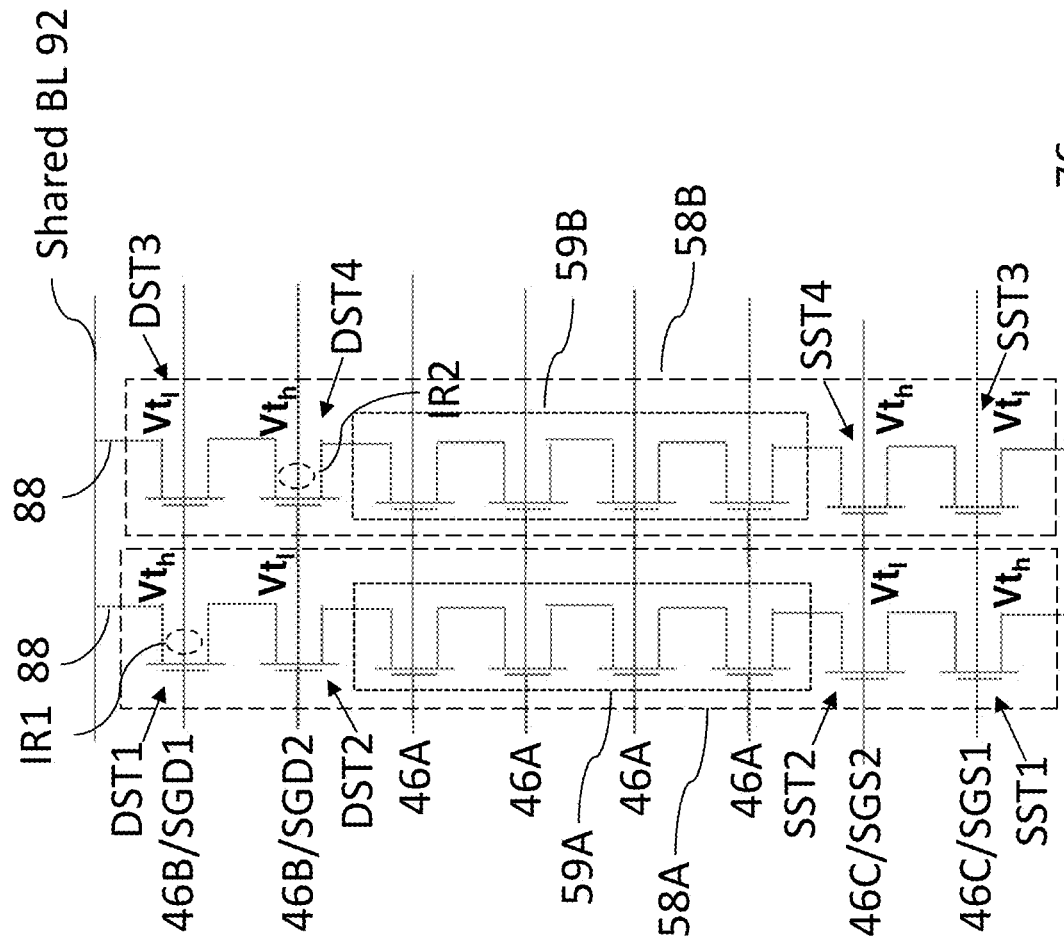

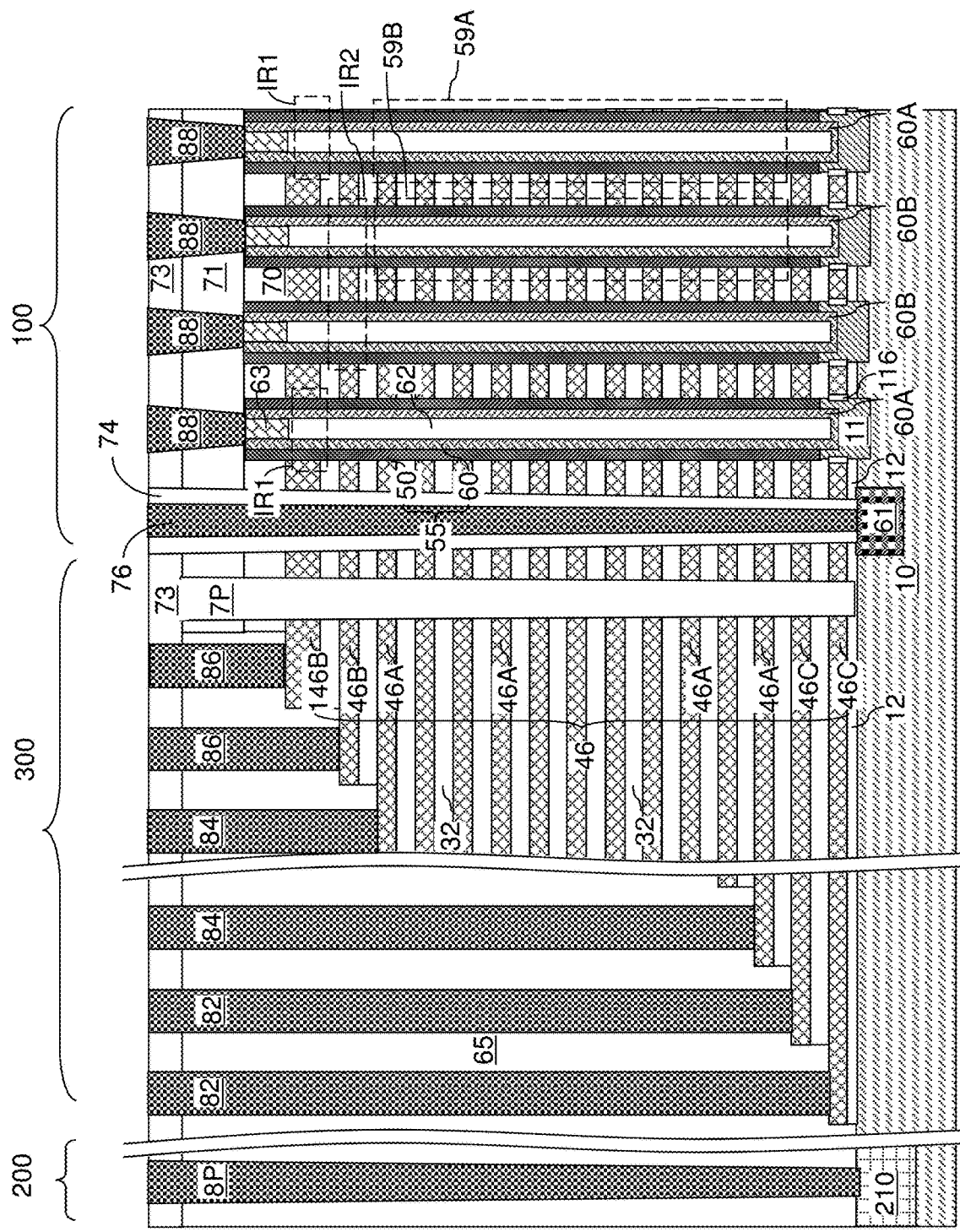

THREE DIMENSIONAL NAND MEMORY DEVICE WITH DRAIN SELECT GATE ELECTRODE SHARED BETWEEN MULTIPLE STRINGS

CROSS REFERENCE TO RELATED APPLICATIONS

The present application claims priority to U.S. Provisional Patent Application Ser. No. 62/664,441 filed on Apr. 30, 2018, the entire contents of which care incorporated herein by reference.

FIELD

The present disclosure relates generally to the field of semiconductor devices and specifically to three-dimensional non-volatile memory devices, such as vertical NAND strings and other three-dimensional devices, and methods of making the same.

BACKGROUND

Recently, ultra high density storage devices have been proposed using a three-dimensional (3D) stacked memory stack structure sometimes referred to as Bit Cost Scalable (BiCS) architecture. For example, a 3D NAND stacked memory device can be formed from an array of alternating conductive and dielectric layers. A memory opening is formed through the layers to define many memory layers simultaneously. A NAND string is then formed by filling the memory opening with appropriate materials. A straight NAND string extends in one memory opening, while a pipe- or U-shaped NAND string (p-BiCS) includes a pair of vertical columns of memory cells. Control gates of the memory cells may be provided by the conductive layers.

SUMMARY

Systems, methods, and devices of the various embodiments provide both "string-sharing" drain select gate electrodes and "string-selective" drain select gate electrodes in vertical NAND strings. Various embodiments may provide two or more vertical NAND strings sharing a common drain select gate electrode while also having separate additional drain select gate electrodes not electrically connected across the two or more vertical NAND strings. Various embodiments may prevent undesired drain select gate erase and voltage threshold upshift during Gate Induced Drain Leakage (GIDL) erase operations.

According to an aspect of the present disclosure, a memory device comprises an alternating stack of insulating layers and electrically conductive layers located over a substrate, a first vertical NAND string extending through the alternating stack, the first vertical NAND string comprising a first drain region and first memory cell charge storage transistors in a series connection with a first drain select transistor and a second drain select transistor, a second vertical NAND string extending through the alternating stack, the second vertical NAND string comprising a second drain region and second memory cell charge storage transistors in a series connection with a third drain select transistor and a fourth drain select transistor, a common drain select gate electrode shared between the first drain select transistor and the third drain select transistor, a first separate drain select gate electrode connected to the second drain select transistor, and a second separate drain select gate electrode connected to the fourth drain select transistor. The first separate drain select gate electrode and the second separate drain select gate electrode are not electrically connected to each other.

According to an aspect of the present disclosure, a method of making a memory device is provided. An alternating stack of insulating layers and spacer material layers is formed over a substrate. The spacer material layers are formed as, or subsequently replace with, electrically conductive layers. A first vertical NAND string extending through the alternating stack is formed, the first vertical NAND string comprising a first drain region and first memory cell charge storage transistors in a series connection with a first drain select transistor and a second drain select transistor. A second vertical NAND string extending through the alternating stack is formed, the second vertical NAND string comprising a second drain region and second memory cell charge storage transistors in a series connection with a third drain select transistor and a fourth drain select transistor. A common drain select gate electrode shared between the first drain select transistor and the third drain select transistor is formed. A first separate drain select gate electrode connected to the second drain select transistor is formed. A second separate drain select gate electrode connected to the fourth drain select transistor is formed. The first separate drain select gate electrode and the second separate drain select gate electrode are formed such that the first separate drain select gate electrode and the second separate drain select gate electrode are not electrically connected to each other.

BRIEF DESCRIPTION OF THE DRAWINGS

FIG. 9 is a schematic of a circuit including a pair of vertical NAND strings and additional devices attached thereto according to an embodiment of the present disclosure.

FIGS. 19A and 19B are vertical cross-sectional views of steps in a method of making a vertical NAND device according to an alternative embodiment of the present disclosure.

DETAILED DESCRIPTION

As discussed above, the present disclosure is directed to three-dimensional non-volatile memory devices, such as vertical NAND strings and other three-dimensional devices, and methods of making the same, the various aspects of which are described below. The embodiments of the disclosure can be employed to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The substrate may include integrated circuits fabricated thereon, such as driver circuits for a memory device The various three dimensional memory devices of the present disclosure include a monolithic three-dimensional NAND string memory device, and can be fabricated employing the various embodiments described herein. The monolithic three dimensional NAND string is located in a monolithic, three dimensional array of NAND strings located over the substrate. At least one memory cell in the first device level of the three dimensional array of NAND strings is located over another memory cell in the second device level of the three dimensional array of NAND strings.

Figure 1:
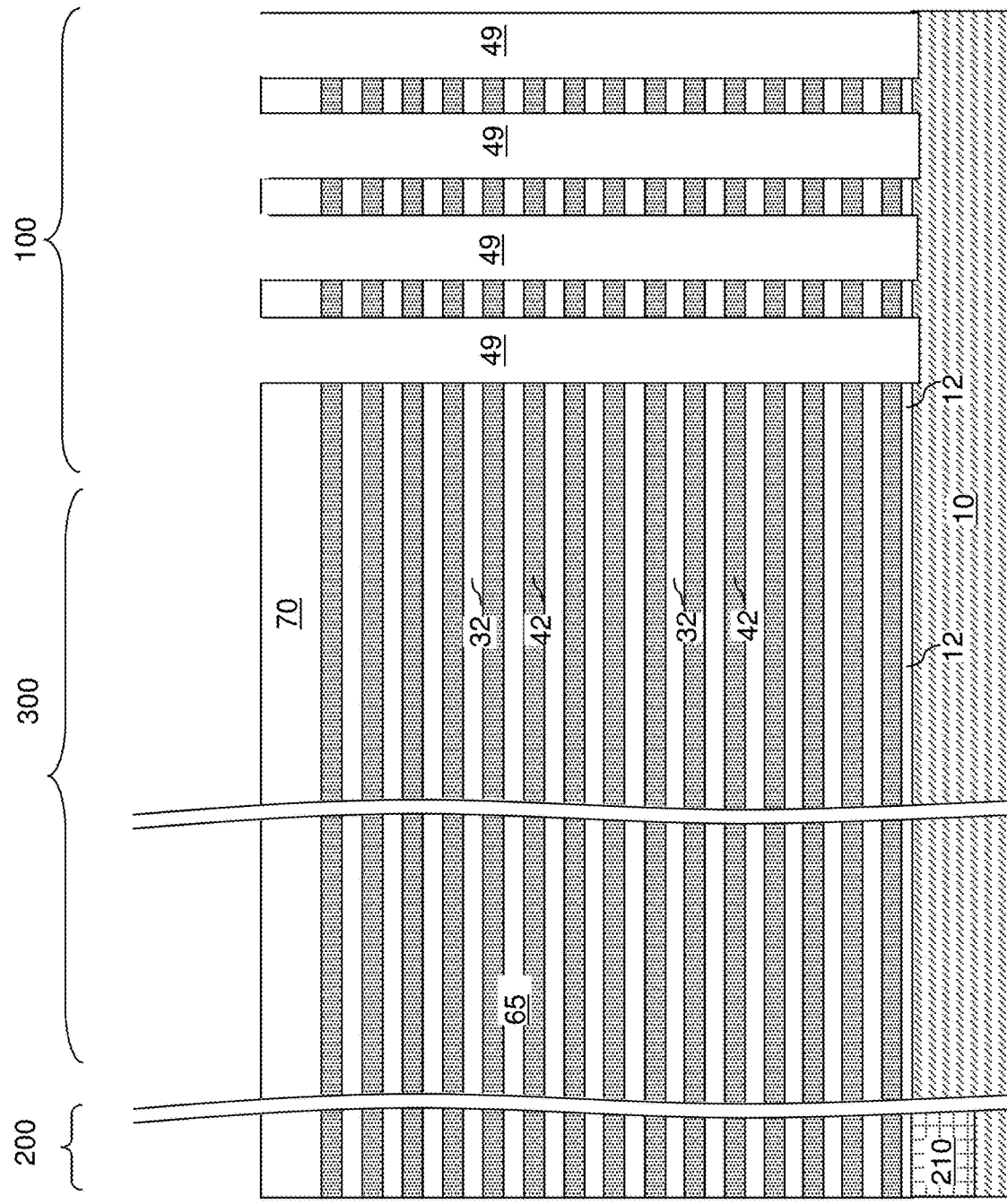
FIG. 1 is a vertical cross-sectional view of an exemplary structure after formation of an alternating stack of insulating layers and sacrificial material layers and memory openings according to an embodiment of the present disclosure.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 10. The substrate semiconductor layer 10 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 10. The major surface 7 can be a semiconductor surface. In one embodiment, the major surface 7 can be a single crystalline semiconductor surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from $1.0$ S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 10.

At least one semiconductor device 210 for a peripheral circuitry can be formed on a portion of the substrate semiconductor layer 10. The at least one semiconductor device 210 can include, for example, field effect transistors. The region including the semiconductor devices is herein referred to as a peripheral device region 200. The peripheral device region 200 can include various peripheral devices needed to operate the memory devices of the present disclosure.

A gate dielectric layer 12 can be optionally formed above the substrate semiconductor layer 10. The gate dielectric layer 12 can be, for example, silicon oxide layer. The thickness of the gate dielectric layer 12 can be in a range from 3 nm to 30 nm, although lesser and greater thicknesses can also be employed.

A stack of an alternating plurality of first material layers (which can be insulating layers 32) and second material layers (which can be sacrificial material layers 42) is formed over the top surface of the substrate, which can be, for example, on the top surface of the gate dielectric layer 12. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein. The sacrificial material layers 42 (which are spacer material layers) are subsequently replaced with control gate electrodes, source select gate electrodes, and drain select gate electrodes for a NAND string.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

A lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the gate dielectric layer 12 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the gate dielectric layer 12 so that the memory openings 49 extend from the top surface of the alternating stack (32, 42) to at least the top surface of the substrate semiconductor layer 10. In one embodiment, an overetch into the substrate semiconductor layer 10 may be optionally performed after the top surface of the substrate semiconductor layer 10 is physically exposed at a bottom of each memory opening 49. The overetch may be performed prior to, or after, removal of the lithographic material stack. In other words, the recessed surfaces of the substrate semiconductor layer 10 may be vertically offset from the undressed top surfaces of the substrate semiconductor layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the substrate semiconductor layer 10. Each of the memory openings 49 can include a sidewall (or a plurality of sidewalls) that extends substantially perpendicular to the topmost surface of the substrate. The region in which the array of memory openings 49 is formed is herein referred to as a device region 100. A contact region 300 can be provided between the device region 100 and the peripheral device region 200.

Each memory opening 49 extends through the insulating cap layer 70, the alternating stack (32, 42), the gate dielectric layer 12, and optionally into an upper portion of the substrate semiconductor layer 10. The recess depth of the bottom surface of each memory opening with respect to the top surface of the substrate semiconductor layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Figure 2:
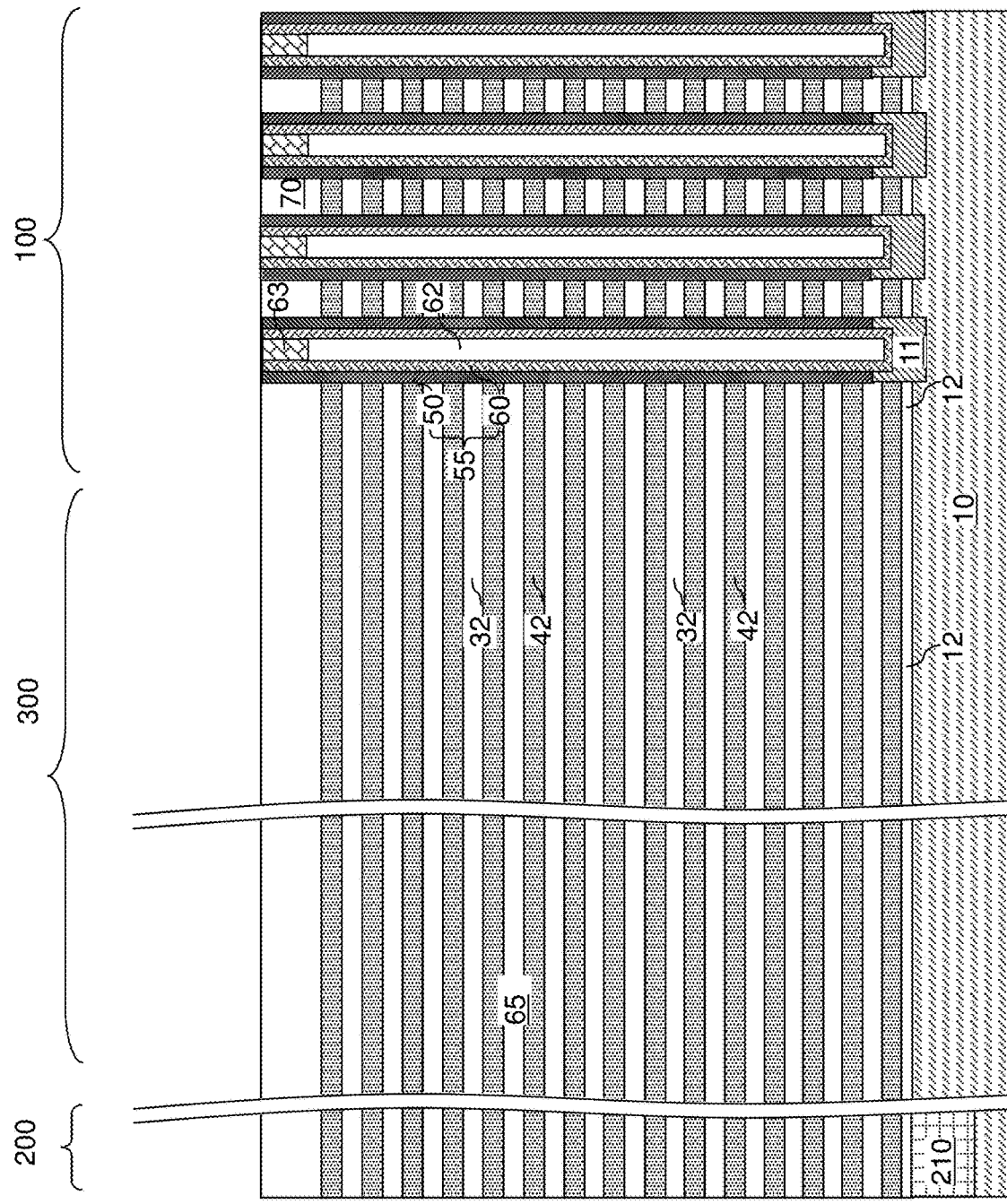
FIG. 2 is a vertical cross-sectional view of the exemplary structure after formation of memory stack structures according to an embodiment of the present disclosure.

Referring to FIG. 2, an optional epitaxial channel portion 11 can be formed at the bottom portion of each memory opening 49, for example, by selective epitaxy. Each epitaxial channel portion 11 comprises a single crystalline semiconductor material in epitaxial alignment with the single crystalline semiconductor material of the substrate semiconductor layer 10. In one embodiment, the epitaxial channel portion 11 can be doped with electrical dopants of the same conductivity type as the substrate semiconductor layer 10. In one embodiment, the top surface of each epitaxial channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial channel portions 11 with a respective conductive material layer.

A memory stack structure 55 can be formed in each memory opening 49. An optional blocking dielectric layer and a charge trapping layer can be sequentially deposited in the memory openings 49. The blocking dielectric layer can include a single dielectric material layer or a layer stack of multiple dielectric material layers. The blocking dielectric layer can be deposited on the sidewalls of each memory opening 49 by a conformal deposition method. The blocking dielectric layer can be deposited, for example, by chemical vapor deposition (CVD), atomic layer deposition (ALD), pulsed laser deposition (PLD), liquid source misted chemical deposition, or a combination thereof. The thickness of the blocking dielectric layer can be in a range from 1 nm to 20 nm, although lesser and greater thicknesses can also be employed. The blocking dielectric layer can subsequently function as a dielectric material portion that blocks leakage of stored electrical charge to control gate electrodes.

In one embodiment, the blocking dielectric layer includes a dielectric metal oxide. As used herein, a dielectric metal oxide refers to a dielectric material that includes at least one metallic element and at least oxygen. Alternatively or additionally, the blocking dielectric layer can include silicon oxide, silicon oxynitride, silicon nitride, or a combination thereof. In one embodiment, the blocking dielectric layer can include silicon oxide. The blocking dielectric layer can be formed by a conformal deposition method such as low pressure chemical vapor deposition, atomic layer deposition, or a combination thereof. The thickness of the blocking dielectric layer can be in a range from 1 nm to 20 nm, although lesser and greater thicknesses can also be employed.

Subsequently, the charge trapping layer can be deposited as a continuous material layer over the blocking dielectric layer. In one embodiment, the charge trapping layer can be deposited as a conformal layer having a substantially same thickness throughout. As used herein, an element has a substantially same thickness throughout if the thickness of the element does not deviate from the average thickness of the element by more than 20% at all locations of the element. In one embodiment, the charge trapping layer can be a charge trapping material including a dielectric charge trapping material, which can be, for example, silicon nitride. In one embodiment, the charge trapping layer includes a silicon nitride layer.

A tunneling dielectric layer can be deposited on the physically exposed surfaces of the blocking dielectric layer and the charge trapping layer. The tunneling dielectric layer can be formed directly on the physically exposed inner sidewall of the upper portion of the blocking dielectric layer and directly on a sidewall of the remaining lower portions of the charge trapping layer. The tunneling dielectric layer includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer can include a stack of a first silicon oxide layer, a silicon oxynitride layer, and a second silicon oxide layer, which is commonly known as an ONO stack. In one embodiment, the tunneling dielectric layer can include a silicon oxide layer that is substantially free of carbon or a silicon oxynitride layer that is substantially free of carbon. The thickness of the tunneling dielectric layer can be in a range from 2 nm to 20 nm, although lesser and greater thicknesses can also be employed.

An optional first semiconductor channel layer can be formed on the tunneling dielectric layer. The first semiconductor channel layer includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer includes amorphous silicon or polysilicon. The first semiconductor channel layer can be formed by a conformal deposition method such as low pressure chemical vapor deposition (LPCVD). The thickness of the first semiconductor channel layer can be in a range from 2 nm to 10 nm, although lesser and greater thicknesses can also be employed.

The optional first semiconductor channel layer, the tunneling dielectric layer, the charge trapping layer, and the optional blocking dielectric layer are sequentially anisotropically etched employing at least one anisotropic etch process. The portions of the first semiconductor channel layer, the tunneling dielectric layer, the charge trapping layer, and the blocking dielectric layer located above the top surface of the insulating cap layer 70 can be removed by the at least one anisotropic etch process. Further, the horizontal portions of the first semiconductor channel layer, the tunneling dielectric layer, the charge trapping layer, and the blocking dielectric layer at a bottom of each cavity can be removed to form openings in remaining portions thereof.

Each remaining portion of the first semiconductor channel layer constitutes a first semiconductor channel portion. A surface of the epitaxial channel portion 11 can be physically exposed underneath the opening through the first semiconductor channel portion, the tunneling dielectric layer, the charge trapping layer, and the blocking dielectric layer. Optionally, the physically exposed portion of the epitaxial channel portion 11 can be vertically recessed. Each tunneling dielectric layer is embedded within a charge trapping layer.

Within each memory opening, a set of a tunneling dielectric layer, a charge trapping layer, and a blocking dielectric layer collectively constitutes a memory film 50. In one embodiment, the first semiconductor channel portion, the tunneling dielectric layer, the charge trapping layer, and the blocking dielectric layer can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

A second semiconductor channel layer can be deposited directly on the semiconductor surface of the epitaxial channel portion 11 over the substrate 10, and directly on the first semiconductor channel portion. The second semiconductor channel layer includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer includes amorphous silicon or polysilicon. The second semiconductor channel layer can be formed by a conformal deposition method such as low pressure chemical vapor deposition (LPCVD). The thickness of the second semiconductor channel layer can be in a range from 2 nm to 10 nm, although lesser and greater thicknesses can also be employed. The second semiconductor channel layer may partially fill the cavity in each memory opening, or may fully fill the cavity in each memory opening.

The materials of the first semiconductor channel portion and the second semiconductor channel layer are collectively referred to as a semiconductor channel material. In other words, the semiconductor channel material is a set of all semiconductor material in the first semiconductor channel portion and the second semiconductor channel layer.

In case the cavity in each memory opening is not completely filled by the second semiconductor channel layer, a dielectric core layer can be deposited in the cavity to fill any remaining portion of the cavity within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating.

The horizontal portion of the dielectric core layer above the insulating cap layer 70 can be removed, for example, by a recess etch from above the top surface of the insulating cap layer 70. Further, the horizontal portion of the second semiconductor channel layer located above the top surface of the insulating cap layer 70 can be removed by a planarization process, which can employ a recess etch or chemical mechanical planarization (CMP). Each remaining portion of the second semiconductor channel layer within a memory opening constitutes a second semiconductor channel portion.

Each adjoining pair of a first semiconductor channel portion and a second semiconductor channel portion can collectively form a vertical semiconductor channel 60 through which electrical current can flow when a vertical NAND device including the vertical semiconductor channel 60 is turned on. A tunneling dielectric layer is embedded within a charge trapping layer, and laterally surrounds a portion of the vertical semiconductor channel 60. Each adjoining set of a blocking dielectric layer, a charge trapping layer, and a tunneling dielectric layer collectively constitute a memory film 50, which can store electrical charge with a macroscopic retention time. As used herein, a macroscopic retention time refers to a retention time suitable for operation of a memory device as a permanent memory device such as a retention time in excess of 24 hours.

The top surface of the remaining portion of the dielectric core layer can be further recessed within each memory opening, for example, by a recess etch to a depth that is located between the top surface of the insulating cap layer 70 and the bottom surface of the insulating cap layer 70. Each remaining portion of the dielectric core layer constitutes a dielectric core 62. Each vertical semiconductor channel 60 is formed within a respective memory film 50. Each dielectric core 62 is formed inside a respective vertical semiconductor channel 60.

A drain region 63 can be formed at an upper end of the vertical semiconductor channel 60. The drain regions 63 can be formed by depositing a doped semiconductor material within each recessed region above the dielectric cores 62. The doped semiconductor material can be, for example, doped polysilicon formed by at least one of in-situ doping and ion implantation doping or a combination thereof. The highly doped drain regions near the drain side select gates provide a low resistive contact region for a bit line connection. Excess portions of the deposited semiconductor material can be removed from above the top surface of the insulating cap layer 70, for example, by chemical mechanical planarization (CMP) or a recess etch to form the drain regions 63.

Each set of a memory film 50 and a vertical semiconductor channel 60 in a same memory opening constitutes a memory stack structure 55. The memory stack structures 55 are formed through the in-process alternating stack of the insulating layers 32 and sacrificial material layers 42.

Figure 3A:
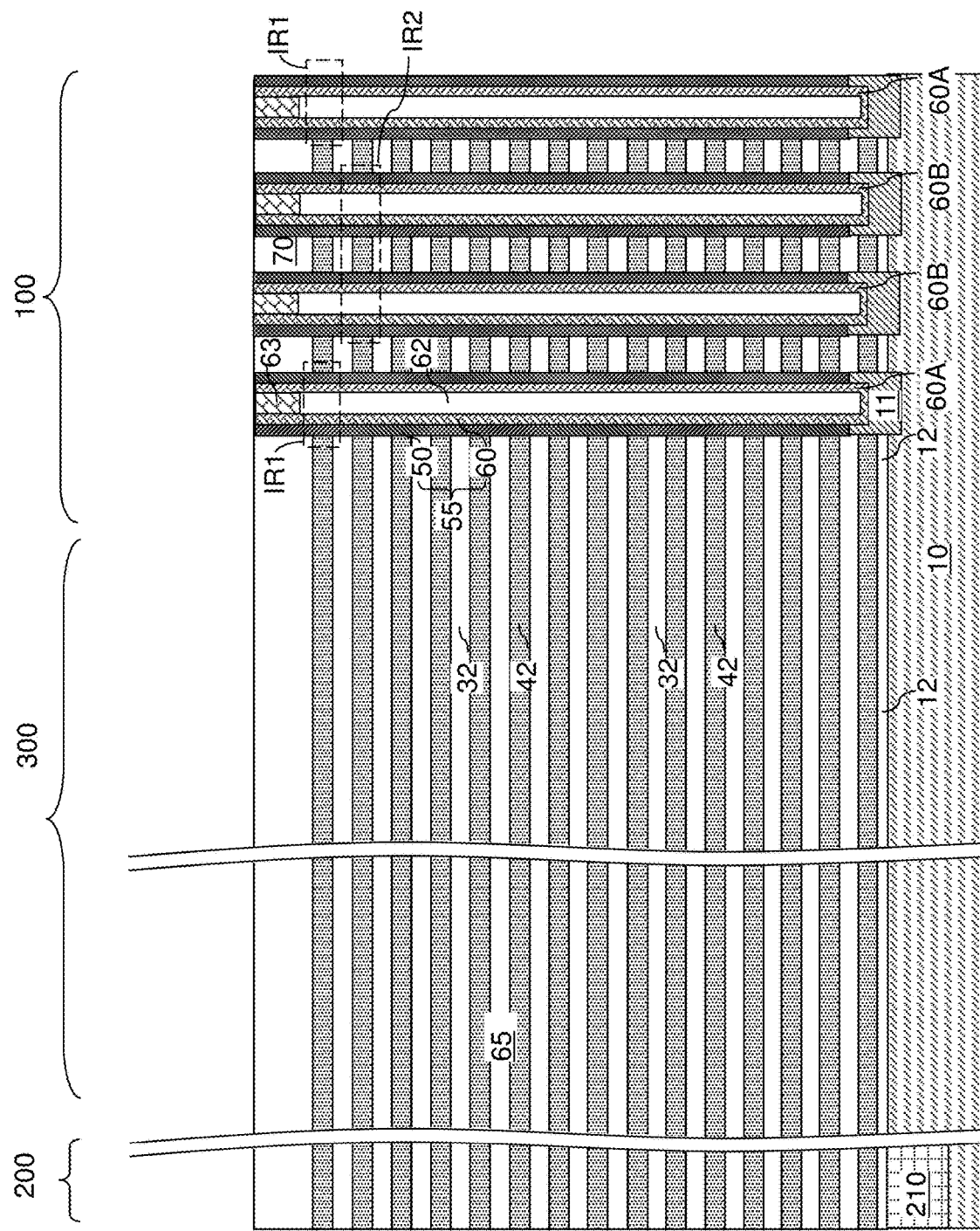
FIG. 3A is a vertical cross-sectional view of the exemplary structure after ion implantation into portions of the semiconductor channels of the memory stack structures according to an embodiment of the present disclosure.
Figure 3B:
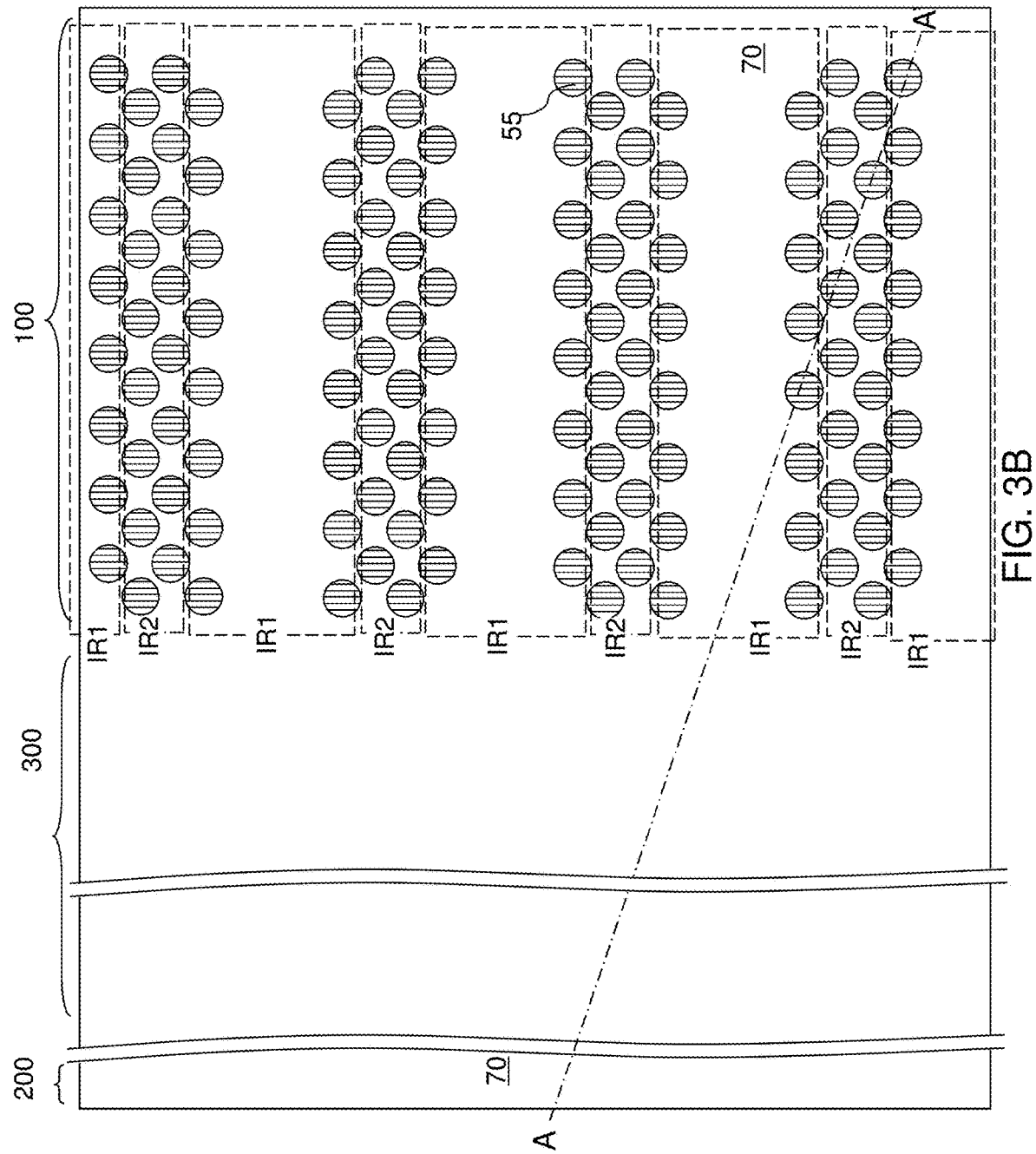
FIG. 3B is a top-down view of the exemplary structure of FIG. 3A.

Referring to FIGS. 3A and 3B, ion implantation processes can be performed to form first implanted channel regions IR1 and second implanted channel regions IR2. The first implanted channel regions IR1 can be formed in a first subset of the memory stack structures 55 employing a first masked ion implantation process, and the second implanted channel regions IR2 can be formed in a second subset of the memory stack structures 55 in a second masked ion implantation process. As used herein, a "masked ion implantation process" refers to an ion implantation process that employs a patterned mask that limits the area of implantation.

The area of implantation during the first masked ion implantation process is herein referred to as a first implantation area, and the area of implantation during the second masked ion implantation process is herein referred to as a second implantation area. In one embodiment, electrical dopants can be implanted into a portion of each first vertical semiconductor channel 60A located at the level of a first spacer material layer (such as a first sacrificial material layer 42) while preventing implantation of electrical dopants into the second vertical semiconductor channels 60B in a first masked ion implantation process that employs a first ion implantation mask that includes opening over the first vertical semiconductor channels 60A. Further, additional electrical dopants can be implanted into a portion of each second vertical semiconductor channel 60B located at the level of a second spacer material layer (such as a second sacrificial material layer 42) while preventing implantation of electrical dopants into the first vertical semiconductor channels 60A in a second masked ion implantation process that employs a second ion implantation mask that includes opening over the second vertical semiconductor channels 60B.

The first implanted channel regions IR1 are formed within the first implantation area at a first level of the select drain gate electrodes, which is herein referred to as a first select drain gate electrode level. The second implanted channel regions IR2 are formed within the second implantation area at a second level of the select drain gate electrodes, which is different from the first select drain gate electrode level and is herein referred to as a second select drain gate electrode level. In one embodiment, the first select drain gate electrode level can be the level of the topmost sacrificial material layer 42 and the second select drain gate electrode level can be the sacrificial material layer 42 of the level that is the second from the top as illustrated in FIG. 3A. Alternatively, the second select drain gate electrode level can be the level of the topmost sacrificial material layer 42 and the first select drain gate electrode level can be the sacrificial material layer 42 of the level that is the second from the top. Yet alternatively, more than two select drain gate electrode levels may be provided, and the first and second select drain gate electrode levels can be any two levels among the select drain gate electrode levels.

The second subset of the memory stack structures 55 can be a complementary subset to the first subset of the memory stack structures 55. In other words, the second subset of the memory stack structures 55 can include all memory stack structures 55 that do not belong to the first subset of the memory stack structures. In one embodiment, the first subset of the memory stack structures 55 and the second subset of the memory stack structures 55 can be equal in number.

In one embodiment, the first subset of the memory stack structures 55 and the second subset of the memory stack structures 55 can be arranged in clusters within each block of memory stack structures 55. In one exemplary layout, the first subset of the memory stack structures 55 can be located in outer rows of each block of memory stack structures 55, and the second subset of the memory stack structures 55 can be located in inner rows of each block of memory stack structures 55. In another exemplary layout, the first subset of the memory stack structures 55 can be located in inner rows of each block of memory stack structures 55, and the second subset of the memory stack structures 55 can be located in outer rows of each block of memory stack structures 55. While an illustrative layout is employed to describe embodiments of the present disclosure, any other layout may be employed for placing the first implantation area and the second implantation area such that the memory stack structures 55 including respective first implanted channel regions IR1 and the memory stack structures 55 including respective second implanted channel regions IR2 are located in proximity to one another and bit lines can be subsequently formed such that each bit line is electrically connected to a memory stack structure 55 including a first implanted channel region IR1 and a memory stack structure 55 including a second implanted channel region IR2 in the same memory block. In one embodiment, each memory stack structure 55 can include only one of a first implanted channel region IR1 formed at a first select drain gate electrode level and a second implanted channel region IR2 formed at a second select drain gate electrode level.

The vertical semiconductor channels 60 in which respective first implanted channel regions IR1 are formed are herein referred to as first vertical semiconductor channels 60A. The vertical semiconductor channels 60 in which respective second implanted channel regions IR2 are formed are herein referred to as second vertical semiconductor channels 60B.

In one embodiment, the electrical dopants can be selected to change (e.g., raise or lower) the threshold voltage for the vertical field effect transistors including the first implanted channel regions IR1 or the second implanted channel regions IR2 to increase or decrease threshold voltages compared to unimplanted regions. Each memory opening includes a series connection of vertical field effect transistors that form a NAND string, and vertical field effect transistor having the changed (e.g., raised or lowered) threshold voltage can be located in the first level of the select drain gate electrodes if the vertical semiconductor channel 60 therein includes a first implanted channel region IR1, or in the second level of the select drain gate electrodes if the vertical semiconductor channel 60 therein includes a second implanted channel region IR2. In other words, the level at which a first implanted channel region IR1 or a second implanted channel region IR2 is formed is the level at which the corresponding vertical field effect transistor has a raised threshold voltage. In one non-limiting embodiment, region IR1 may be formed by using a shallower ion implantation than the ion implantation used to form region IR2.

In one embodiment, a first portion of each first vertical semiconductor channel 60A laterally surrounded by a first sacrificial material layer 42 (located at the level of the first select drain gate electrode to be subsequently formed) has a greater dopant concentration than a second portion of the first vertical semiconductor channel 60A laterally surrounded by a second sacrificial material layer 42 (located at the level of the second select drain gate electrode to be subsequently formed). Further, a first portion of each second vertical semiconductor channel 60B laterally surrounded by the first sacrificial material layer has a lesser dopant concentration than a second portion of the second vertical semiconductor channel 60B laterally surrounded by the second sacrificial material layer.

The unimplanted portions of the first and second vertical semiconductor channels (60A, 60B) can have the same dopant concentration throughout. In this case, the second portion of each first vertical semiconductor channel 60A and the first portion of each second vertical semiconductor channel 60B can have the same dopant concentration as the portions of the first and second vertical semiconductor channels (60A, 60B) that constitute channels of the memory cells (i.e., memory cell charge storage transistors including control gate electrodes) of the vertical NAND strings. In an alternative embodiment, a selective (e.g., masked) ion implantation may be performed into parts of the substrate semiconductor layer 10 and/or into some of the pillar structures 11 to change the threshold voltage of the source select transistors located at the bottom of the stack. For example, a first selective ion implantation may be made into the substrate semiconductor layer 10 adjacent to a first channel 60A but not into part of layer 10 adjacent to the second channel 60B. A second selective ion implantation may be made into the pillar structure 11 that is part of the second channel 60B but not into the pillar structure that is part of the first channel 60A. The ion implantation into the substrate semiconductor layer 10 may be performed prior to forming the stack (32, 42), while the ion implantation into the pillar structures 11 may be performed at any time between forming the pillar structures 11 and forming the core dielectric 62.

Figure 4:
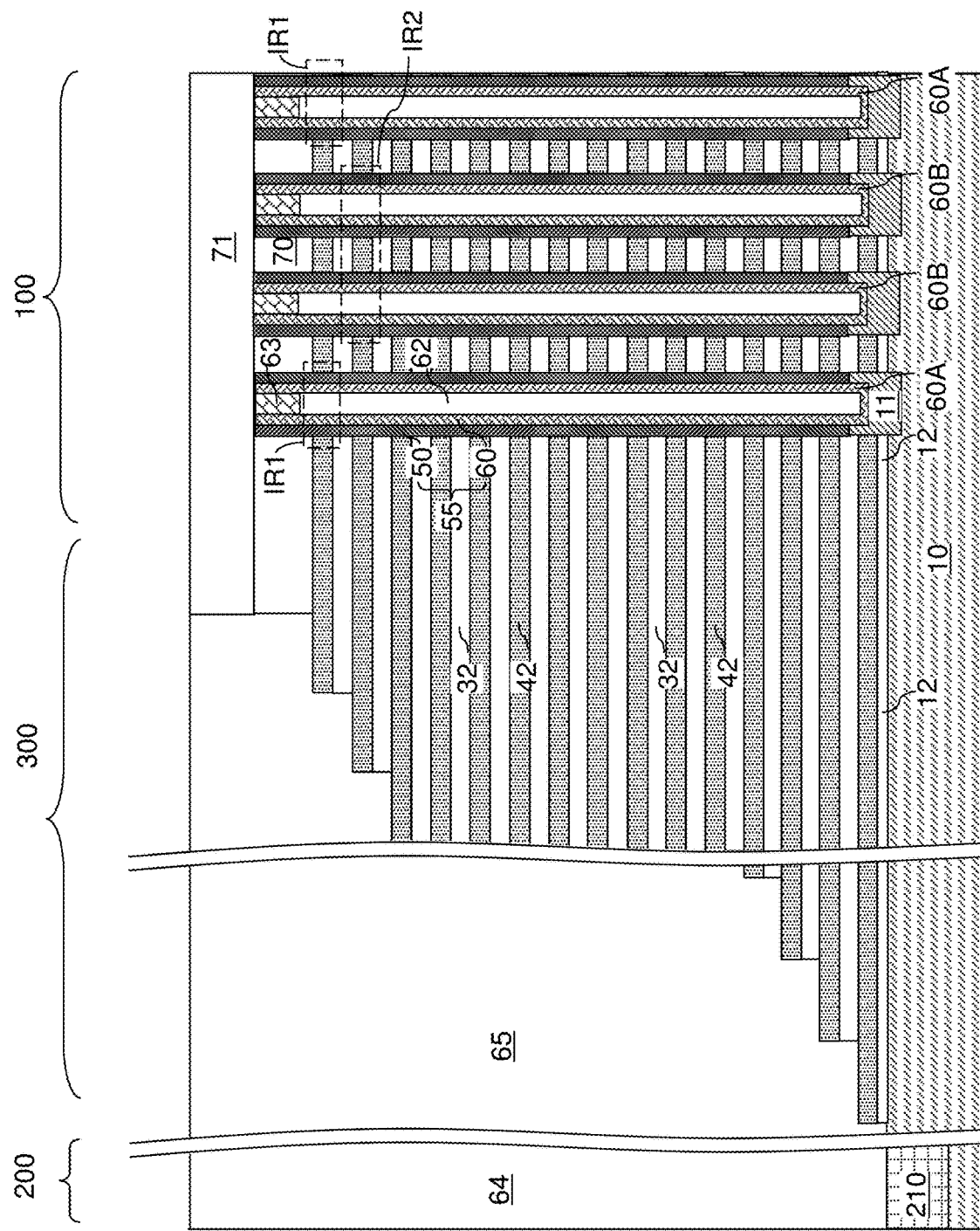
FIG. 4 is a vertical cross-sectional view of the exemplary structure after formation of a stepped terrace and a retro-stepped dielectric material portion according to an embodiment of the present disclosure.

Referring to FIG. 4, an optional first contact level dielectric material layer 71 can be formed over the substrate 10. As an optional structure, the first contact level dielectric material layer 71 may, or may not, be formed. In case the first contact level dielectric material layer 71 is formed, the first contact level dielectric material layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first contact level dielectric material layer 71 can be formed over a horizontal plane including the top surface of the insulating cap layer 70 and the top surfaces of the drain regions 63. The first contact level dielectric material layer 71 can be deposited by chemical vapor deposition, atomic layer deposition (ALD), spin-coating, or a combination thereof. The thickness of the first contact level dielectric material layer 71 can be in a range from 10 nm to 300 nm, although lesser and greater thicknesses can also be employed.

In one embodiment, the first contact level dielectric material layer 71 can be formed as a dielectric material layer having a uniform thickness throughout. The first contact level dielectric material layer 71 may be formed as a single dielectric material layer, or can be formed as a stack of a plurality of dielectric material layers. Alternatively, formation of the first contact level dielectric material layer 71 may be merged with formation of at least one line level dielectric material layer (not shown). While the present disclosure is described employing an embodiment in which the first contact level dielectric material layer 71 is a structure separate from an optional second contact level dielectric material layer or at least one line level dielectric material layer to be subsequently deposited, embodiments in which the first contact level dielectric material layer 71 and at least one line level dielectric material layer are formed at a same processing step, and/or as a same material layer, are expressly contemplated herein.

Optionally, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed within an area that includes a peripheral device region 200 and a portion of a contact region 300, which is adjacent to a device region 100 that includes an array of memory stack structures 55. Subsequently, the trench can be filled with an optional dielectric material such as silicon oxide. Excess portions of the dielectric material can be removed from above the top surface of the first contact level dielectric material layer 71 by a planarization process such as chemical mechanical planarization and/or a recess etch. The top surfaces of the first contact level dielectric material layer 71 can be employed as a stopping surface during the planarization. The remaining optional dielectric material in the trench constitutes a dielectric material portion 64.

A stepped cavity can be formed within the contact region 300, which can straddle the dielectric material portion 64 and a portion of the alternating stack (32, 42). Alternatively, the dielectric material portion 64 may be omitted and the stepped cavity may be formed just in the stack (32, 42). The stepped cavity can have various stepped surfaces such that the horizontal cross-sectional shape of the stepped cavity changes in steps as a function of the vertical distance from the top surface of the substrate 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity, and a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the first contact level dielectric material layer 71, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F. In an alternative configuration, the dielectric material portion 64 may be omitted and the retro-stepped dielectric material portion 65 fills the space in regions 200 and 300. In an alternative embodiment, the steps and the retro-stepped dielectric material portion 65 may be formed prior to forming the memory openings 49 and the memory stack structures 55.

Figure 5A:
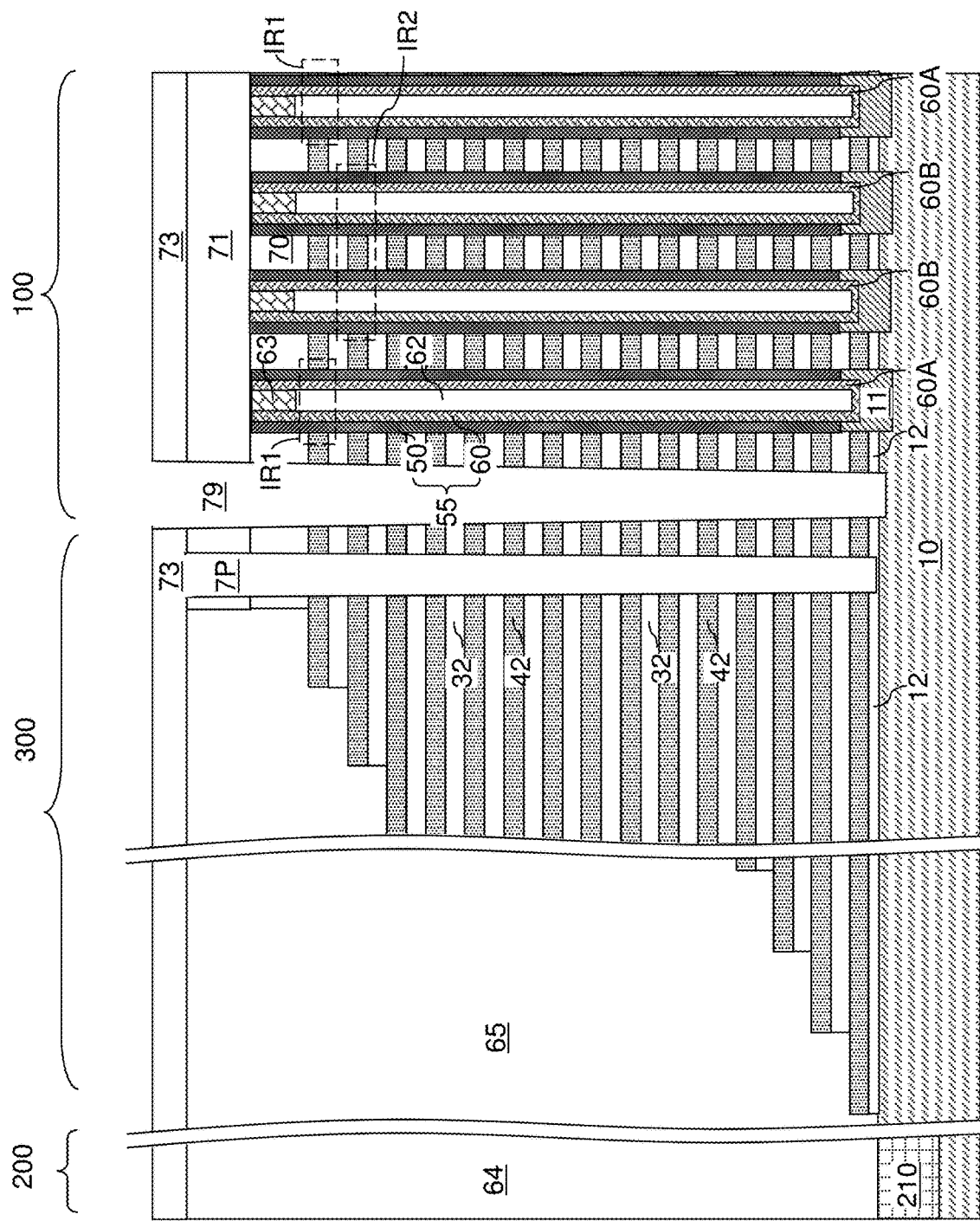
FIG. 5A is a vertical cross-sectional view of the exemplary structure after formation of a backside trench according to an embodiment of the present disclosure.
Figure 5B:
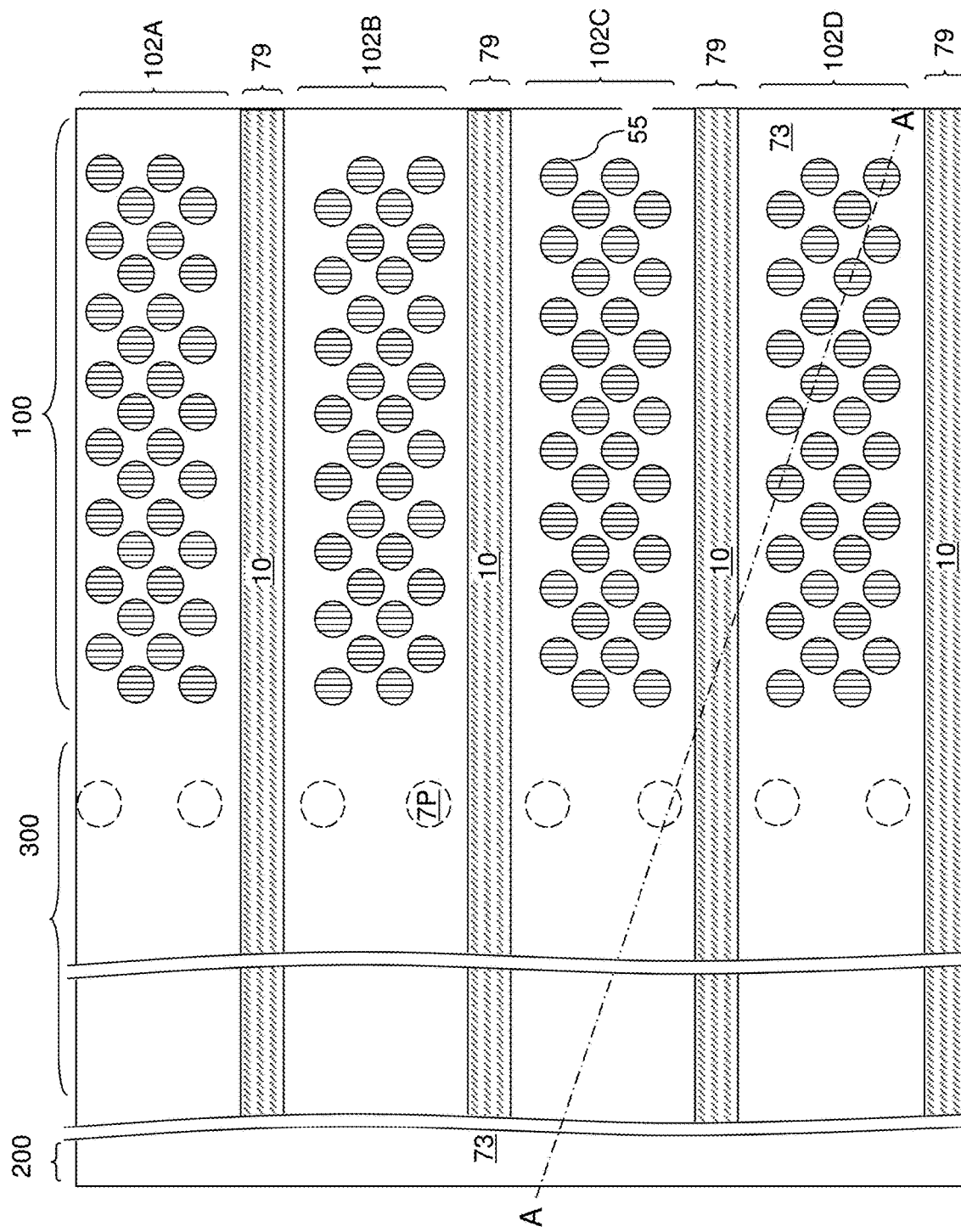
FIG. 5B is a partial see-through top-down view of the exemplary structure of FIG. 5A. The vertical plane A-A' is the plane of the vertical cross-sectional view of FIG. 5A.
Figure 5C:
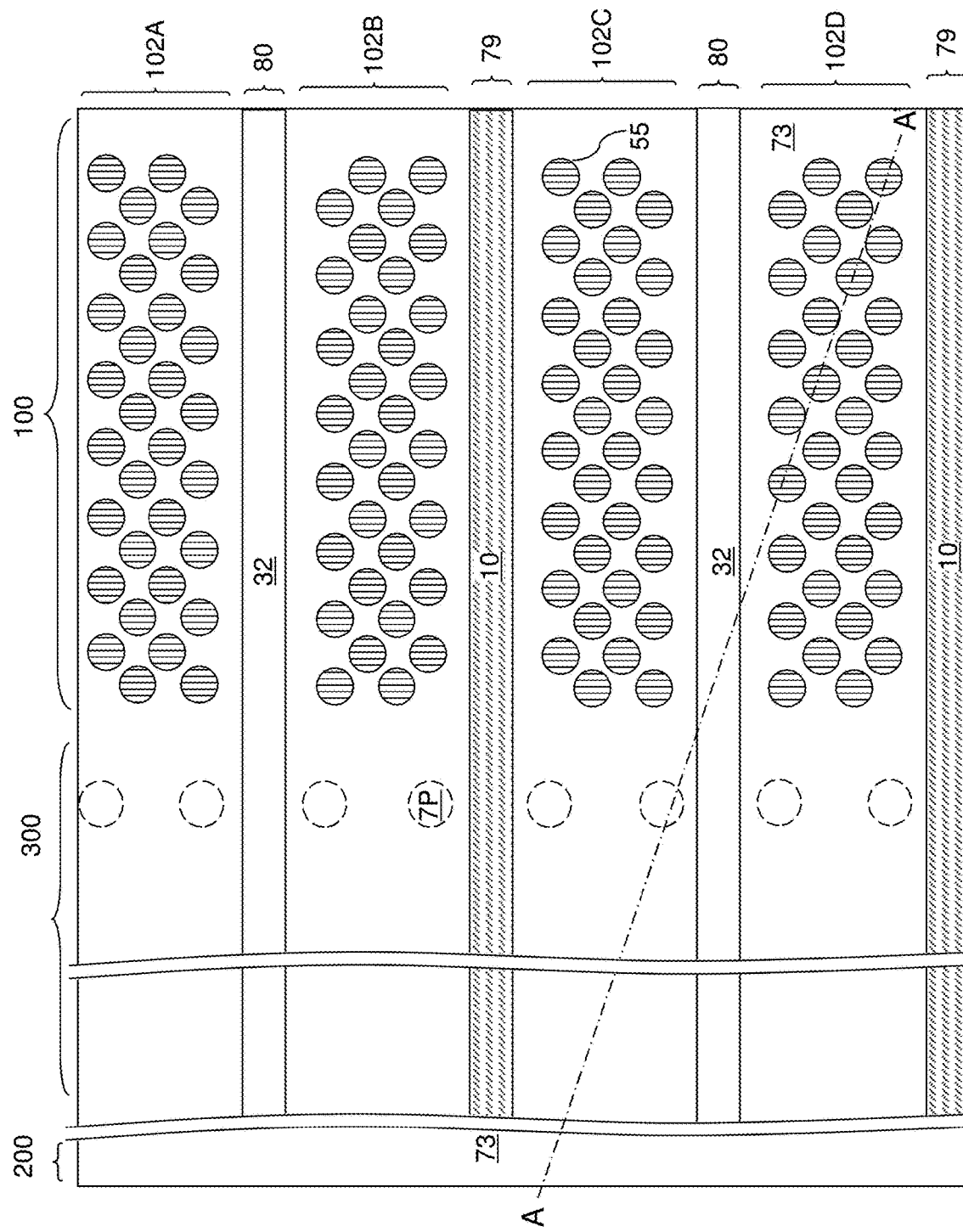
FIG. 5C is a partial see-through top-down view of an alternative structure based on FIG. 5A. The vertical plane A-A' is the plane of the vertical cross-sectional view of FIG. 5A.

Referring to FIGS. 5A-5C, at least one dielectric support pillar 7P may be optionally formed through the retro-stepped dielectric material portion 65 and/or through the first contact level dielectric material layer 71 and/or through the alternating stack (32, 42). The plane A-A' in FIGS. 5B and 5C corresponds to the plane of the vertical cross-sectional view of FIG. 5A. In one embodiment, the at least one dielectric support pillar 7P can be formed in the contact region 300, which is located adjacent to the device region 100. The at least one dielectric support pillar 7P can be formed, for example, by forming an opening extending through the retro-stepped dielectric material portion 65 and/or through the alternating stack (32, 42) and at least to the top surface of the substrate 10, and by filling the opening with a dielectric material that is resistant to the etch chemistry to be employed to remove the sacrificial material layers 42.

In one embodiment, the at least one dielectric support pillar can include silicon oxide and/or a dielectric metal oxide such as aluminum oxide. In one embodiment, the portion of the dielectric material that is deposited over the first contact level dielectric material layer 71 concurrently with deposition of the at least one dielectric support pillar 7P can be present over the first contact level dielectric material layer 71 as a second contact level dielectric material layer 73. Each of the at least one dielectric support pillar 7P and the second contact level dielectric material layer 73 is an optional structure. As such, the second contact level dielectric material layer 73 may, or may not, be present over the insulating cap layer 70 and the retro-stepped dielectric material portion 65. The first contact level dielectric material layer 71 and the second contact level dielectric material layer 73 are herein collectively referred to as at least one contact level dielectric material layer (71, 73). In one embodiment, the at least one contact level dielectric material layer (71, 73) can include both the first and second contact level dielectric material layers (71, 73), and optionally include any additional via level dielectric material layer that can be subsequently formed. In another embodiment, the at least one contact level dielectric material layer (71, 73) can include only the first contact level dielectric material layer 71 or the second contact level dielectric material layer 73, and optionally include any additional via level dielectric material layer that can be subsequently formed. Alternatively, formation of the first and second contact level dielectric material layers (71, 73) may be omitted, and at least one via level dielectric material layer may be subsequently formed, i.e., after formation of a substrate contact via structure.

The second contact level dielectric material layer 73 and the at least one dielectric support pillar 7P can be formed as a single continuous structure of integral construction, i.e., without any material interface therebetween. In another embodiment, the portion of the dielectric material that is deposited over the first contact level dielectric material layer 71 concurrently with deposition of the at least one dielectric support pillar 7P can be removed, for example, by chemical mechanical planarization or a recess etch. In this case, the second contact level dielectric material layer 73 is not present, and the top surface of the first contact level dielectric material layer 71 can be physically exposed.

A photoresist layer (not shown) can be applied over the alternating stack (32, 42) and/or the retro-stepped dielectric material portion 65, and lithographically patterned to form at least one trench, as shown in FIG. 5B. Each of the at least one trench is referred to as a backside trench 79, i.e., a trench that is located in a different region than the memory stack structures 55 that are formed in the memory openings (which are referred to as front side openings). Each backside trench 79 can be formed in an area in which formation of a substrate contact via structure is desired. The trench 79 may extend through region 100 or through both regions 100 and 300. The pattern in the photoresist layer can be transferred through the alternating stack (32, 42) and/or the retro-stepped dielectric material portion 65 employing an anisotropic etch to form the at least one backside trench 79, which extends at least to the top surface of the substrate 10. In one embodiment, the at least one backside trench 79 can include a source contact opening in which a source contact via structure can be subsequently formed. The backside trench 79 divides the stack into separate memory blocks 102A, 102B, 102C, 102D in which the memory stack structures 55 of the NAND strings will share the same word lines/control gate electrodes, source select gate electrodes and drain select gate electrodes.

FIG. 5C illustrates an alternative structure which contains two different types of trenches 79, 80. The structure of FIG. 5C includes the same deep backside trenches 79 which extend through the entire stack (32, 42) as in the structure of FIG. 5B. However, some of the trenches 80 in the structure of FIG. 5C comprise shallower trenches than the backside trenches 79. The shallow trenches 80 extend only through sacrificial material layers 42 which will be replaced by drain select gate electrodes in a subsequent step. The shallow trenches 80 may extend down to an intermediate insulating layer 32 in the stack which will separate the control gate electrodes from the drain select gate electrode(s). The shallow trenches 80 separate the stack into separate memory blocks. For example, memory blocks 102A and 102B will share the same control gate electrodes and source select gate electrodes, but will have different drain select gate electrodes which are separated by the shallow trench 80. The separate drain select gate electrodes in memory blocks 102A and 102B allow the memory cells in block 102A to be electrically accessed for programming, reading and/or erasing separately from those in block 102B and vice-versa. If desired, dummy memory stack structures may be formed in the regions of the shallow trenches 80 to function as support pillars during replacement of the sacrificial layers 42 with electrically conductive layers. The dummy memory stack structures have the same configuration as the functional memory stack structures 55, but will not be electrically connected to the bit lines.

Figure 6:
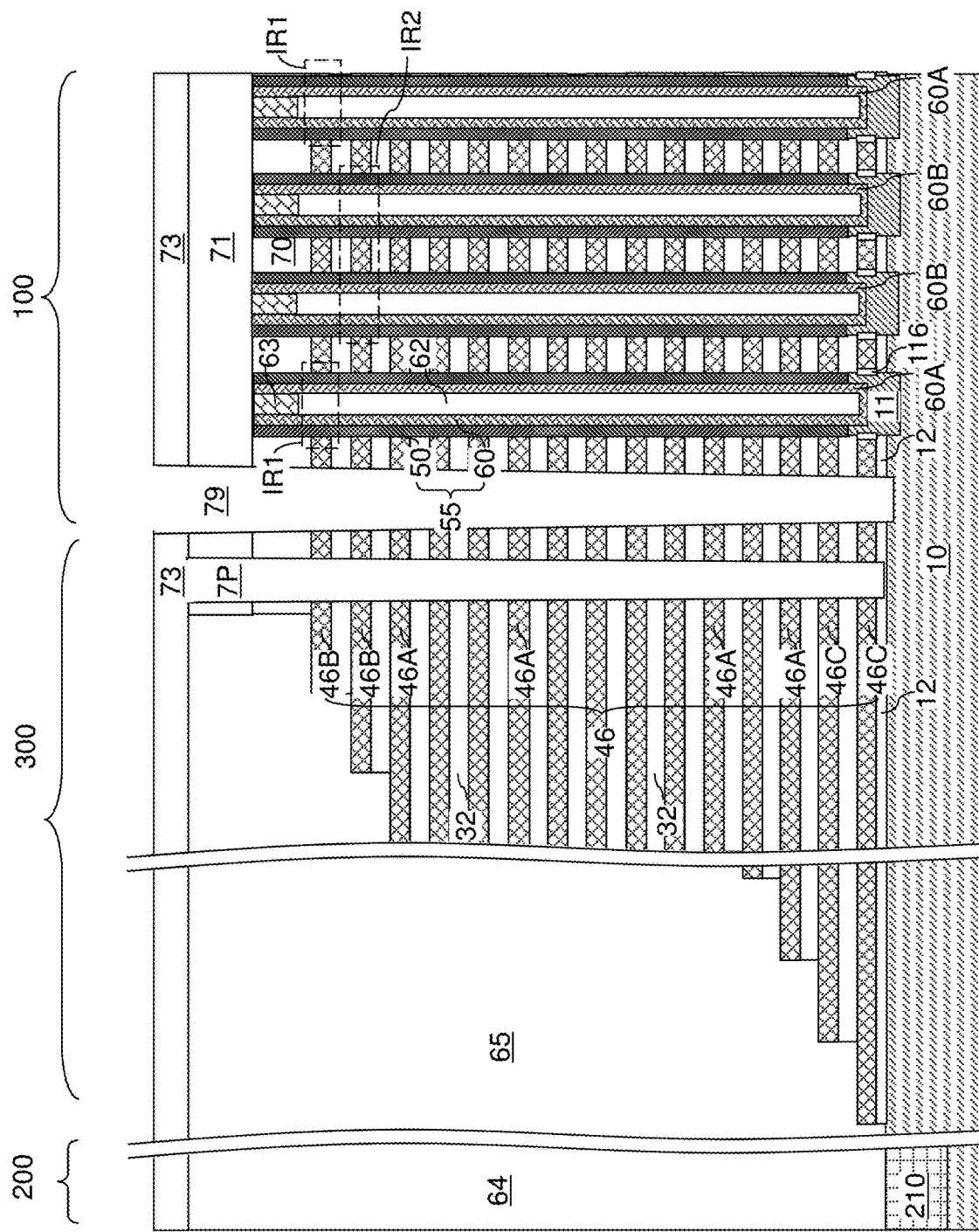
FIG. 6 is a vertical cross-sectional view of the exemplary structure after replacement of the sacrificial material layers with electrically conductive layers according to an embodiment of the present disclosure.

Referring to FIG. 6, an etchant that selectively etches the second material of the sacrificial material layers 42 with respect to the first material of the insulating layers 32 can be introduced through the at least one backside trench 79, for example, employing an etch process. Backside recesses are formed in volumes from which the sacrificial material layers 42 are removed.

The removal of the second material of the sacrificial material layers 42 can be selective to the first material of the insulating layers 32, the material of the at least one dielectric support pillar 7P, the material of the retro-stepped dielectric material portion 65, the semiconductor material of the substrate semiconductor layer 10, and the material of the outermost layer of the memory films 50. In one embodiment, the sacrificial material layers 42 can include silicon nitride, and the materials of the insulating layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the at least one dielectric support pillar 7P, and the retro-stepped dielectric material portion 65 can be selected from silicon oxide, silicon nitride, and dielectric metal oxides. In this case, the depth of the at least one backside trench 79 can be modified so that the bottommost surface of the at least one backside trench 79 is located within the gate dielectric layer 12, i.e., to avoid physical exposure of the top surface of the substrate semiconductor layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses are present within volumes previously occupied by the sacrificial material layers 42.

Each backside recess can be a laterally extending cavity having a lateral dimension that is greater than the vertical extent of the cavity. In other words, the lateral dimension of each backside recess can be greater than the height of the backside recess. A plurality of backside recesses can be formed in the volumes from which the second material of the sacrificial material layers 42 is removed. The memory openings in which the memory stack structures 55 are formed are herein referred to as front side recesses or front side cavities in contrast with the backside recesses. In one embodiment, the device region 100 comprises an array of monolithic three-dimensional NAND strings having a plurality of device levels disposed above the substrate 10. In this case, each backside recess can define a space for receiving a respective word line of the array of monolithic three-dimensional NAND strings.

Each of the plurality of backside recesses can extend substantially parallel to the top surface of the substrate 10. A backside recess can be vertically bounded by a top surface of an underlying insulating layer 32 and a bottom surface of an overlying insulating layer 32. In one embodiment, each backside recess can have a uniform height throughout. Optionally, a backside blocking dielectric layer can be formed in the backside recesses.

Physically exposed surface portions of the optional epitaxial channel portions 11 and the substrate semiconductor layer 10 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert each physically exposed surface portion of the substrate semiconductor layer 10 into a sacrificial dielectric portion (not shown). In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each sacrificial dielectric portion includes a dielectric material that includes the same semiconductor element as the substrate semiconductor layer 10 and additionally includes at least one non-metallic element such as oxygen and/or nitrogen such that the material of the sacrificial dielectric portions is a dielectric material. In one embodiment, the sacrificial dielectric portions can include a dielectric oxide, a dielectric nitride, or a dielectric oxynitride of the semiconductor material of the substrate semiconductor layer 10.

A backside blocking dielectric layer (not shown) can be optionally formed. The backside blocking dielectric layer, if present, comprises a dielectric material that functions as a control gate dielectric for the control gates to be subsequently formed in the backside recesses. In case a blocking dielectric layer is present within each memory opening, the backside blocking dielectric layer is optional. In case a blocking dielectric layer is omitted, the backside blocking dielectric layer is present.

At least one metallic material can be deposited in the plurality of backside recesses, on the sidewalls of the at least one the backside trench 79, and over the top surface of the second contact level dielectric material layer 73. As used herein, a metallic material refers to an electrically conductive material that includes at least one metallic element.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses can be a combination of titanium nitride layer and a tungsten fill material.

In one embodiment, the metallic material can be deposited by chemical vapor deposition or atomic layer deposition. In one embodiment, the metallic material can be employing at least one fluorine-containing precursor gas as a precursor gas during the deposition process. In one embodiment, the molecule of the at least one fluorine-containing precursor gas cam comprise a compound of at least one tungsten atom and at least one fluorine atom. For example, if the metallic material includes tungsten, $WF_6$ and $H_2$ can be employed during the deposition process.

A plurality of electrically conductive layers 46 can be formed in the plurality of backside recesses, and a continuous metallic material layer (not shown) can be formed on the sidewalls of each backside trench 79 and over the at least one contact level dielectric material layer (71,73). The electrically conductive layers 46 can include word line contact via structures 84 (which are a first subset of the electrically conductive layers 46), drain select gate contact via structures 86 (which are a second subset of the electrically conductive layers 46), and source select gate contact via structures 82 (which are a third subset of the electrically conductive layers 46). Thus, each sacrificial material layer 42 can be replaced with an electrically conductive layer 46. A backside cavity is present in the portion of each backside trench 79 that is not filled with the backside blocking dielectric layer 66 and the continuous metallic material layer.

The deposited metallic material of the continuous metallic material layer is etched back from the sidewalls of each backside trench 79 and from above the second contact level dielectric material layer 73, for example, by an isotropic wet etch or dry etch or the combination of isotropic wet etch and dry etch. Each remaining portion of the deposited metallic material in the backside recesses constitutes an electrically conductive layer 46. Each electrically conductive layer 46 can be a conductive line structure. Thus, the sacrificial material layers 42 are replaced with the electrically conductive layers 46. Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. Optionally, the sacrificial dielectric portions can be removed from above the substrate semiconductor layer 10 during the last processing step of the anisotropic etch.

In one embodiment, the spacer material layers in the initial alternating stack can include sacrificial material layers 42, and the sacrificial material layers 42 can be replaced with electrically conductive layers 46. In this case, the in-process alternating stack of the insulating layers 32 and sacrificial material layers 42 is modified during the processing steps of FIGS. 8-10 to form an alternating stack of the insulating layer 32 and the electrically conductive layers 46. In one embodiment, the remaining portions of the charge trapping layer comprises charge storage regions for a NAND string.

Alternatively, the spacer material layers can be formed as electrically conductive layers 46. In this case, the epitaxial channel portions 11 can be omitted, or can be formed to a lesser height, to avoid electrical shorts with the electrically conductive layers 46.

Figure 7:
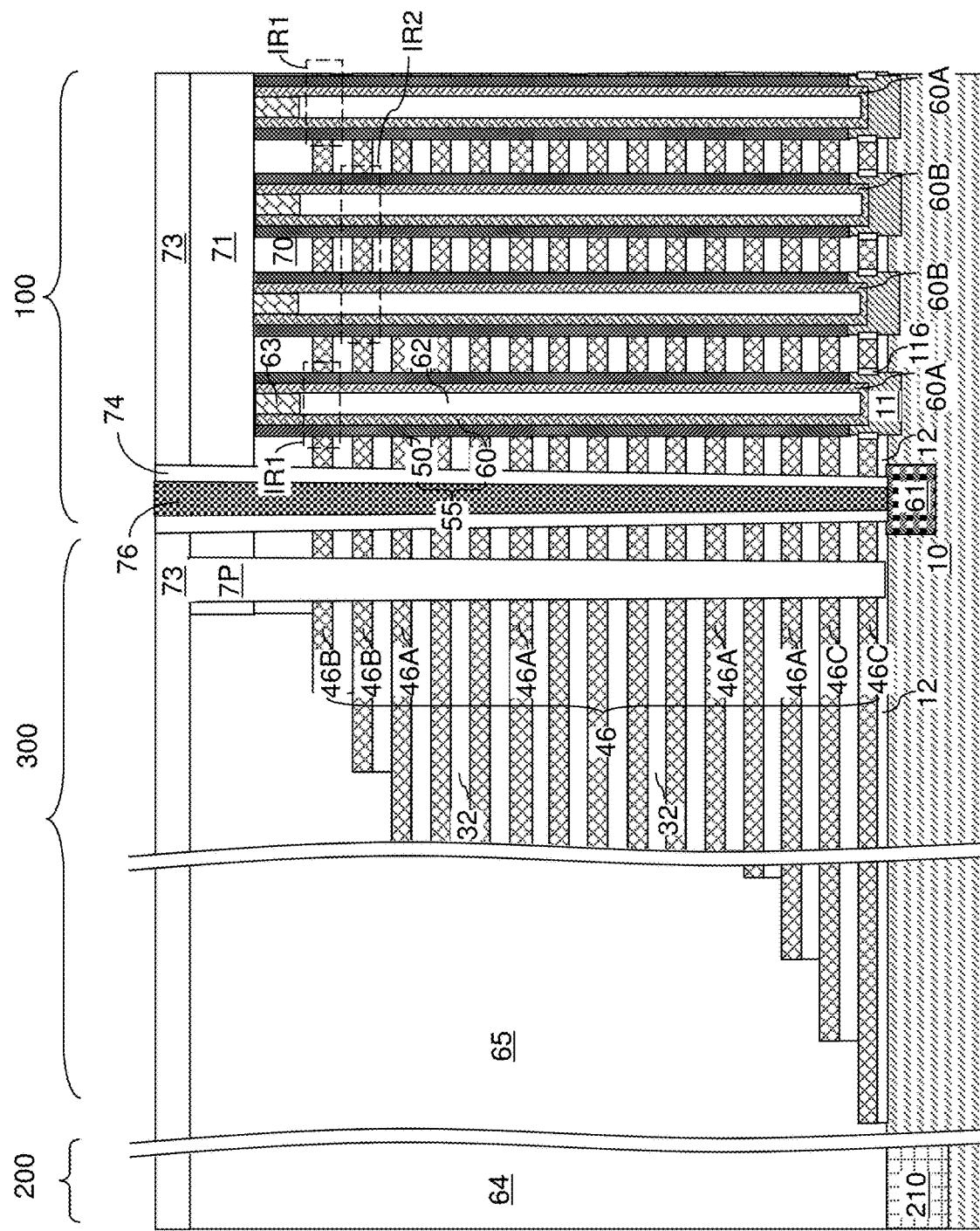
FIG. 7 is a vertical cross-sectional view of the exemplary structure after formation of source regions, insulating spacers, and backside contact via structures according to an embodiment of the present disclosure.

Referring to FIG. 7, a source region 61 can be formed in a surface portion of the substrate (e.g., in the substrate semiconductor layer 10) underneath each backside trench 79. Each source region 61 can be formed by implanting electrical dopants through each backside trench 79 into a semiconductor portion located on, or within, the substrate 10. For example, a source region 61 may be formed by implantation of dopant atoms into a portion of the substrate semiconductor layer 10 through each backside trench 79. Alternatively, a source region 61 can be formed on the substrate 10 as a doped semiconductor portion by deposition of a semiconductor material, for example, by selective epitaxy, and by implantation of electrical dopants into the deposited semiconductor portion.

An insulating material layer 74 can be deposited by a conformal deposition process such as a chemical vapor deposition process. The insulating material layer includes a dielectric material such as silicon oxide, silicon nitride, silicon oxynitride, or a combination thereof. In one embodiment, the insulating material can include undoped silicate glass (USG). The thickness of the insulating material layer can be in a range from 3 nm to 30 nm, although lesser and greater thicknesses can also be employed.

An anisotropic etch can be performed to remove horizontal portions of the insulating material layer from above the at least one contact level dielectric material layer (71, 73) and from a bottom portion of each backside trench 79. The anisotropic etch can be a reactive ion etch that etches the dielectric material of the insulating material layer selective to the aluminum oxide material of the continuous conformal aluminum oxide layer. In one embodiment, the reactive ion etch can employ at least one fluorocarbon etchant such as $CF_4$ and/or $CHF_3$, and optionally oxygen. Such fluorocarbon-based reactive ion etch chemistries are generally selective to aluminum oxide. Each remaining portion of the insulating material layer constitutes an insulating spacer 74.

In case a portion of the backside trench 79 has a substantially rectangular horizontal cross-sectional area, the insulating spacer 74 can have a pair of parallel vertical portions laterally spaced from each other by a uniform distance.

Further, each parallel vertical portion of the insulating spacer 74 can have a uniform lateral thickness at a bottom portion and a middle portion. The anisotropic etch can cause formation of tapers at the top portion of each insulating spacer 74. In this case, each insulating spacer 74 can have a tapered profile at a top portion. In other words, the lateral thickness of each insulating spacer 74 can decrease with a vertical distance from the top surface of the substrate 10.

At least one conductive material can be deposited to fill each backside cavity laterally surrounded by a respective insulating spacer 74. The at least one conductive material can include, for example, a combination of a conductive metallic nitride (such as TiN, TaN, or WN) that can be employed to form a conductive diffusion barrier layer, and a conductive fill material (such as W, Cu, Al, Ru, Co, and/or a heavily doped conductive semiconductor material). The at least one conductive material can be deposited by physical vapor deposition (PVD), chemical vapor deposition (CVD), electroplating, electroless plating, or a combination thereof. Excess portions of the at least one conductive material can be removed from above the top surface of the at least one contact level dielectric material layer (71, 73) by a planarization process, which may employ a recess etch or chemical mechanical planarization (CMP). A contact via structure is formed within each backside trench 79, which is herein referred to as a substrate contact via structure 76. Each substrate contact via structure 76 can physically contact a portion of the substrate (9, 10, 61) such as a source region 61 of the substrate. In this case, the substrate contact via structure 76 can be a source contact via structure that can be employed to apply electrical bias to a respective source region 61.

Figure 8A:
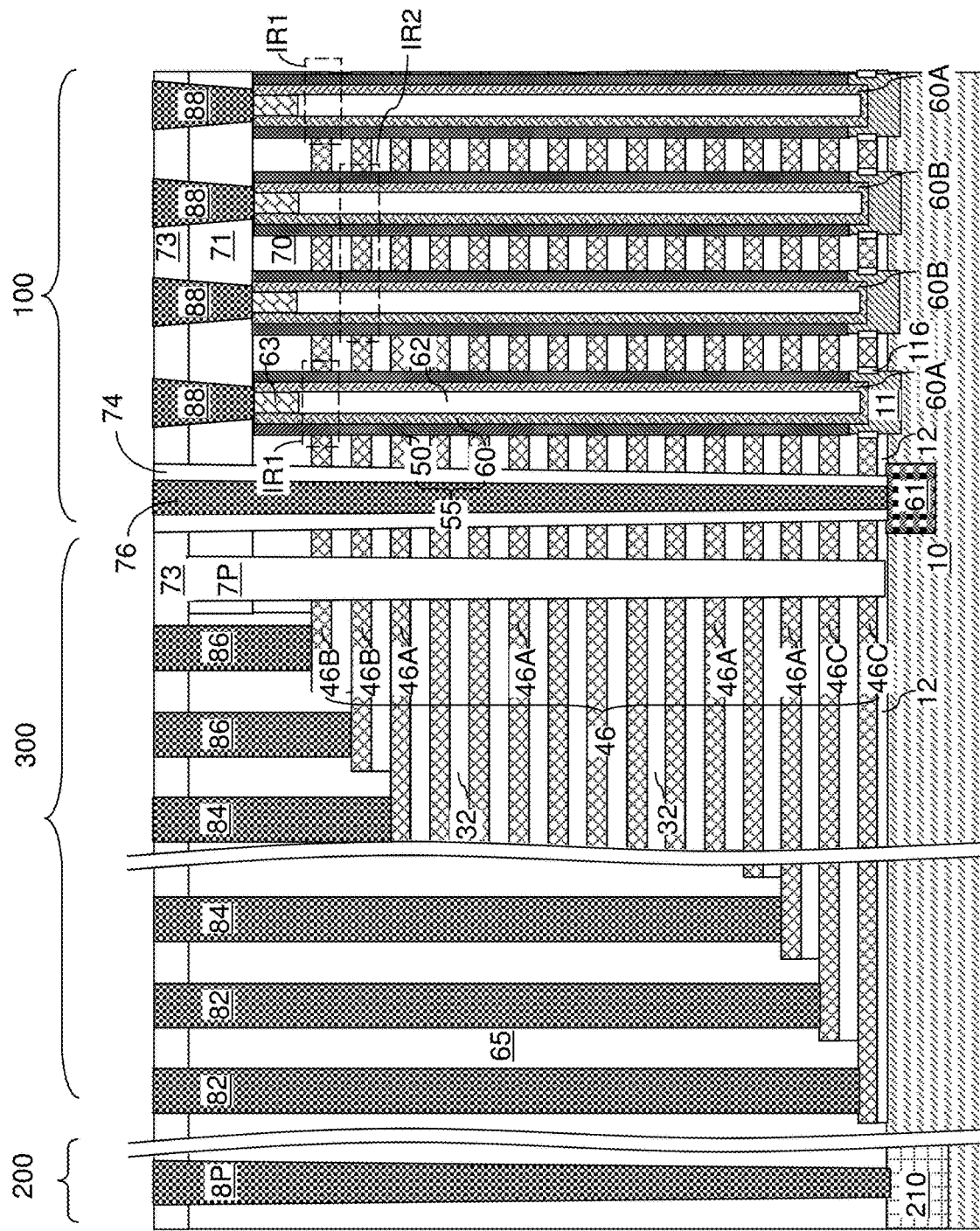
FIG. 8A is a vertical cross-sectional view of the exemplary structure after formation of additional contact via structures according to an embodiment of the present disclosure.
Figure 8B:
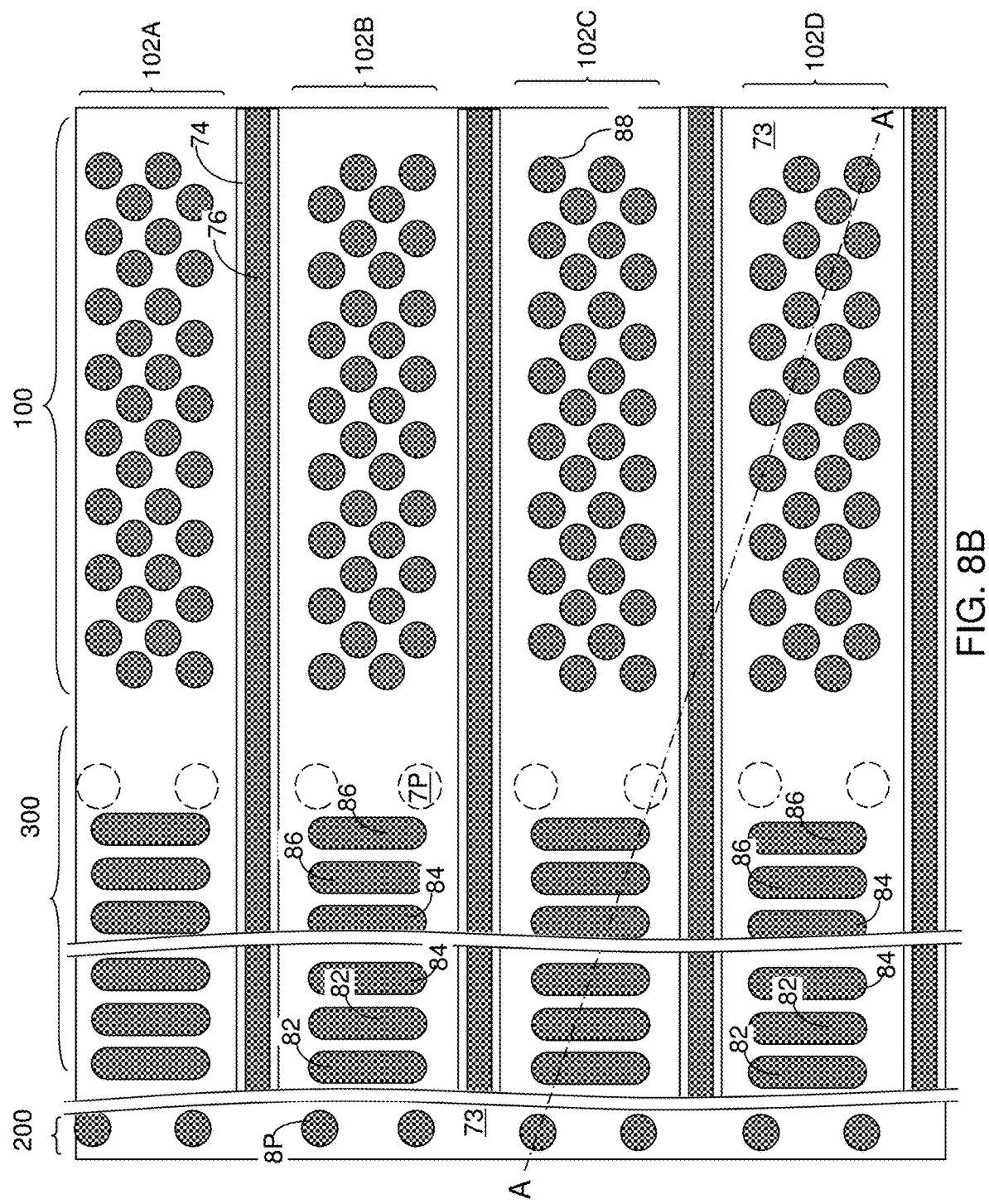
FIG. 8B is a top-down view of the exemplary structure of FIG. 8A.
Figure 8C:
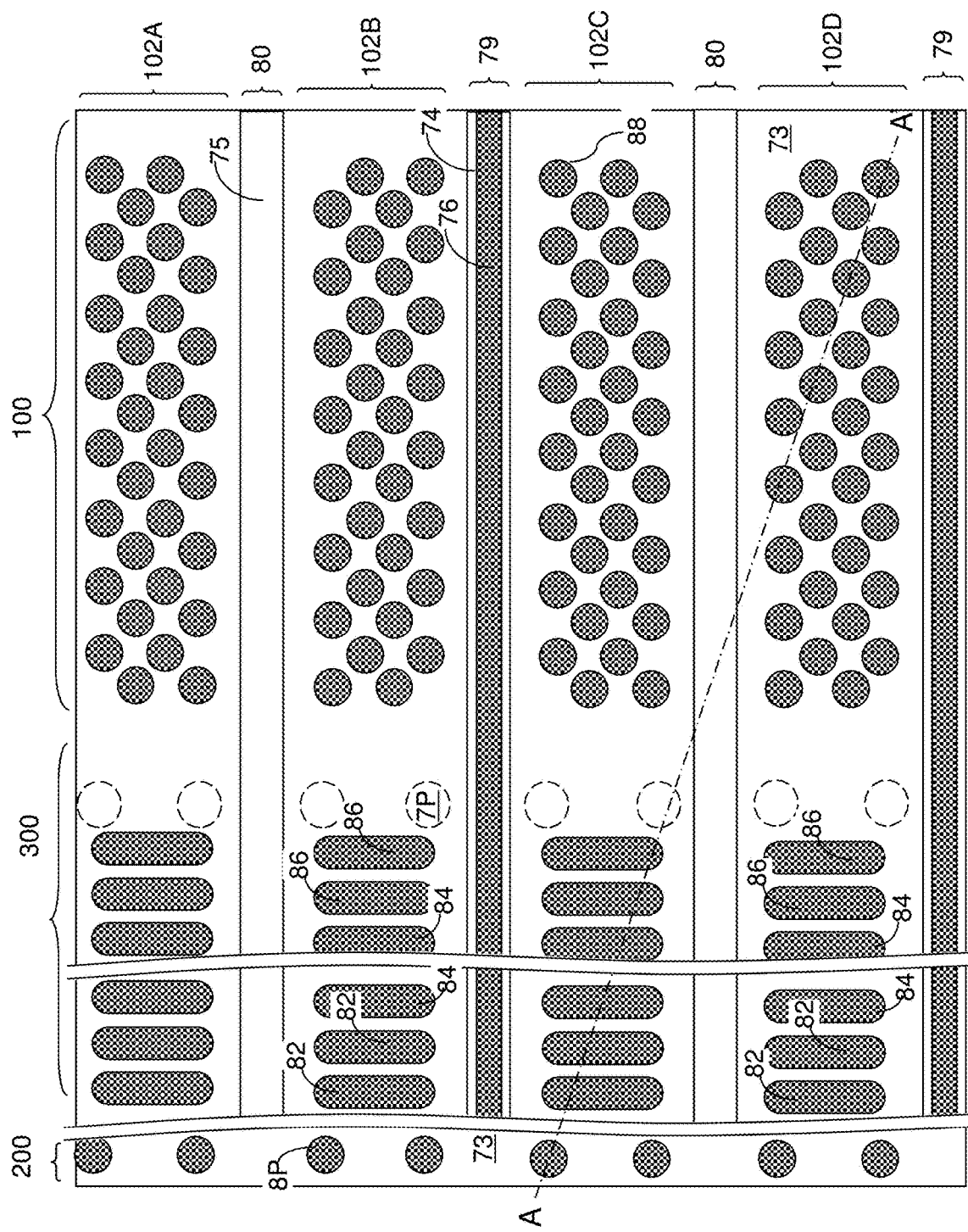
FIG. 8C is a top-down view of an alternative structure of FIG. 8A derived from the alternative structure of FIG. 5C.

Referring to FIGS. 8A-8C, additional contact via structures (8P, 82, 84, 86, 88) can be formed through the at least one contact level dielectric material layer (71, 73), the dielectric material portion 64, and/or the retro-stepped dielectric material portion 65 to various nodes of the devices in the exemplary structure. The additional contact via structures (8P, 82, 84, 86, 88) can include drain contact via structures 88 that contact the drain regions 63, word line contact via structures 84 (which are a first subset of the electrically conductive layers 46) that contact word lines 46A of the memory cell array, drain select gate contact via structures 86 (which are a second subset of the electrically conductive layers 46) that contact drain select gate electrodes 46B for the memory cell array, source select gate contact via structures 82 (which are a third subset of the electrically conductive layers 46) that contact source select gate electrodes 46C for the memory cell array, and peripheral device contact via structures 8P that contact various nodes of the at least one peripheral device 210.

The structure of FIG. 8B is derived from the structure of FIG. 5B in which all trenches are the deep backside trenches 79 which are filled with the spacers 74 and the substrate contact via structures (i.e., source electrodes or local interconnects) 76. Memory blocks 102A to 102D are separated by the backside trenches 79. The structure of FIG. 8C is derived from the structure of FIG. 5C in which some of the trenches are the deep backside trenches 79 which are filled with spacers 74 and substrate contact via structures 76, and other trenches comprise shallow trenches 80. In this structure, the shallow trenches 80 may be filled with any suitable insulating material 75, such as silicon oxide, which electrically isolates the drain select gate electrodes 46B of adjacent memory blocks. For example, memory blocks 102B and 102C are separated by the backside trench 79, while the drain select gate electrodes 46B in memory blocks 102A and 102B are separated by the shallow trench 80 filled with the insulating material 75. Thus, memory blocks 102A and 102B comprise separate memory blocks because they do not share the same drain select gate electrodes 46B. It should be noted that the NAND strings in each block may comprise multi-charge state cells where two or more control gate electrodes/word lines 46A may be located adjacent to different parts of the same memory stack structure 55 or of the same NAND string at the same device level in the same memory block, as described in U.S. patent application Ser. No. 14/748,575, filed on Jun. 24, 2015 and U.S. patent application Ser. No. 14/721,198, filed on May 26, 2015, both of which are incorporated herein by reference in their entirety.

FIG. 9 shows a circuit including a pair of vertical NAND strings (58A, 58B) containing memory cell charge storage transistors (59A, 59B) and additional select transistor devices (DST1, DST2, SST1, SST2, DST3, DST4, SST3, SST4). Referring collectively to FIGS. 8A, 8B, 8C, and 9, the pair of vertical NAND strings (58A, 58B) can be embodied as any pair of memory stack structures 55 and elements that are electrically coupled to the pair of memory stack structures 55 (e.g., gate electrodes 46A, 46B and 46C). The pair of vertical NAND strings share a common bit line 92, which is electrically connected (i.e., shorted) by the respective drain contact via structures 88 to the two drain regions 63 in contact with the vertical semiconductor channels (60A, 60B) of the pair of vertical NAND strings (58A, 58B).

Each vertical NAND string includes a series connection of vertical field effect transistors. Each vertical memory cell charge storage transistor employs a respective portion of a vertical semiconductor channel 60 as a channel, and a respective word line 46A (located at the same level as the respective channel) as a control gate electrode. The additional devices include a series connection of at least two drain select gate transistors and a series connection of at least two source select gate transistors. For example, a series connection of the at least two drain select gate transistors can include a first drain select transistor DST1 and a second drain select transistor DST2 for the first vertical NAND string 58A, or a third drain select transistor DST3 and a fourth drain select transistor DST4 for the second vertical NAND string 58B. A series connection of the at least two source select gate transistors can include a first source select transistor DST1 and a second source select transistor DST2 for the first vertical NAND string 58A, or a third source select transistor DST3 and a fourth source select transistor DST4 for the second vertical NAND string 58B.

The first drain select transistor DST1 and the fourth drain select transistor DST4 can be formed as high threshold voltage devices having respective high threshold voltages. As used herein, a high threshold voltage device refers to a field effect transistor device that requires a higher gate voltage for full turn on of the field effect transistor relative to a reference turn-on voltage. The notation "Vth" next to a transistor denotes that the transistor is a high threshold voltage device. The second drain select transistor DST2 and the third drain select transistor DST3 can be formed as low threshold voltage devices having respective low threshold voltages. As used herein, a low threshold voltage device refers to a field effect transistor device that requires a lower gate voltage for full turn on of the field effect transistor relative to the reference turn-on voltage. The notation "Vtl" next to a transistor denotes that the transistor is a low threshold voltage device, such as that Vtl<Vth. Each NAND string has at least one low threshold voltage select transistor and at least one high threshold voltage select transistor on the same side of the memory cell transistors (59A, 59B). In other words, each NAND string has at least two drain select transistors with a different threshold voltage from each other and/or at least two source select transistors with a different threshold voltage from each other.

The first source select transistor SST1 and the fourth source select transistor SST4 can be formed as high threshold voltage devices having respective high threshold voltages. The second source select transistor SST2 and the third source select transistor SST3 can be formed as low threshold voltage devices having respective low threshold voltages.

According to an embodiment of the present disclosure, an alternating stack of insulating layers 32 and spacer material layers can be formed over a substrate. The spacer material layers 32 can be formed as, or can be subsequently replaced with, the electrically conductive layers 46. A first vertical NAND string 58A can be formed with first memory cell charge storage transistors 59A in a series connection with a first drain select transistor DST1 and a second drain select transistor DST2 through the alternating stack. A second vertical NAND string 58B can be formed with second memory cell charge storage transistors 59B in a series connection with a third drain select transistor DST3 and a fourth drain select transistor DST4 through the alternating stack. The first and third drain select transistors (DST1, DST3) are formed at the level of a first electrically conductive layer, which may be the level of the first implanted channel regions IR1. The second and fourth drain select transistors (DST2, DST4) can be formed at the level of a second electrically conductive layer, which may be the level of the second implanted channel regions IR2. The first drain select transistor DST1 and the fourth drain select transistor DST4 can have higher threshold voltages than the threshold voltages of the second and third drain select transistors (DST2, DST3).

In one embodiment, a first electrically conductive layer among the electrically conductive layers 46 can be located at the level of the first implanted channel regions IR1, and can comprise a first common gate electrode SGD1 (which can be a first drain select gate electrode 46B) for the first drain select transistor DST1 and the third drain select transistor DST3. A second electrically conductive layer among the electrically conductive layers 46 can be located at the level of the second implanted channel regions IR2, and can comprise a second common gate electrode SGD2 (which can be a second drain select gate electrode 46B) for the second drain select transistor DST2 and the fourth drain select transistor DST4.

The first vertical NAND string 58A can include a first vertical semiconductor channel 60A as shown in FIG. 8A that extends through the alternating stack of insulating layers 32 and electrically conductive layers 46. The first vertical semiconductor channel 60A includes channels of the first memory cell charge storage transistors 59A and channels of the first and second drain select transistors (DST1, DST2). The second vertical NAND string 58B can include a second vertical semiconductor channel 60B that extends through the alternating stack (32, 46). The second vertical semiconductor channel 60B includes channels of the second memory cell charge storage transistors 59B and channels of the third and fourth drain select transistors (DST3, DST4).

As discussed above, electrical dopants can be implanted into a portion of each first vertical semiconductor channel 60A located at the level of the first electrically conductive layer (e.g., one of the drain select gate electrodes 46B), while preventing implantation of electrical dopants into the second vertical semiconductor channels 60B during the first masked implantation process. Additional electrical dopants can be implanted into a portion of each second vertical semiconductor channel 60B located at the level of the second electrically conductive layer (e.g., another of the drain select gate electrodes 46B), while preventing implantation of electrical dopants into the first vertical semiconductor channels 60A.

In one embodiment, a first portion of the first vertical semiconductor channel 60A laterally surrounded by a first common gate electrode SGD1 (i.e., a drain select gate electrode 46B located at the level of the first implanted channel region IR1) has a greater dopant concentration than a second portion of the first vertical semiconductor channel 60A laterally surrounded by the second common gate electrode SGD2 (i.e., another drain select gate electrode 46B located at the level of the second implanted channel region IR2). A first portion of the second vertical semiconductor channel 60B laterally surrounded by the first common gate electrode SGD1 has a lesser dopant concentration than a second portion of the second vertical semiconductor channel 60B laterally surrounded by the second common gate electrode SGD2.

In one embodiment, the second portion of the first vertical semiconductor channel 60A and the first portion of the second vertical semiconductor channel 60B have a same dopant concentration as portions of the first and second vertical semiconductor channel 60A and 60B that constitute channels of the first and second memory cell charge storage transistors 59A and 59B, respectively.

A first drain region 63 can be formed on an upper end of each first vertical semiconductor channel 60A, and a second drain region 63 can be formed on an upper end of each second vertical semiconductor channel 60B. A first vertical semiconductor channel 60A includes channels of the first memory cell charge storage transistors 59A of NAND string 58A and the first and second drain select transistors (DST1, DST2). A second vertical semiconductor channel 60B includes channels of the second memory cell charge storage transistors 59B of NAND string 58B and the third and fourth drain select transistors (DST3, DST4).

A common bit line 92 is formed over the first and second drain regions 63. The bit line is electrically shorted to the first and second drain regions 63.

A source region 61 is formed in, or on, the substrate 10. The source region 61 is connected to vertical semiconductor channels (60A, 60B) of the first vertical NAND string 58A and the second vertical NAND string 58B through a common horizontal semiconductor channel (i.e., the surface portion of the substrate semiconductor layer 10 between the source region 61 and the epitaxial channel portions 11) located in the substrate 10. The vertical semiconductor channels 60 of the first vertical NAND string 58A and the second vertical NAND string 58B can be adjoined to a common horizontal semiconductor channel located in the substrate.

A first source select transistor SST1 and a second source select transistor SST2 can be in a series connection with the first vertical NAND string 58A, and a third source select transistor SST3 and a fourth source select transistor SST4 can be in a series connection with the second vertical NAND string 58B. The first and third source select transistors (SST1, SST3) can be formed at a level of a third electrically conductive layer 46, which can be a first source select gate electrode SGS1 (i.e., one of the source select gate electrodes 46C). The second and fourth source select transistors (SST2, SST4) can be formed at a level of a fourth electrically conductive layer 46, which can be a second source select gate electrode SGS2 (i.e., another of the source select gate electrodes 46C).

The first, second, third, and fourth source select transistors (SST1, SST2, SST3, SST4) can be formed as field effect transistors having the same threshold voltages. During operation of the device of the present disclosure, the first source select transistor SST1 and the fourth source select transistor SST4 can be programmed to have higher threshold voltages than threshold voltages of the second and third source select transistors (SST2, SST3) employing a select gate transistor threshold voltage programming process to be subsequently described. The second and third source select transistors (SST2, SST3) may optionally be programmed to increase the respective threshold voltages provided that the increased threshold voltages are less than the high threshold voltages of the first and fourth source select transistors (SST1, SST4). Upon programming, the first and fourth source select transistors (SST1, SST4) can have higher threshold voltages than the second and third source select transistors (SST2, SST3). In this case, the first and fourth source select transistors (SST1, SST4) can be high threshold voltage devices, and the second and third source select transistors (SST2, SST3) can be low threshold voltage devices.

In one embodiment, a third electrically conductive layer 46 among the electrically conductive layers 46 comprises a third common gate electrode SGS1 (which is one of the source select gate electrodes 46C) for the first source select transistor SST1 and the third source select transistor SST3. A fourth electrically conductive layer 46 among the electrically conductive layers 46 comprises a fourth common gate electrode SGS2 (which is another one of the source select gate electrodes 46C) for the second source select transistor SST2 and the fourth source select transistor SST4.

In one embodiment, the drain select transistors DST1 and DST4 may be programmed in a similar manner as the source select transistors to change their threshold voltage instead of or in addition to ion implanting regions IR1 and IR2 to change the transistor threshold voltage. Furthermore, the source select transistor threshold voltage may be changed by ion implantation into layer 10 and/or structure 11 instead of or in addition to using programming described above. Furthermore, other fabrication methods in addition to ion implantation may be used to change the threshold voltage of the source and/or drain select transistors, such as by varying a thickness of the select gate electrodes and/or by varying a composition of the select gate electrodes, as will be described below with respect to FIGS. 19A and 19B, and FIGS. 20A and 20B, respectively. Thus, the threshold voltage of the select transistors may be changed during fabrication (e.g., by selective ion implantation into the channel, varying gate thickness and/or varying gate composition) and/or by programming after fabrication. For example, the end select transistors (i.e., DST1 and/or SST1) in the first string 58A may be fabricated with a higher threshold voltage than the other respective end select transistors (i.e., DST3 and/or SST3) in the second string 58B, while the intermediate select transistors (i.e., DST4 and/or SST4) in the second string 58B may be programmed with and/or fabricated with a higher threshold voltage then the other respective intermediate select transistors (i.e., DST2 and/or SST2) in the first string 58A.

In one embodiment, the memory device of the embodiments of the present disclosure can include a monolithic three-dimensional NAND memory device. The electrically conductive layers 46 can include a first electrically conductive layer located at a first level and a second electrically conductive layer located at a second level that is different from the first level. The first and second electrically conductive layers can comprise, or can be electrically connected to, a respective word line of the monolithic three-dimensional NAND memory device. The substrate 10 can comprise a silicon substrate. The monolithic three-dimensional NAND memory device can comprise an array of monolithic three-dimensional NAND strings over the silicon substrate. At least one memory cell in a first device level of the array of monolithic three-dimensional NAND strings can be located over another memory cell in a second device level of the array of monolithic three-dimensional NAND strings. The silicon substrate can contain an integrated circuit comprising a driver circuit for the memory device located thereon. The array of monolithic three-dimensional NAND strings can comprises a plurality of semiconductor channels. At least one end portion of each of the plurality of semiconductor channels extends substantially perpendicular to a top surface of the substrate. The array of monolithic three-dimensional NAND strings can comprises a plurality of charge storage elements. Each charge storage element can be located adjacent to a respective one of the plurality of semiconductor channels. The array of monolithic three-dimensional NAND strings can comprise a plurality of control gate electrodes having a strip shape extending substantially parallel to the top surface of the substrate. The plurality of control gate electrodes can comprise at least a first control gate electrode located in the first device level and a second control gate electrode located in the second device level.

Figure 10:
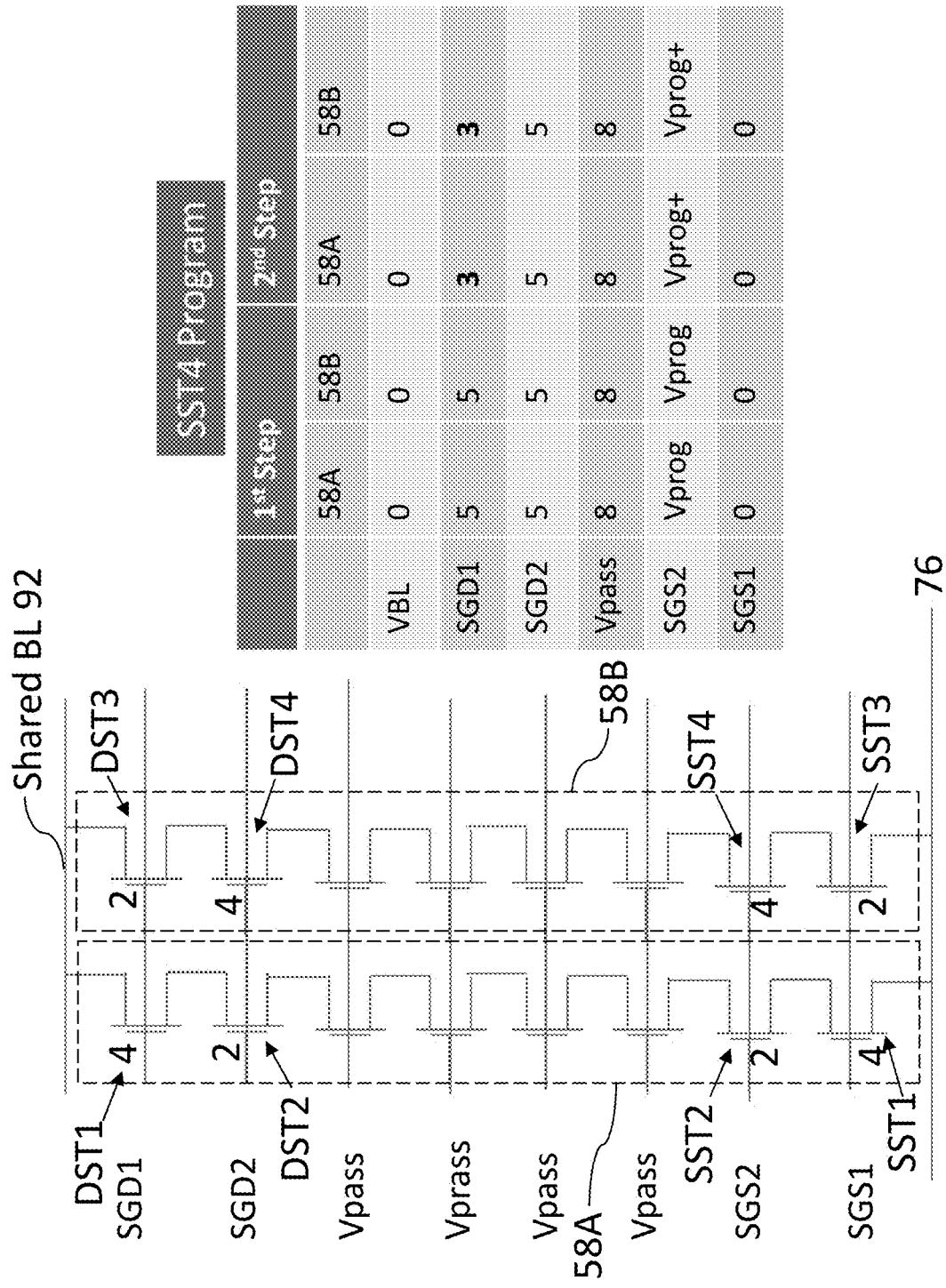
FIG. 10 illustrates operating conditions of the circuit of FIG. 9 during programming of a fourth source select transistor according to an embodiment of the present disclosure.

Referring to FIG. 10, operating conditions of the circuit of FIG. 9 is illustrated during programming of the fourth source select transistor SST4 according to an embodiment of the present disclosure. For illustrative purposes, the first and fourth drain select transistors (DST1, DST4) can be formed with the same high threshold voltage of 4 V, and the second and third drain select transistors (DST2, DST3) can be formed with the same low threshold voltage of 2 V.

The threshold voltage values and applied bias values shown in FIG. 10 and subsequent figures are for illustrative purposes only. It is understood that the applied voltage required to turn on a device needs to be higher than the threshold voltage, and that the actual value of the applied voltage employed to turn on the device can be determined by respective transistor's I-V characteristics. Likewise, the applied voltage required to turn off the device needs to be lower than the threshold voltage of the device, and the actual value of the applied voltage employed to turn off the device can be determined, among others, by the I-V characteristics of the respective transistor.

Application of a bias voltage less than 2V to the first and second select drain gate electrodes (SGD1, SGD2) turns off each of the drain select transistors (DST1, DST2, DST3, DST4). In this case, the first vertical NAND string 58A and the second vertical NAND string 58B are deactivated, i.e., electrically disconnected from the shared bit line.

Application of a bias voltage greater than 4V (such as 5V) to the first and second select drain gate electrodes (SGD1, SGD2) turns on each of the drain select transistors (DST1, DST2, DST3, DST4). In this case, the first vertical NAND string 58A and the second vertical NAND string 58B can be activated, i.e., turned on, electrically connected to the shared bit line.

Application of a bias voltage greater than 4V (such as 5V) to the first select drain gate electrode SGD1 and an intermediate bias voltage (such as 3V) between the high and low bias voltages (e.g., between 2V and 4V) to the second select drain gate electrode SGD2 turns on the first, second and third drain select transistors (DST1, DST2, DST3) and turns off the fourth drain select transistor DST4. In this case, the first vertical NAND string 58A can be activated by application of an electrical bias voltage to the shared bit line, while the second vertical NAND string 58B remains deactivated.

Application of a high bias voltage (e.g., greater than 4V, such as 5V) to the second select drain gate electrode SGD2 and an intermediate bias voltage between 2V and 4V (such as 3V) to the first select drain gate electrode SGD1 turns on the second, third and fourth drain select transistors (DST1, DST3, DST4) and turns off the first drain select transistor DST1. In this case, the second vertical NAND string 58B can be activated by application of an electrical bias voltage to the shared bit line, while the first vertical NAND string 58A remains deactivated.

As discussed above, in one embodiment, the first, second, third, and fourth source select transistors (SST1, SST2, SST3, SST4) can be formed as field effect transistors having the same initial threshold voltage. In this case, channel regions of the first, second, third, and fourth source select transistors (SST1, SST2, SST3, SST4) can have the same dopant concentration. In one embodiment, the initial threshold voltage can be less than the low threshold voltages that the second and third source select transistors (SST2, SST3) will have during read and programming operations. For example, such an initial threshold voltage may be between 0.5 V and 1.9 V). In another embodiment, the initial threshold voltage can be the same as the low threshold voltage that the second and third source select transistors (SST2, SST3) will have during read and programming operations. For example, such an initial threshold voltage may be about 2.0 V.

In one embodiment, the differences in the threshold voltages of the source select transistors (SST1, SST2, SST3, SST4) can be provided by injecting different amount of electrical charge to the charge trapping material portions of the source select transistors (SST1, SST2, SST3, SST4). The different amounts of injected charges can cause the various charge trapping material portions of the source select transistors (SST1, SST2, SST3, SST4) to include different amounts of trapped electrical charge. Specifically, charge trapping material portions (which may be portions of a charge trapping layer such as a silicon nitride layer within the memory films 50) within the first and fourth source select gate transistors (SST1, SST4) can have a different trapped electrical charge density than charge trapping material portions within the second and third source select gate transistors by employing a charge injection scheme.

In an illustrative example shown in FIG. 10, each high threshold voltage source select transistor can be programmed employing a single step threshold voltage programming process or a two step threshold voltage programming process. The optional first step of the programming process is omitted in the single step threshold voltage programming process, and is performed in the two step threshold voltage programming process. If the optional first step of the programming process, all of the drain select transistors (DST1, DST2, DST3, DST4) are turned on by applying to the control gate electrode of the memory cell charge storage transistors a high bias voltage (such as 5 V) that is greater than the high threshold voltages of the drain select transistors (DST1, DST2, DST3, DST4), and the first and third source select transistors (SST1, SST3) are turned off by applying a turn-off gate voltage (such as 0 V) to the first source select gate electrode SGS1. A low-threshold-voltage programming voltage Vprog (which is greater than Vth) can be applied to the second source select gate electrode SGS2, which may be, for example, in a range from 12V to 24 V. Electrical charge can be injected to the charge trapping material portions (which may be silicon nitride portions) in the memory films 50 of the second and fourth source select transistors (SST2, SST4) to set the threshold voltages of the second and fourth source select transistors (SST2, SST4) at the low threshold voltage Vtl (such as 2V). A pass voltage, Vpass (e.g., 8V) which is lower than Vprog is applied to the control gate electrodes 46A of the memory cell charge storage transistors (59A, 59B), while zero volts is applied to the common bit line 92.

In the second step of the two step programming process or in the single step programming process, the first drain select gate electrode SGD1 is biased with the intermediate voltage (such as 3V) that is between the low threshold voltages and the high threshold voltages of the drain select transistors (DST1, DST2, DST3, DST4), and the second drain select gate electrode SGD2 is biased with a voltage (such as 5 V) that is greater than the high threshold voltages of the drain select transistors (DST1, DST2, DST3, DST4). The second, third, and fourth drain select transistors (DST2, DST3, DST4) are turned on, and the first drain select transistor DST1 is turned off. The first and third source select transistors (SST1, SST3) are turned off by applying a turn-off gate voltage (such as 0 V) to the first source select gate electrode SGS1. A high-threshold-voltage programming voltage Vprog+ can be applied to the second source select gate electrode SGS2, which may be, for example, in a range from 18 V to 36 V. Additional electrical charge can be injected to the charge trapping material portion (which may be silicon nitride portions) in the memory film 50 of the fourth source select transistor SST4 to set the threshold voltage of the fourth source select transistor SST4 at the high threshold voltage Vth (such as 4V).

Thus, the threshold voltage for the fourth source select transistor SST4 can be increased by injecting electrical charge to charge trapping material portion within the fourth source select gate transistor SST4, while not injecting electrical charge to charge trapping material portions within the second source select gate transistor SST2 which is turned off or any other charge trapping material portions at the second step of the two step programming process, or at the single step programming process (in case the first step of the two-step programming process is omitted).

Subsequently, the first source select transistor SST1 can be programmed to become a high threshold voltage transistor by reversing the voltages applied to the first and second source select gate electrodes (SGS1, SGS2), reversing the voltages applied to the first and second drain select gate electrodes (SGD1, SGD2), and performing the two-step programming process or a single step programming process described above.

Thus, the threshold voltages for the first source select transistor SST1 and the fourth source select transistor SST4 can be increased by injecting electrical charge to charge trapping material portions within the first and fourth source select gate transistors (SST1, SST4), while not injecting electrical charge to charge trapping material portions within the second and third source select gate transistors (SST2, SST3) at the second step (or the only step) of the programming process.

In case the first step of the two step programming process is employed, the second and third source select transistors (SST2, SST3) may be programmed to increase the respective threshold voltages provided that the increased threshold voltages are less than the high threshold voltages of the first and fourth source select transistors (SST1, SST4). Upon programming, the first and fourth source select transistors (SST1, SST4) can have higher threshold voltages than the second and third source select transistors (SST2, SST3). In this case, the first and fourth source select transistors (SST1, SST4) can be high threshold voltage devices, and the second and third source select transistors (SST2, SST3) can be low threshold voltage devices.

Figure 11:
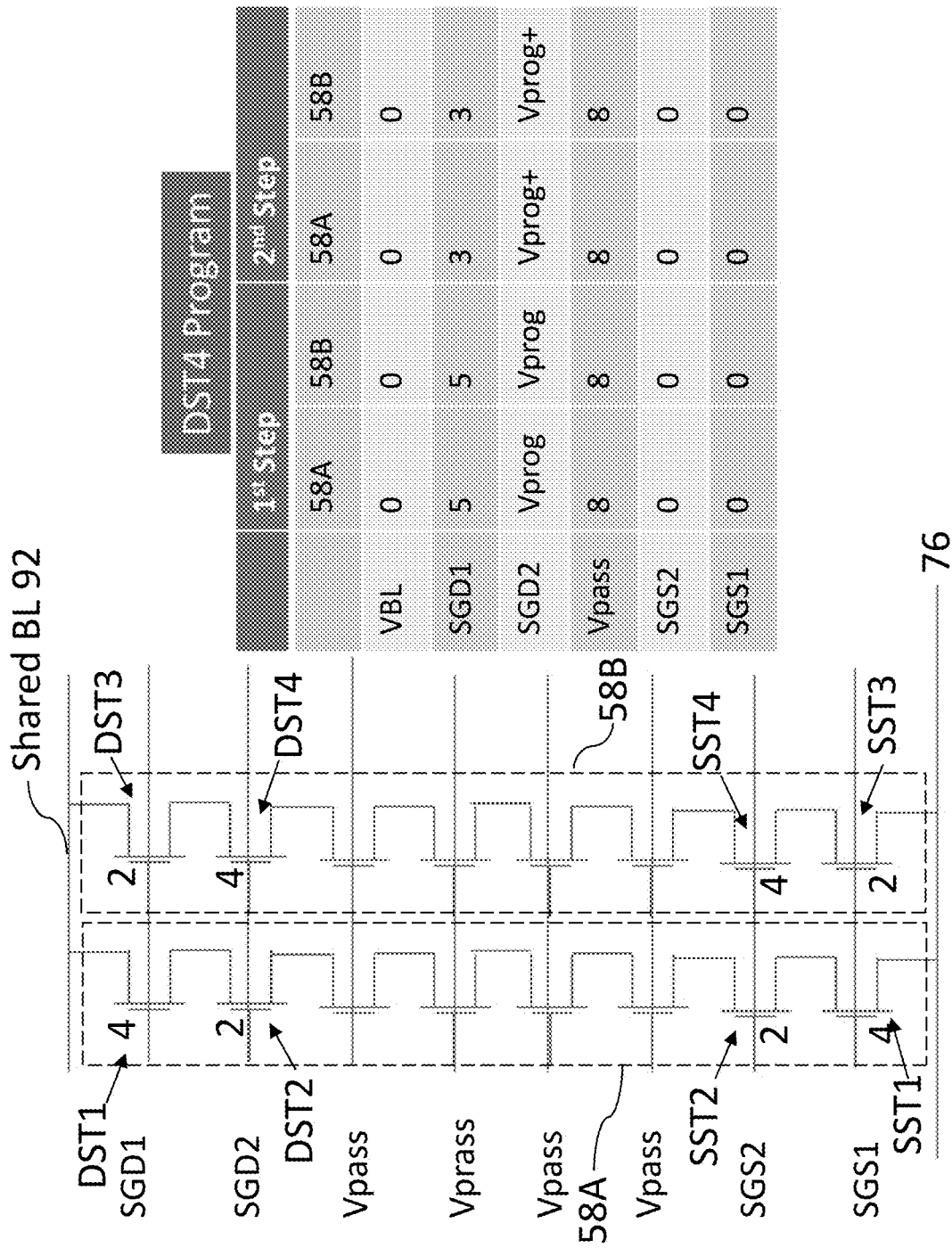
FIG. 11 illustrates operating conditions of the circuit of FIG. 9 during programming of a fourth drain select transistor according to an embodiment of the present disclosure.

Referring to FIG. 11, the threshold of the some of the drain select transistors may also be varied (e.g., increased or decreased) by programming after the drain select transistors are manufactured with the same threshold voltage. Alternatively, the programming step shown in FIG. 11 may be an optional step of enhancing the threshold voltages of the high threshold voltage drain select transistors (DST1, DST4) which are manufactured with a higher threshold voltage (e.g., by ion implantation) than the low threshold voltage drain select transistors (DST2, DST3). In other words, the high threshold voltages of the first and fourth drain select transistors (DST1, DST4) can be increased above the original (i.e., as manufactured) high threshold voltages provided by the first implanted channel region IR1 (for example, within the channel of the first drain select transistor DST1) and the second implanted channel region IR2 (for example, within the channel of the fourth drain select transistor DST4).

For example, in order to program the fourth drain select transistor DST4 as an enhanced high threshold voltage device (i.e., a device having a higher threshold voltage than the original high threshold voltage), a programming process can be employed, which may be a single step process or a two step process. In the optional first step, the first and third drain select transistors (DST1, DST3) are turned on by applying a high voltage (such as 5V) to the first drain select gate electrode SGD1, and a programming voltage Vprog (which is higher than the high voltage and the Vth, and which may be in a range from 12V to 24V) can be applied to the second select drain gate electrode SGD2. Electrical charge can be injected to the charge storage regions within the second and fourth drain select gate transistors (DST2, DST4) to raise the threshold voltages of the second and fourth drain select gate transistors (DST2, DST4) to an intermediate level. In the second step (or the only step in case the first step is omitted), the third drain select transistor DST3 can be turned on and the first drain select transistor DST1 can be turned off by applying a bias voltage (such as 3V) between the low threshold voltage and the high threshold voltage of the first and third drain select transistors (DST1, DST3) to the first drain select gate electrode SGD1. A higher programming voltage Vprog+ (which is higher than Vprog and which may be in a range from 18 V to 36 V) can be applied to the second drain select gate electrode SGD2, thereby inducing injection of additional electrical charge only to the charge trapping material portion of the fourth drain select transistor DST4, while no charge injection occurs in the second drain select transistor DST2 because the first NAND string 58A is off due to the intermediate voltage being lower than Vth of transistor DST1. The pass voltage, Vpass (e.g., 8V) is applied to the control gate electrodes 46A and zero volts is applied to the common bit line 92.

A similar programming process can be performed for the first drain select transistor DST1 by activating the circuitry connected to the first vertical NAND string 58A and deactivating the circuitry connected to the second vertical NAND string 58B, and by applying the higher programming voltage Vprog+ to the first drain select gate electrode SGD1 (e.g., a reverse of the steps described above).

Figure 12:
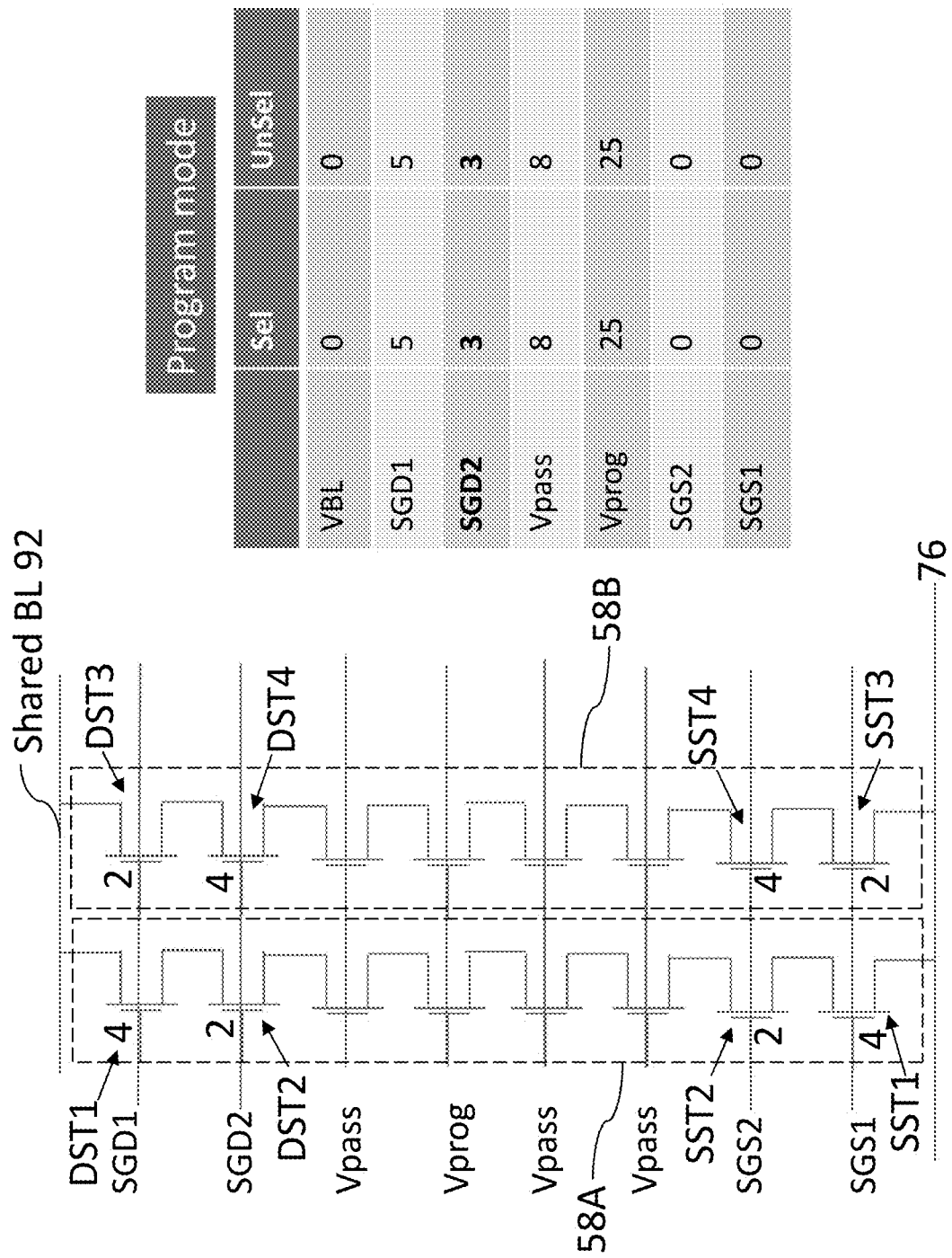
FIG. 12 illustrates operating conditions of the circuit of FIG. 9 during a programming mode according to an embodiment of the present disclosure.
Figure 13:
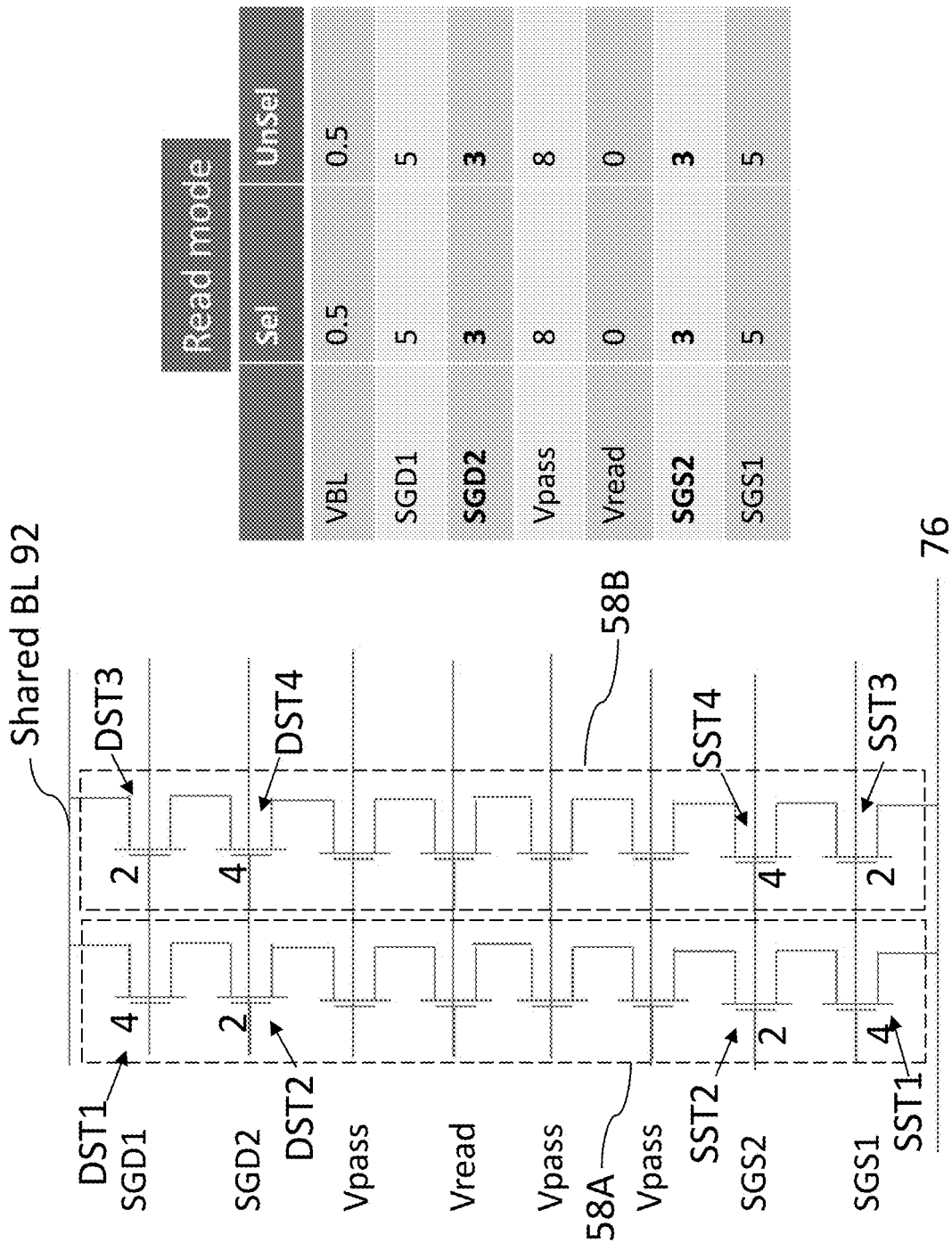
FIG. 13 illustrates operating conditions of the circuit of FIG. 9 during a read mode according to an embodiment of the present disclosure.

Referring to FIGS. 12 and 13, operating conditions of the circuit of FIG. 9 are shown during a programming mode and during a read mode, respectively. Specifically, only one of the first vertical NAND string 58A and the second vertical NAND string 58B can be activated by turning on only three of the first, second, third, and fourth drain select transistors. Only one of the first vertical NAND string 58A and the second vertical NAND string 58B can be activated by applying a set of selection control voltages to the first and second drain select gate electrodes (SGD1, SGD2) and to the first and second source select gate electrodes (SGS1, SGS2).

In an illustrative example, during a programming operation for the first vertical NAND string 58A, a high bias voltage (e.g., 5V) greater than the high threshold voltage of the first drain select transistor DST1 can be applied to the first drain select gate electrode SGD1 to turn on both the first and third drain select transistors (DST1, DST3), and an intermediate bias voltage (e.g., 3V) between the two threshold voltages of the second and fourth drain select transistors (DST2, DST4) can be applied to the second drain select gate electrode SGD2 to turn on the second drain select transistor DST2, while turning off the fourth drain select transistor DST4. While the second vertical NAND string 58B is deactivated, i.e., electrically disconnected from the shared (i.e., common) bit line 92 because transistor DST4 is off, suitable bias conditions can be applied to the word lines 46A, the source select gate electrodes 46C, the bit line 92 and the source region 61 through the backside contact via structure 76 (e.g., source electrode or local interconnect) to program each memory cell in the first vertical NAND string 58A. For example, zero volts is applied to the bit line 92, 3V is applied to electrode SGD1, Vprog+ is applied to electrode SGD2, Vpass is applied to the control gate electrodes 46A, and zero volts is applied to electrodes SGS1 and SGS2.

For programming of the second vertical NAND string 58B, the first vertical NAND string 58A can be deactivated while the second vertical NAND string 58B is activated by applying suitable bias voltages to the drain select gate electrodes (SGD1, SGD2). Specifically, a high bias voltage greater than the high threshold voltage of the fourth drain select transistor DST4 can be applied to the second drain select gate electrode SGD2 to turn on both the second and fourth drain select transistors (DST2, DST4), and an intermediate bias voltage between the two threshold voltages of the first and third drain select transistors (DST1, DST3) can be applied to the first drain select gate electrode SGD1 to turn on only the third drain select transistor DST3 and to turn off the first drain select transistor DST1. While the first vertical NAND string 58A is deactivated, i.e., electrically disconnected from the shared bit line 92, suitable bias conditions can be applied to the word lines 46A, the source select gate electrodes 46C, the bit line and the source region 61 through the backside contact via structure 76 to program each memory cell in the second vertical NAND string 58B, similar to that described above.

The read operations can be performed in a similar manner, as shown in FIG. 13. One of the two vertical NAND strings (58A, 58B) is activated and the other of the two vertical NAND strings (58A, 58B) is deactivated by application of suitable electrical bias voltages to the drain select gate electrodes (SGD1, SDG2). Further, suitable electrical bias voltages can be applied to the source select gate electrodes (SGS1, SGS2) to turn on only one series connection of the source select transistors of the activated vertical NAND string (58A or 58B). Thus, as shown in FIG. 13, in case the first vertical NAND string 58A is activated, the series connection of the first and second source select transistors (SST1, SST2) is turned on and the series connection of the third and fourth source select transistors (SST3, SST4) can be turned off. In case the second vertical NAND string 58B is activated, the series connection of the third and fourth source select transistors (SST3, SST4) can be turned on and the series connection of the first and second source select transistors (SST1, SST2) can be turned off. Thus, the high voltage (e.g., 5V) is applied to electrodes SGD1 and SGS1 and the intermediate voltage (e.g., 3V) is applied to electrodes SGD2 and SGS2 to turn on the first NAND string 58A and to turn off the second NAND string 58B. A low voltage, VBL (e.g., 0.5V) is applied to the common bit line 92, a pass voltage, Vpass, (e.g., 8V) is applied to the control gate electrodes 46A of the unselected memory cells, while a read voltage, Vread, (e.g., 0V) which is lower than Vpass and VBL, is applied to the control gate electrode(s) 46A of the selected memory cells to be read.

Generally speaking, an operation selected from a programming operation and a read operation on only the activated vertical NAND string can be performed while applying a bias voltage, VBL, to the bit line 92. VBL may be lower than Vpass, the intermediate voltage and the high voltage, but higher than Vread.

In order to perform a programming operation or a read operation on the first vertical NAND string 58A, a first voltage can be applied to the first common gate electrode (i.e., the first drain select gate electrode SGD1) and a second voltage can be applied to the second common gate electrode (i.e., the second drain select gate electrode SGD2). The first voltage is greater than threshold voltages of the first and third drain select transistors (DST1, DST3), and the second voltage is between the threshold voltages of the second and fourth drain select transistors (DST2, DST4). The first, second, and third drain select transistors (DST1, DST2, DST3) are turned on and the fourth drain select transistor DST4 is turned off. An operation selected from a programming operation and a read operation on more or more of the memory cells of the first NAND string 58A (e.g., by application of Vprog or Vread to the control gate electrode(s) 46A of the selected memory cell(s)) while the second NAND string 58B remains inactive due to turn-off of the fourth drain select transistor DST4.

In order to perform a programming operation or a read operation on the second vertical NAND string 58B, a first voltage can be applied to the first common gate electrode (i.e., the first drain select gate electrode SGD1) and a second voltage can be applied to the second common gate electrode (i.e., the second drain select gate electrode SGD2). The first voltage is between the threshold voltages of the first and third drain select transistors (DST1, DST3), and the second voltage is greater than the threshold voltages of the second and fourth drain select transistors (DST2, DST4). The second, third, and fourth drain select transistors (DST2, DST3, DST4) are turned on, and the first drain select transistor DST1 is turned off. An operation selected from a programming operation and a read operation on the second NAND string 58B while the first NAND string 58A remains inactive due to turn-off of the first drain select transistor DST1.

Figure 14:
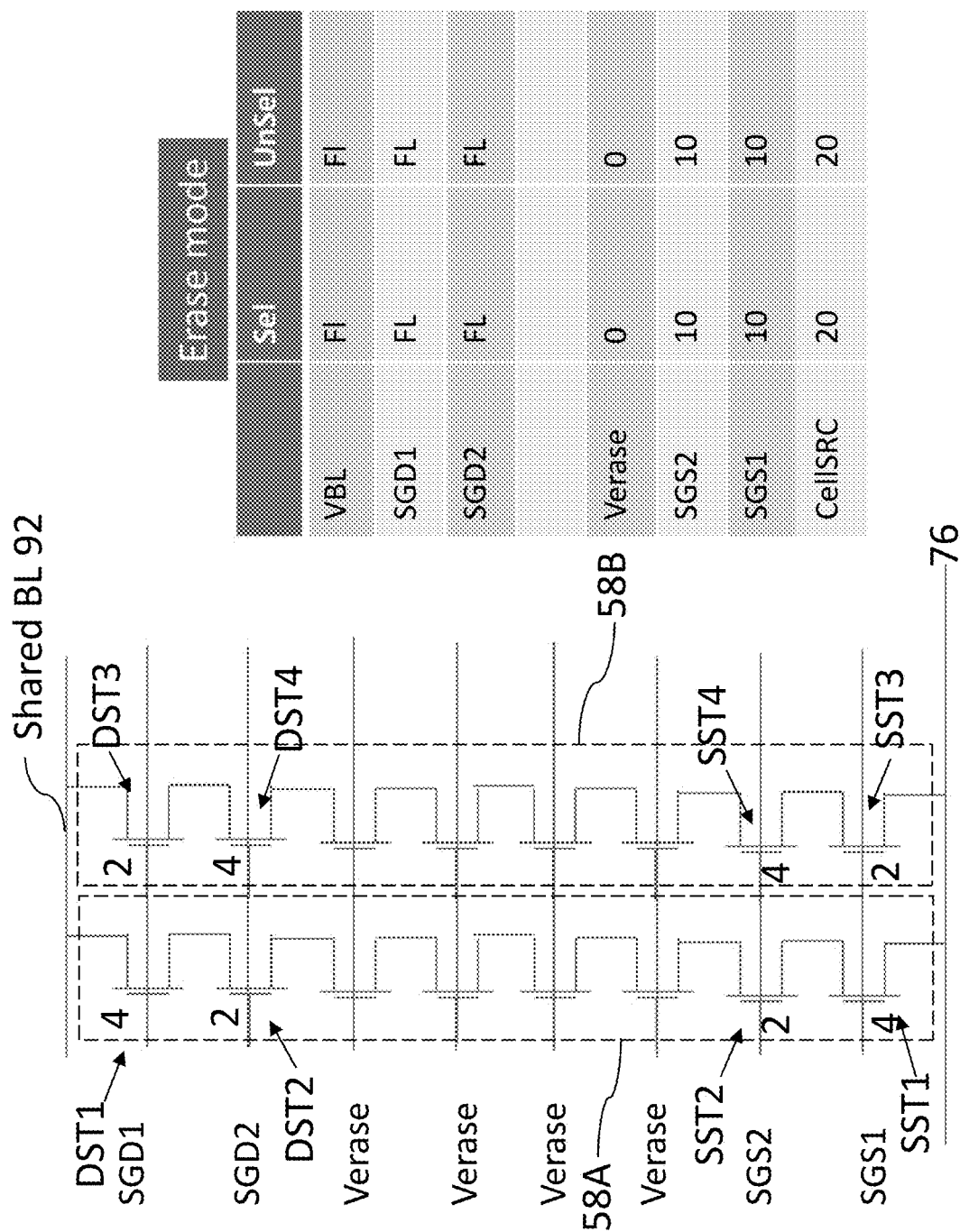
FIG. 14 illustrates operating conditions of the circuit of FIG. 9 during an erase mode according to an embodiment of the present disclosure.

Referring to FIG. 14, an erase operation can be performed simultaneously on both vertical NAND strings (58A, 58B). A high voltage CellSRC of about 20V (which is higher than Vth) can be applied to the source region 61 through the backside contact via structure 76. The bit line 92 and the drain select gate electrodes (SGD1, SGD2) can be electrically floating, the source select electrodes (SGS1, SGS2) are set to a high voltage (e.g., 10V) which is between CellSRC and Vth, and the control gate electrodes 46A are set to an erase voltage, Verase (e.g., zero volts).

Figure 15:
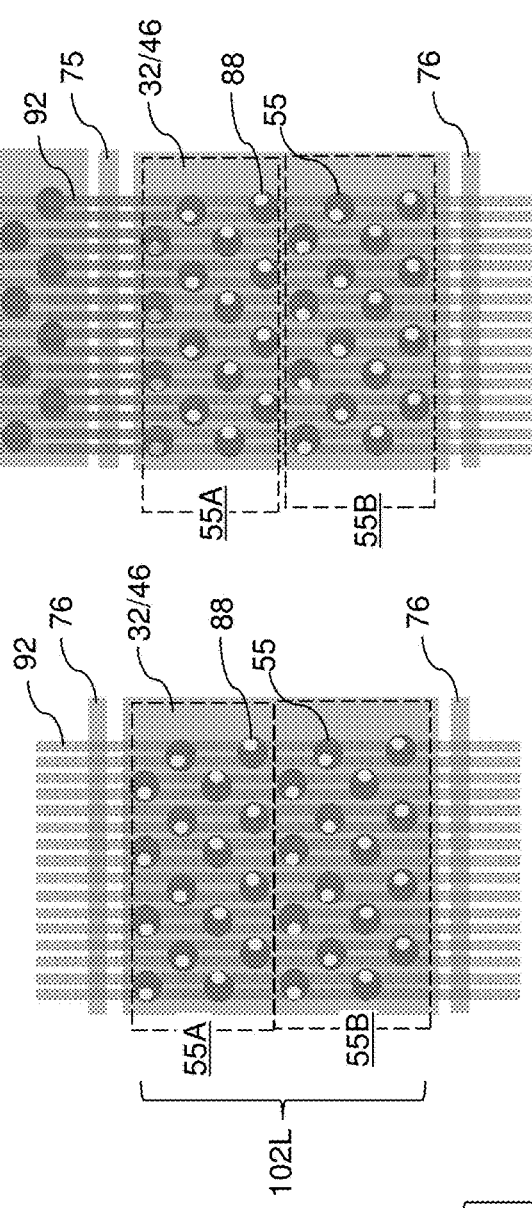
FIG. 15 is a first exemplary wiring scheme for bit lines for a plurality of pairs of vertical NAND strings according to a comparative example.

FIG. 15 illustrates a wiring scheme of a comparative example in which all NAND strings in the same memory block 102 are connected to different bit lines 92. Specifically, the drain regions located on each memory stack structure 55 extending through the alternating stack (32, 46) in the same memory block 102 are connected to different bit lines 92 using a respective drain contact via structure 88. This requires a dense bit line 92 arrangement with a tight pitch which undesirably increases the bit line capacitance and increases the difficulty of photolithography and patterning of the bit lines.

Figure 16:
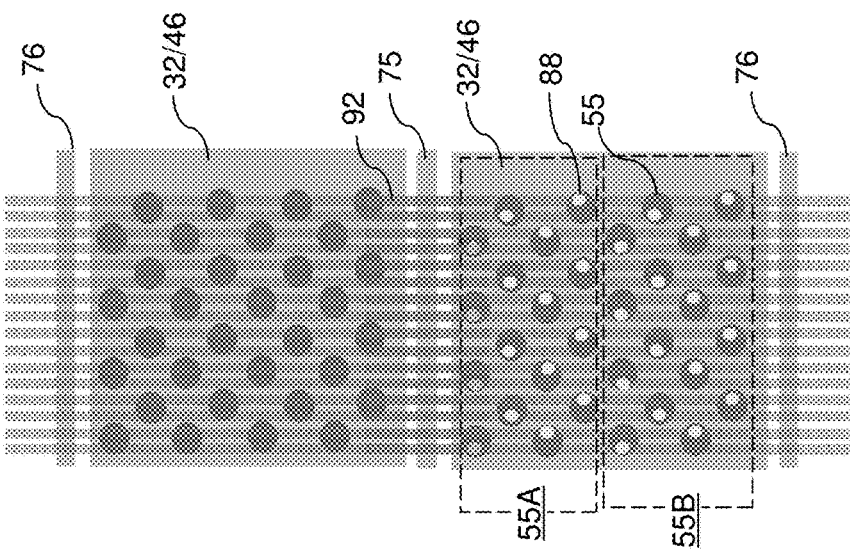
FIG. 16 is a first exemplary wiring scheme for bit lines for a plurality of pairs of vertical NAND strings according to an embodiment of the present disclosure.
Figure 17:
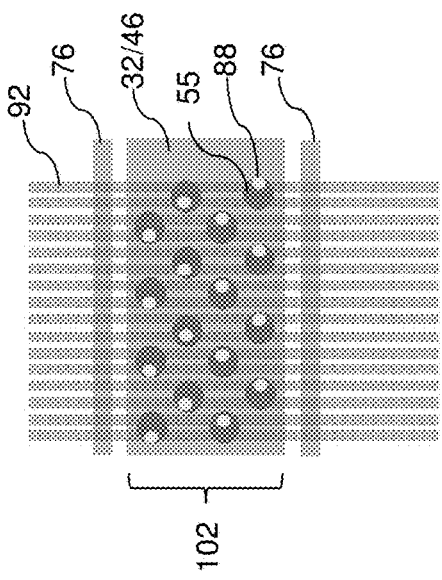
FIG. 17 is a second exemplary wiring scheme for bit lines for a plurality of pairs of vertical NAND strings according to an embodiment of the present disclosure.
Figure 18:
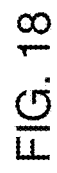
FIG. 18 is a third exemplary wiring scheme for bit lines for a plurality of pairs of vertical NAND strings according to an embodiment of the present disclosure.

FIGS. 16, 17 and 18 illustrate embodiment exemplary wiring schemes for connecting two NAND stings in the same memory block 102 to a single, common (i.e., shared) bit line 92. Specifically, two drain regions located on pairs of memory stack structure 55 extending through the alternating stack (32, 46) in the same memory block 102 are connected to the same bit line 92 using a respective drain contact via structure 88.

FIG. 16 illustrates an embodiment which contains four rows of NAND stings/memory stack structures 55 per block 102. In this embodiment, the pitch of the bit lines 92 is increased compared to the device of FIG. 15. This decreases the bit line capacitance and decreases the difficulty of photolithography and patterning of the bit lines.

FIG. 17 illustrates an embodiment with a larger memory block 102L which contains eight rows of NAND stings/memory stack structures 55 per memory block. In this embodiment, the pitch of the bit lines 92 is the same as that in the device of FIG. 15, but the size of the memory block is increased, which increases the number of NAND strings per substrate and decreases the device cost.

FIG. 18 illustrates an embodiment in which the memory blocks are separated by the shallow trench 80 filled with the insulating layer 75, similar to the device shown in FIG. 8C. The same advantages of the device shown in FIGS. 16 and 17 may be realized with the shallow trench 80 isolated memory blocks of FIG. 18.

As shown in FIGS. 16-18, first memory stack structures 55A including first implanted channel regions IR1 may be located on outer rows in a cluster of memory stack structures 55, and second memory stack structures 55B including second implanted channel regions IR2 may be located on inner rows in the cluster of memory stack structures 55 between a pair of backside contact via structures 76 as illustrated in FIGS. 16-18. Alternatively, first memory stack structures 55A including first implanted channel regions IR1 and second memory stack structures 55B including second implanted channel regions IR2 may be located on each side of a cluster of memory stack structures 55 between a pair of backside contact via structures 76. In either case, each bit line 92 is electrically connected (i.e., shorted) to two drain regions 63, one of which contacts a vertical semiconductor channel 60 within a first memory stack structure 55A in a first vertical NAND string 58A and another vertical semiconductor channel 60 within a second memory stack structure 55B in a second vertical NAND string 58B.

FIGS. 19A, 19B, 20A and 20B illustrate steps in alternative device fabrication methods which may increase the threshold voltage differences between select transistors of the same type (e.g., either drain or source select transistors) located in different device levels (i.e., at different distances from the substrate) on the same side of the memory cell charge storage transistors (59A, 59B).

Figure 19A:
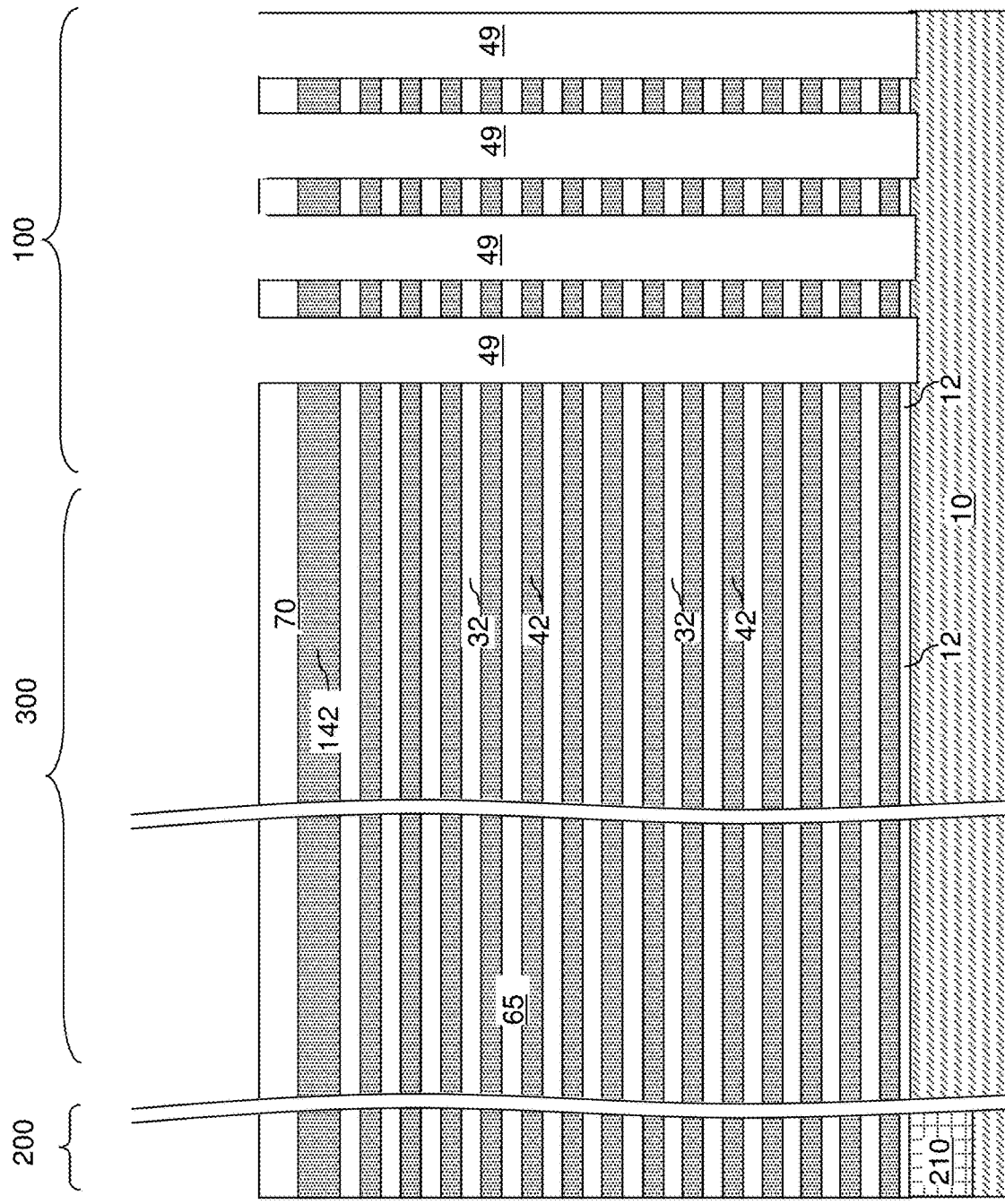

In FIG. 19B, one of the select gate electrodes (e.g., SGD1) is thicker than another select gate electrode (e.g., SGD2) of the same type (e.g., drain select gate electrode located on the same side of the memory cell transistors 59A, 59B). This configuration may be achieved by forming one or more of the sacrificial layers 142 with a greater (or lesser) thickness than the other sacrificial layers 42 in the alternating stack, as shown in FIG. 19A. During replacement of the sacrificial layers with the electrically conductive layers, the different thickness (e.g., thicker or thinner) sacrificial layer 142 is replaced with an electrically conductive select gate layer 146B with different thickness (e.g., thicker or thinner) than the other electrically conductive select gate layers 46B of the same type located on the same side of the memory cell transistors 59A, 59B.

Figure 20A:
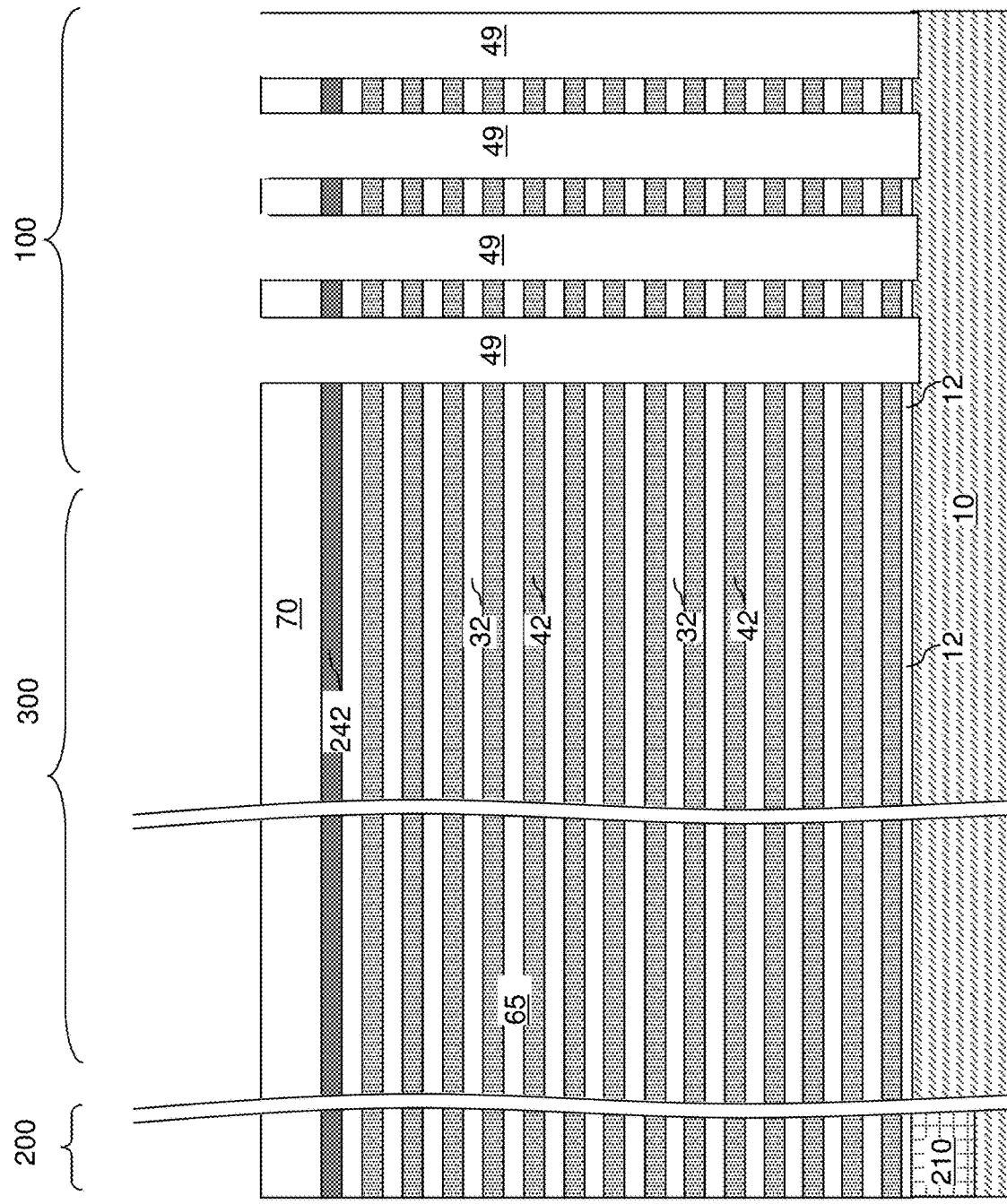
FIGS. 20A and 20B are vertical cross-sectional views of steps in a method of making a vertical NAND device according to another alternative embodiment of the present disclosure.
Figure 20B:
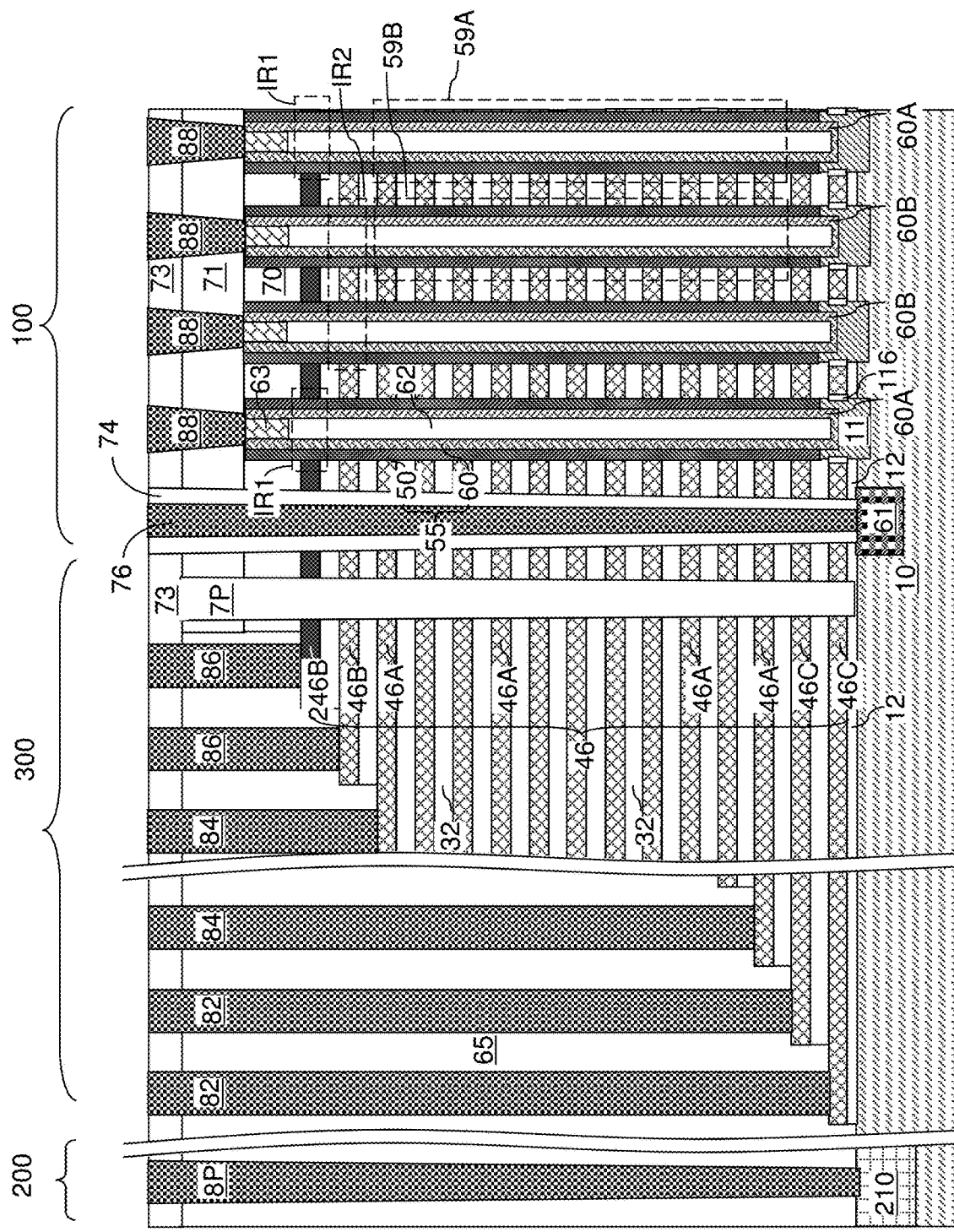

In FIG. 20B, one of the select gate electrodes (e.g., SGD1) has a different composition with a different work function than another select gate electrode (e.g., SGD2) of the same type (e.g., drain select gate electrode located on the same side of the memory cell transistors 59A, 59B). This configuration may be achieved by forming one or more of the sacrificial layers 242 of a different material than the other sacrificial layers 42 in the alternating stack, as shown in FIG. 20A. The sacrificial layers 242 and 42 may be removed during separate steps using different selective etchants and the resulting respective backside recesses may be refilled with different gate electrode materials 246B, 46B in separate replacement steps. For example, layers 242 may comprise polysilicon if layers 42 comprise silicon nitride, and vice-versa. Layers 246B and 46B can be selected from different electrically conductive materials, such as tungsten, tungsten nitride, titanium, titanium nitride, tantalum, tantalum nitride, cobalt, ruthenium and silicides thereof. For example, electrode 246B may comprise cobalt and electrodes 46B, 46A and 46C may comprise tungsten and titanium nitride.

If desired the embodiments of FIGS. 19B and 20B may be used in combination. In other words, one or more of the select electrodes may have both a different composition and a different thickness than one or more of the select electrodes of the same type. In this embodiment, layer 142 in FIG. 19A has a different thickness and a different composition than the other sacrificial layers 42, and select gate electrode 146B has a different thickness and a different composition than the other select gate electrodes 46B of the same type.

In three dimensional NAND memory devices, during an erase operation, a channel needs to be charged up to a high level such that holes can be injected in the charge trap layer to erase the memory cells. The source of the holes can come from the P-well or from electron/hole pair generation via Gate Induced Drain Leakage (GIDL) erase. GIDL erase may be used for designs that place complementary metal-oxide-semiconductor (CMOS) circuitry underneath the memory array.

Drain-side GIDL erase may present two issues: 1) slow erase speed and drain select gate (SGD) erase; and 2) SGD transistor (i.e., drain select transistor) threshold voltage (Vt) upshift during program-erase (PE) cycling. Slow erase speed and SGD erase may result because in order to generate a sufficient amount of holes for the erase, bit line (BL) bias needs to be high and SGD bias needs to stay low for a long period of time. As channel potential is charging up, holes are not only injected in data word lines (WLs), but also into the SGD transistor causing undesired SGD transistor erase (e.g., SGD transistor Vt downshift). When channel charge-up speed is slow, GIDL erase can cause SGD Vt upshift issues after PE cycling. During an early phase of GIDL erase, BL ramps up to erase voltage (VERA) very quickly, while the channel charges up slowly. Under the SGD gate, the large potential difference between the BL and channel can generate electron/hole pairs. Some electrons are injected into the core high region (e.g., a region between the drain and SGD), causing SGD Vt upshift.

Figure 21A:
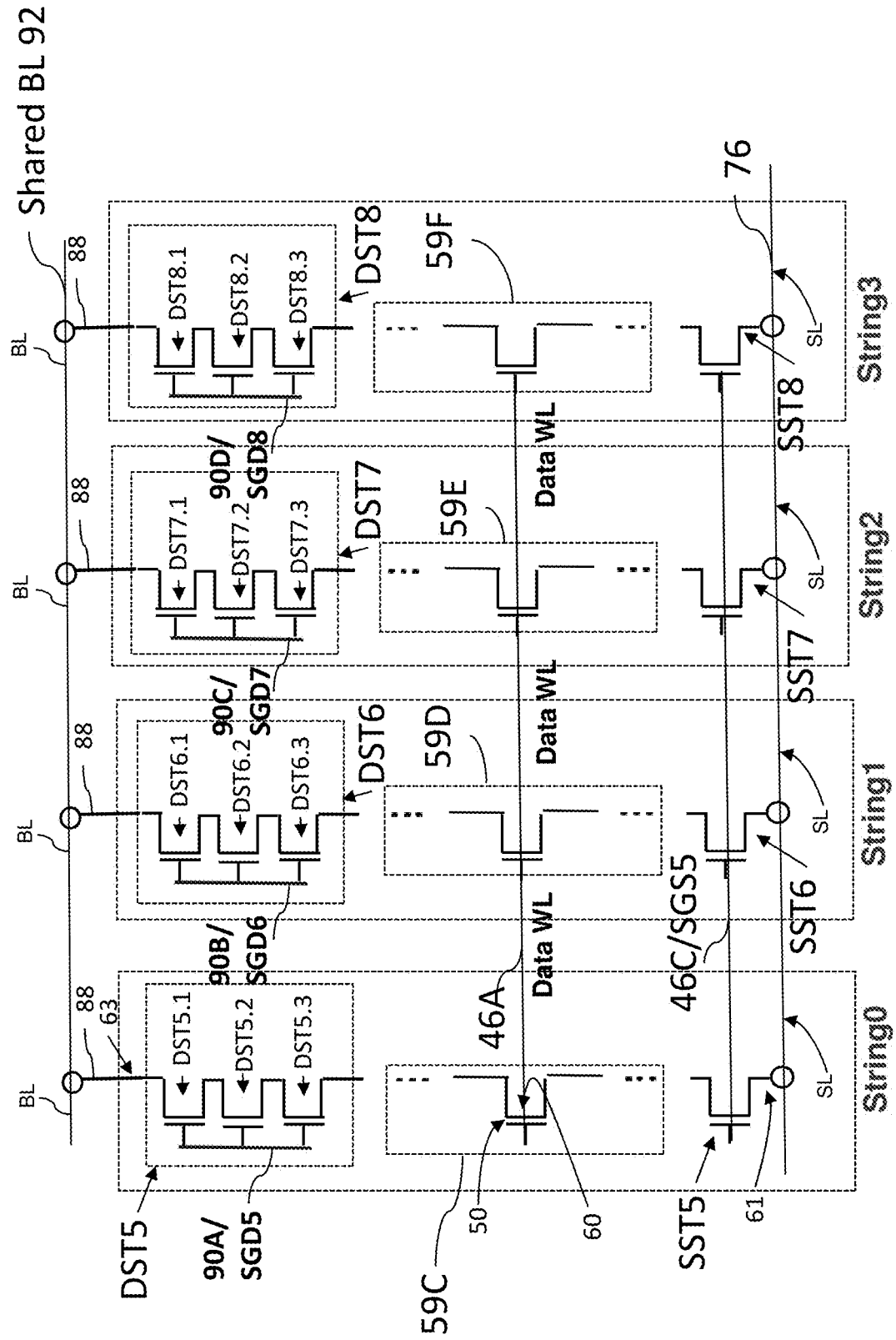
FIGS. 21A and 21B are circuit schematics of a comparative device and an embodiment device, respectively.
Figure 21B:
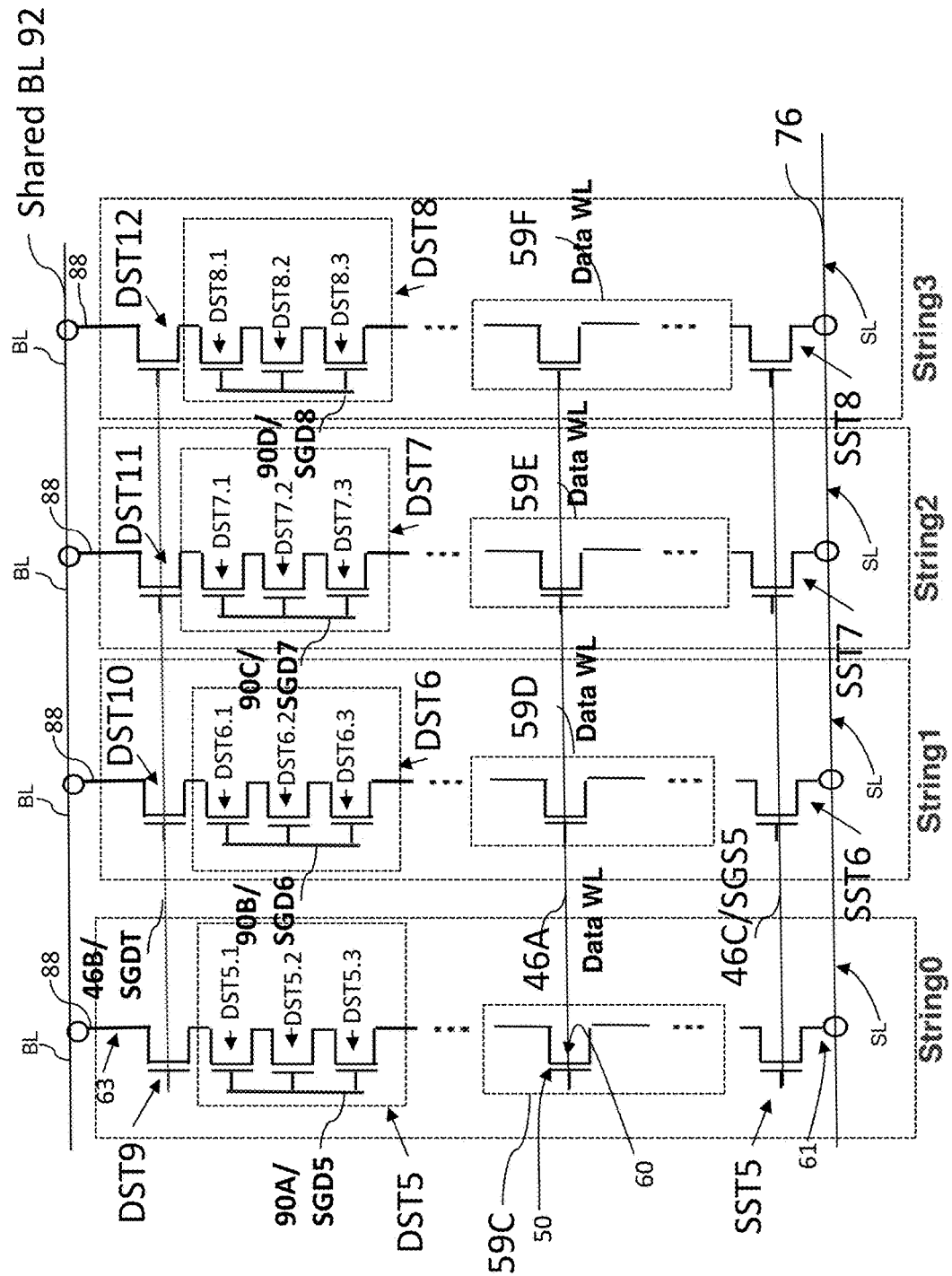
Figure 22A:
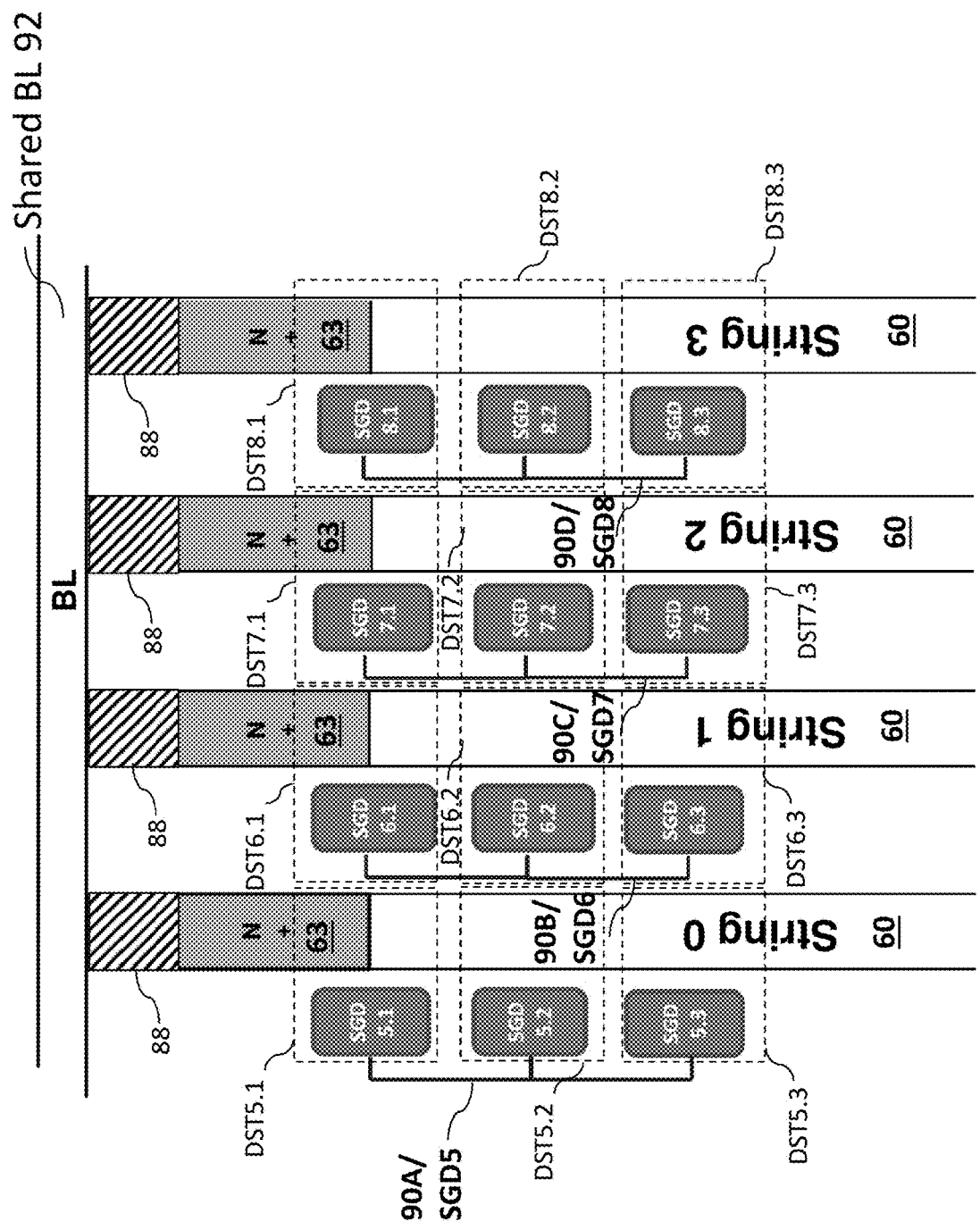
FIGS. 22A and 22B are schematic vertical cross-sectional views of the devices of FIGS. 21A and 21B, respectively.
Figure 22B:
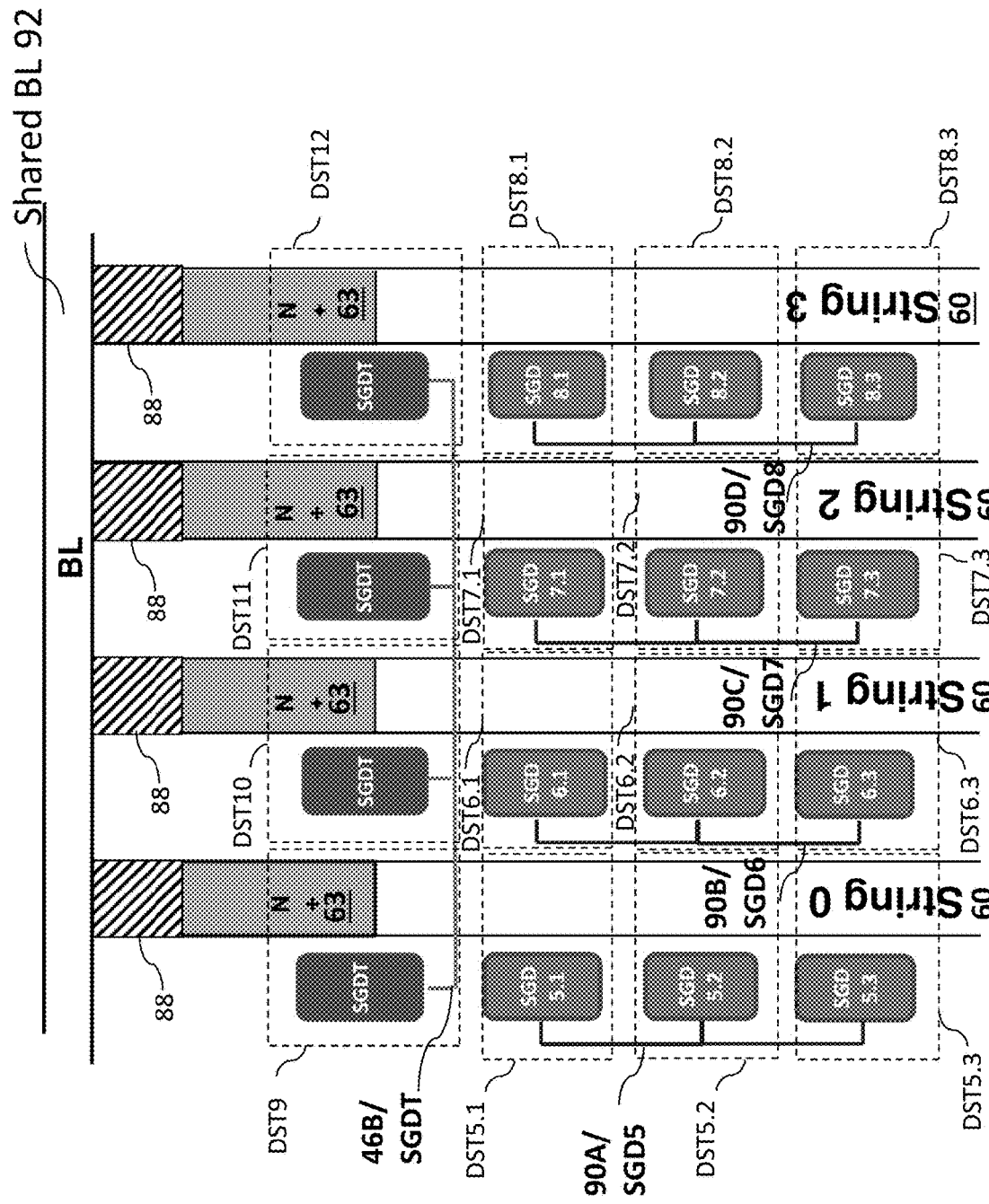

Thus, in order to improve erase speed of data WLs, a large bias should be maintained between the SGD and the BL to generate sufficient GIDL holes. However, as the channel charges up, a large potential difference between the SGD and the channel could cause undesired SGD transistor erase. The embodiment SGD structures described below solve or reduce the SGD erase problem. FIGS. 21A and 21B are circuit schematics of a comparative device and an embodiment device, respectively. FIGS. 22A and 22B are schematic vertical cross-sectional views of the devices of FIGS. 21A and 21B, respectively.

FIG. 21A shows a circuit including four vertical NAND strings (String0, String1, String2, String3). FIG. 22A is a schematic vertical cross-sectional view of the device of FIG. 21A. The device illustrated in FIGS. 21A and 22A may be a three-dimensional NAND memory device including an alternating stack of insulating layers 32 and electrically conductive layers 46 (e.g., WL's and select gates) located over a substrate similar to the devices described above, for example with reference to FIG. 8A, except that all drain select transistors have the same Vt.

With reference to FIGS. 21A and 22A collectively, each vertical NAND string (String0, String1, String2, String3) may extend through the alternating stack and may include memory cell charge storage transistors (59C, 59D, 59E, 59F) containing a source region 61, a vertical channel 60, memory film 50, and drain region 63 in series connections with additional devices, such as additional select transistors (DST5, SST5, DST6, SST6, DST7, SST7, DST8, SST8). The vertical NAND strings (String0, String1, String2, String3) may be in the same memory block or may be in different memory blocks. The vertical NAND strings (String0, String1, String2, String3) may share a common bit line 92, which is electrically connected (i.e., shorted) by the drain contacts 88 to drain regions, such as drain regions 63, in contact with the vertical semiconductor channels of the vertical NAND strings (String0, String1, String2, String3). An N+ drain region 63 may connect each respective vertical NAND string (String0, String1, String2, String3) to the bit line 92 via drain contact via structures 88.

Each vertical NAND string (String0, String1, String2, String3) may include any number (such as 64-128) of memory cell charge storage transistors 59C-F containing a respective portion of the memory film 50 and a respective portion of a vertical semiconductor channel 60, and a respective word line 46A as a control gate electrode.

The additional devices of the NAND strings (String0, String1, String2, String3) may include drain select transistors and source select transistors in series connections with the memory cell charge storage transistors.

Each NAND string (String0, String1, String2, String3) may include a respective source select transistor (SST5, SST6, SST7, SST8) connected to structure 76 (e.g., source local interconnect or electrode) which may contact a source region of a substrate, such as source region 61. The source select transistors (SST5, SST6, SST7, SST8) may share a source select gate electrode SGS5 (i.e., one of the source select gate electrodes 46C).

Each NAND string (String0, String1, String2, String3) may include a respective drain select transistor (DST5,

DST6, DST7, DST8) connected to a respective drain region, such as a drain region 63 described above. Each drain select transistor (DST5, DST6, DST7, DST8) may include one or more field effect transistors connected in series. For example, DST5 may include three transistors DST5.1, DST5.2, and DST5.3, DST6 may include three transistors DST6.1, DST6.2, and DST6.3, DST7 may include three transistors DST7.1, DST7.2, and DST7.3, and DST8 may include three transistors DST8.1, DST8.2, and DST8.3. The gates of the one or more field effect transistors connected in series in each respective drain select transistor (DST5, DST6, DST7, DST8) may be electrically connected to one another by a drain select gate electrode (90A, 90B, 90C, 90D) for that respective drain select transistor (DST5, DST6, DST7, DST8). Each drain select transistor (DST5, DST6, DST7, DST8) may be have its own respective drain select gate electrode (SGD5, SGD6, SGD7, SGD8) formed from the drain select gate electrode (90A, 90B, 90C, 90D) that is not electrically connected to a drain select gate electrode of another one of the drain select transistors (DST5, DST6, DST7, DST8). In other words, each respective drain select transistor (DST5, DST6, DST7, DST8) may have separate drain select gate electrodes (SGD5, SGD6, SGD7, SGD8) which are not electrically connected to each other. The separate drain select gate electrodes (SGD5, SGD6, SGD7, SGD8) which are not electrically connected to a drain select gate electrode of another drain select transistor (DST5, DST6, DST7, DST8) may be considered its own respective "string selective" SGD word line (SGD WL). The drain select gate electrodes (SGD5, SGD6, SGD7, SGD8) may overlap with drain regions 63. The separation of the drain select gate electrodes (SGD5, SGD6, SGD7, SGD8) across different strings (String0, String1, String2, String3) may allow a target string (String0, String1, String2, or String3) to be selected during programming (PGM), programming verify (PVFY), and reading (READ) operations. For example, the drain select gate electrode (SGD5, SGD6, SGD7, SGD8) biases may be separated among different strings (String0, String1, String2, String3) in order to select a target string (String0, String1, String2, or String3) during PGM, PVFY, and READ operations.

The embodiment SGD structure of FIGS. 21B and 22B is similar to the devices illustrated in FIGS. 21A and 22A, except that in the embodiment SGD structure of FIGS. 21B and 22B a "string-sharing" select gate electrode SGDT, which can be referred to as a SGDT WL is added on top of the "string-selective" SGD WLs (i.e., between the common bit line 92 and the drain select transistors (DST5, DST6, DST7, DST8) in each of the NAND strings (String0, String1, String2, String3)).

With reference to FIGS. 21B and 22B, in an embodiment, each NAND string (String0, String1, String2, String3) may include a respective drain select transistor (DST9, DST10, DST11, DST12) connected to a respective drain region, such as a drain region 63 described above. The drain select transistors (DST9, DST10, DST11, DST12) may be connected in series to the drain select transistor (DST5, DST6, DST7, DST8). The drain select transistors (DST9, DST10, DST11, DST12) may be connected between the common bit line 92 and the drain select transistors (DST5, DST6, DST7, DST8). As such, the drain select transistors (DST9, DST10, DST11, DST12) and their respective gates connected by the common drain select gate electrode (SGDT) may overlap with the drain region 63. The drain select transistors (DST9, DST10, DST11, DST12) may share a common drain select gate electrode (SGDT) (i.e., one of the drain select electrodes 46B). The common drain select gate electrode (SGDT) may operate as a "string-sharing" SGDT WL. The sharing of the common drain select gate electrode (SGDT) by the drain select transistors (DST9, DST10, DST11, DST12) may electrically connect each of the drain select transistors (DST9, DST10, DST11, DST12) to one another across the NAND strings (String0, String1, String2, String3) and may provide biasing of the drain select transistors (DST9, DST10, DST11, DST12) together using the common drain select gate electrode (SGDT).

In various embodiments, the SGDT WL may be dedicated for GIDL hole generation. The sufficient overlap of the gates of the drain select transistors (DST9, DST10, DST11, DST12) with the drain region 63, can: (1) generate strong GIDL current to improve data WL erase speed and/or reduce SGD Vt downshift; and (2) prevent or reduce SGD Vt upshift. The common drain select gate electrode (SGDT) is tolerant to erase or Vt downshift, since the string selection function is realized by the drain select transistors (DST5, DST6, DST7, DST8). SGD erase concern can be minimized by separated erase bias used for each NAND string (String0, String1, String2, String3). In other words, separating biasing between the common drain select gate electrode (SGDT) and the drain select gate electrodes (SGD5, SGD6, SGD7, SGD8) increases erase operation margin, significantly alleviating SGD erase concern.

Decoupling the common drain select gate electrode (SGDT) from the drain select gate electrodes (SGD5, SGD6, SGD7, SGD8) has other reliability benefits too. For example, the device illustrated in FIGS. 21A and 22A generally is susceptible to other program and erase disturb mechanisms. The device illustrated in FIGS. 21A and 22A is adjacent to a bias at a bit line voltage (VBL) while the channel potential may be positive or negative depending on the specific operation. These create potential gradients that can have disturbing consequences. If the device illustrated in FIGS. 21A and 22A is the SGD, the string-select nature of the SGD means its Vt generally needs to be well-controlled. However, in the embodiment device illustrated in FIGS. 21B and 22B, Vt does not need to be well controlled since the sole purpose of the common drain select electrode (SGDT) of the embodiment device illustrated in FIGS. 21B and 22B is to generate holes during erase. For all other operations, the common drain select gate electrode (SGDT) merely needs to be biased high enough to be conducting.

Figure 23:
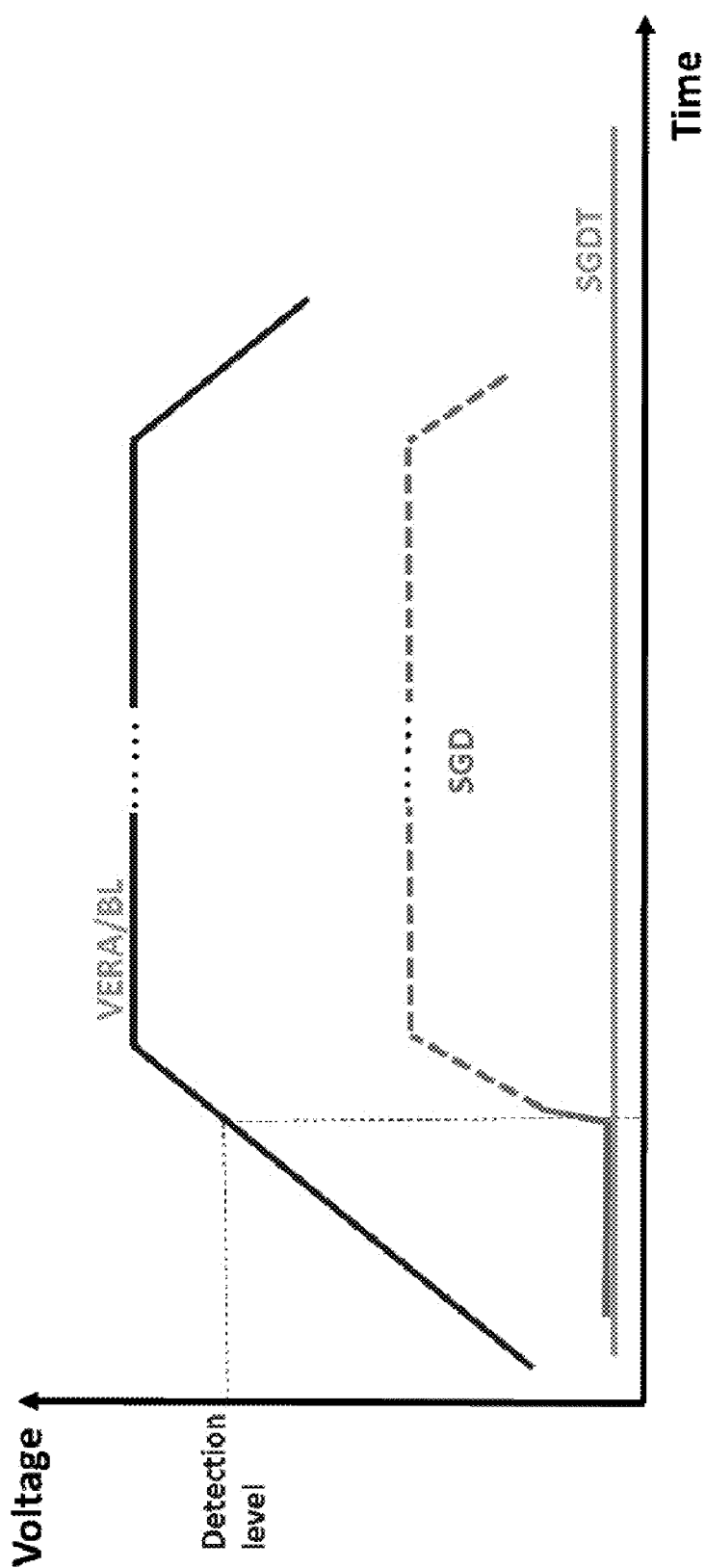
FIGS. 23 and 24 are graphs of waveforms during erase and program operations, respectively.
Figure 24:
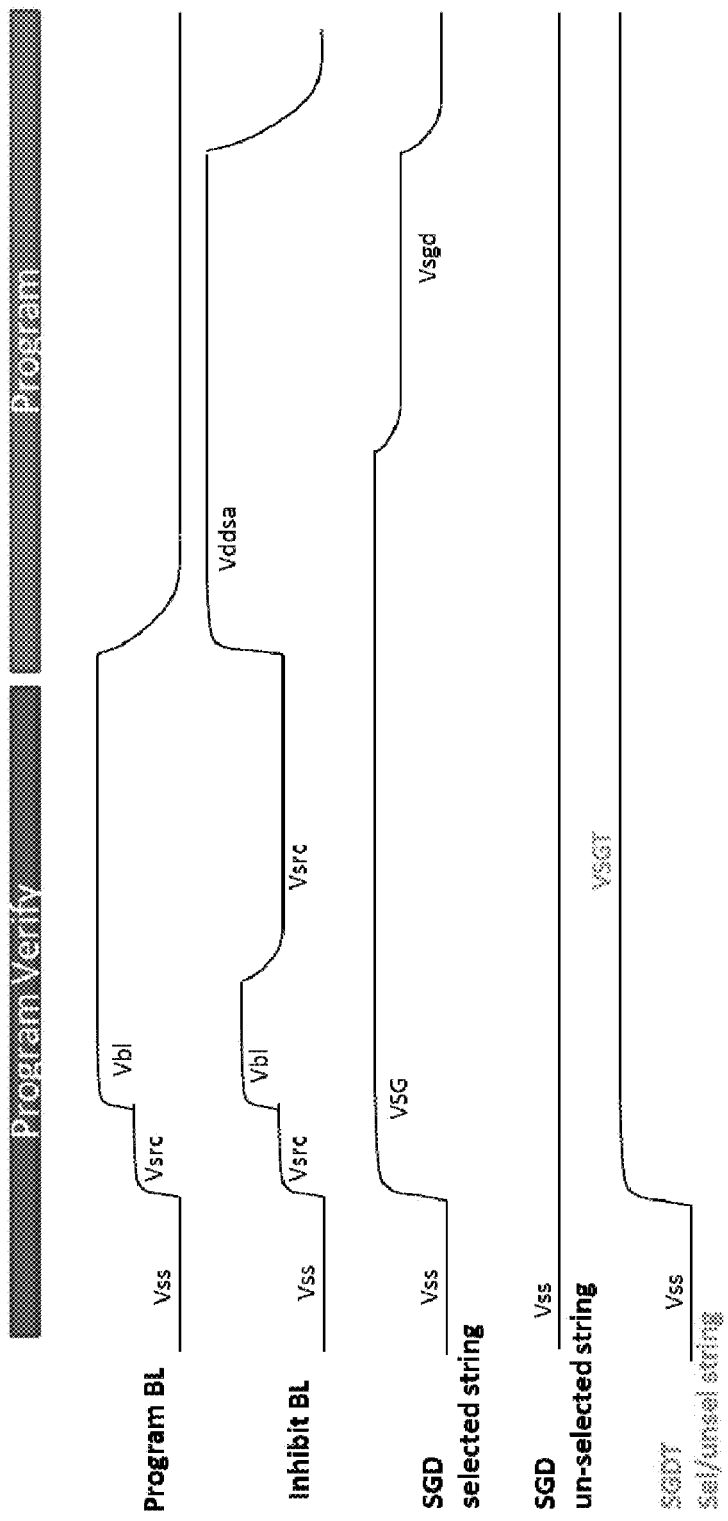

FIGS. 23 and 24 are graphs of waveforms during erase and program operations, respectively, for the embodiment device illustrated in FIGS. 21B and 22B. FIG. 23 shows the waveforms of voltage levels over time during an erase operation at the common bit line 92, a target drain select gate electrodes (SGD5, SGD6, SGD7, or SGD8), and the common drain select gate electrode (SGDT). During the erase operation, the common drain select gate electrode (SGDT) is biased at low voltage to ensure that GIDL generation is sufficient. For that reason, the common drain select gate electrode (SGDT) will be continually exposed to erase pulses and will thus have a Vt that remains low. A target drain select gate electrodes (SGD5, SGD6, SGD7, or SGD8) first stays at a low bias so that holes can come in from the drain side. When erase voltage (VERA) reaches a certain detection level (e.g., 4V to 10V), the target drain select gate electrodes (SGD5, SGD6, SGD7, or SGD8) becomes float and is coupled up with channel potential. The small potential difference between the target drain select gate electrodes (SGD5, SGD6, SGD7, or SGD8) and channel is to ensure hole conduction but won't cause target drain select gate electrodes (SGD5, SGD6, SGD7, or SGD8) erase. Alternatively, the target drain select gate electrodes (SGD5, SGD6, SGD7, or SGD8) could also be directly biased, but a detection circuit will sense the VERA voltage and ensure that the target drain select gate electrodes (SGD5, SGD6, SGD7, or SGD8) is always 4V to 10V below VERA. Thus, as shown in FIG. 23, during the erase operation, a first bias voltage is applied to the common drain select gate electrode and a second bias voltage is applied to a selected one of the first separate drain select gate electrode or the second separate drain select gate electrode, such that the first bias voltage is a lower voltage than the second bias voltage. The present inventors determined that the data WL erase speed does not depend significantly on SGDT Vt. However, if the SGDT Vt becomes too low, then the SGDT can be re-programmed back to the desired level.

FIG. 24 shows the waveforms of voltage levels over time during PGM and PVFY operations, at the common bit line 92, selected drain select gate electrodes (SGD5, SGD6, SGD7, or SGD8), the un-selected drain select gate electrodes (SGD5, SGD6, SGD7, and/or SGD8), and the common drain select gate electrode (SGDT). During the PGM/PVFY operations the common drain select gate electrode (SGDT) of the four strings (String0, String1, String2, String3) is biased at voltage (VSGT) to turn on the channel. The selected drain select gate electrodes (SGD5, SGD6, SGD7, or SGD8) of selected string (String0, String1, String2, or String3) is turned on and the un-selected drain select gate electrodes (SGD5, SGD6, SGD7, and/or SGD8) of the un-selected strings (String0, String1, String2, or String3) are turned off. Thus, as shown in FIG. 24, during a programming operation, a first bias voltage is applied to the common drain select gate electrode, a second bias voltage is applied to a selected one of the first separate drain select gate electrode or the second separate drain select gate electrode, and a third bias voltage is applied to an un-selected one of the first separate drain select gate electrode or the second separate drain select gate electrode, such that the first bias voltage and the second bias voltage are both higher voltages than the third bias voltage.

Figure 25:
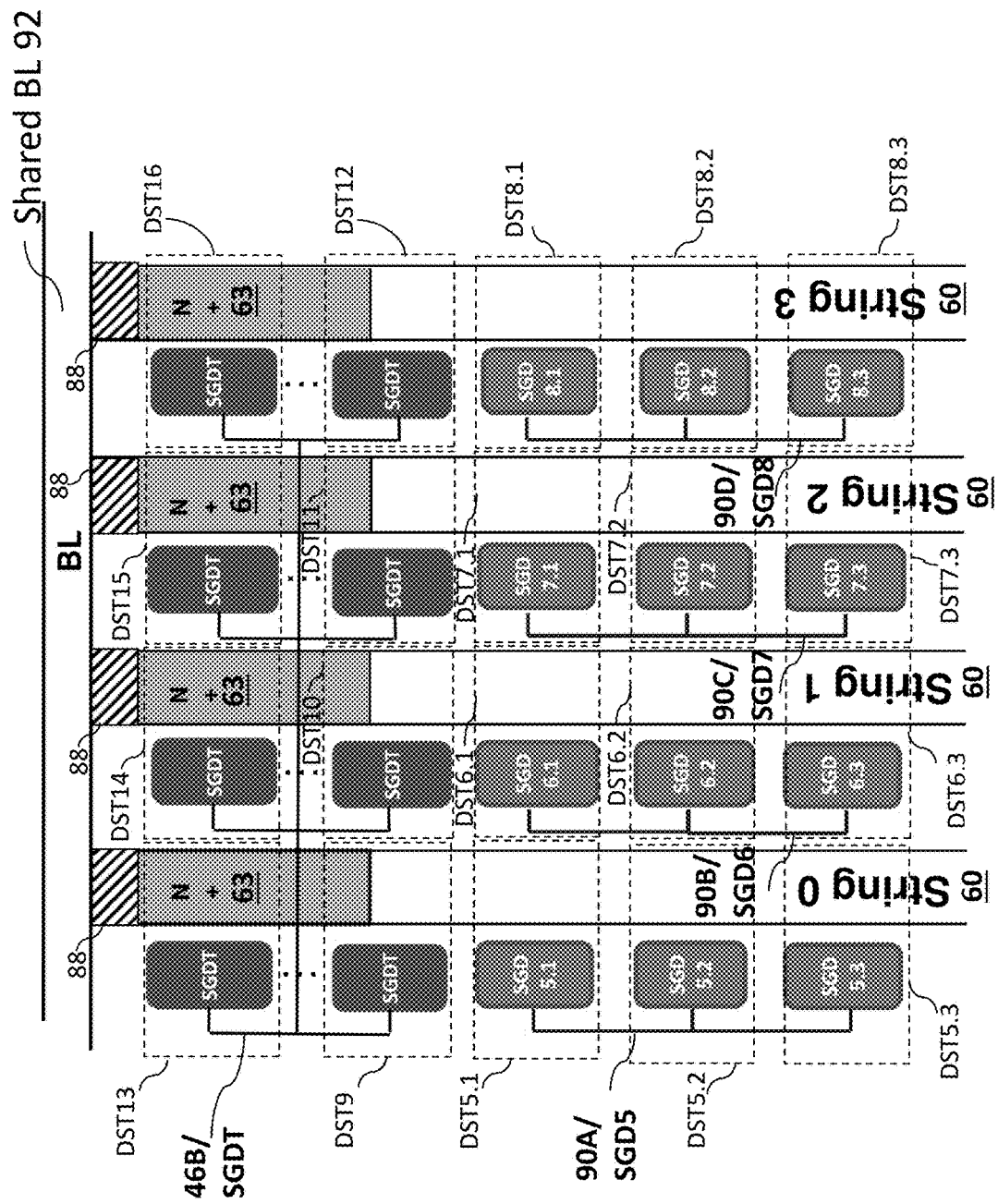
FIG. 25 is a schematic vertical cross-sectional view of a device according to an alternative embodiment.

FIG. 25 is a schematic vertical cross-sectional view of a device according to an alternative embodiment in which multiple SGDT WLs 46B are present on top of the SGDs 90A-90D. The device illustrated in FIG. 25 is similar to the device illustrated in FIGS. 21B and 22B, except that each NAND string (String0, String1, String2, String3) may include two or more drain select transistors, comprising transistors DST9, DST10, DST11, DST12 and additional drain select transistors, such as drain select transistors (DST13, DST14, DST15, DST16) connected in series with respective drain select transistors (DST9, DST10, DST11, DST12) in each string. The additional drain select transistors on each string, such as drain select transistors (DST13, DST14, DST15, DST16) may share the common drain select gate electrode (SGDT) with drain select transistors DST9, DST10, DST11, DST12 such that biasing of the common drain select gate electrode (SDGT) may bias all the drain select transistors (DST9, DST10, DST11, DST12, DST13, DST14, DST15, DST16). The presence of additional drain select transistors (DST13, DST14, DST15, DST16) on each string (String0, String1, String2, String3) between the common bit line 92 and the drain select transistors (DST5, DST6, DST7, DST8) may result in overlap of the gates of the drain select transistors (DST9, DST10, DST11, DST12, DST13, DST14, DST15, DST16) with the drain regions 63.

According to aspects of the present disclosure, methods of making memory devices are provided. In some aspects, an alternating stack of insulating layers and spacer material layers is formed over a substrate. The spacer material layers are formed as, or subsequently replace with, electrically conductive layers. A first vertical NAND string extending through the alternating stack is formed, the first vertical NAND string comprising a first drain region and first memory cell charge storage transistors in a series connection with a first drain select transistor and a second drain select transistor. A second vertical NAND string extending through the alternating stack is formed, the second vertical NAND string comprising a second drain region and second memory cell charge storage transistors in a series connection with a third drain select transistor and a fourth drain select transistor. A common drain select gate electrode shared between the first drain select transistor and the third drain select transistor is formed. A first separate drain select gate electrode connected to the second drain select transistor is formed. A second separate drain select gate electrode connected to the fourth drain select transistor is formed. The first separate drain select gate electrode and the second separate drain select gate electrode are formed such that the first separate drain select gate electrode and the second separate drain select gate electrode are not electrically connected to each other. In a further aspect, a third vertical NAND string extending through the alternating stack may be formed, the third vertical NAND string comprising a third drain region and third memory cell charge storage transistors in a series connection with a fifth drain select transistor and a sixth drain select transistor. Additionally, a fourth vertical NAND string extending through the alternating stack may be formed, the fourth vertical NAND string comprising a fourth drain region and fourth memory cell charge storage transistors in a series connection with a seventh drain select transistor and an eighth drain select transistor. A third separate drain select gate electrode connected to the sixth drain select transistor may be formed and a fourth separate drain select gate electrode connected to the eighth drain select transistor may be formed. In an aspect, the common drain select gate electrode is formed such that the common gate drain select gate electrode is shared between the fifth drain select transistor and the seventh drain select transistor. Additionally, the first separate drain select gate electrode, the second separate drain select gate electrode, the third separate drain select gate electrode, and the fourth separate drain select gate electrode are formed so as to be not electrically connected to each other. In an aspect, the first drain select transistor and the second drain select transistor are formed between a bit line and the first memory cell charge storage transistors on the first vertical NAND string, and the third drain select transistor and the fourth drain select transistor are formed between the bit line and the second memory cell charge storage transistors on the second vertical NAND string. In an aspect, the first drain select transistor is formed under the bit line and the second drain select transistor is formed between the first drain select transistor and the first memory cell charge storage transistors, and the third drain select transistor is formed under the bit line and the fourth drain select transistor is formed between the third drain select transistor and the second memory cell charge storage transistors.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:
an alternating stack of insulating layers and electrically conductive layers located over a substrate;
a first vertical NAND string extending through the alternating stack, the first vertical NAND string comprising a first drain region and first memory cell charge storage transistors in a series connection with a first drain select transistor and a second drain select transistor;
a second vertical NAND string extending through the alternating stack, the second vertical NAND string comprising a second drain region and second memory cell charge storage transistors in a series connection with a third drain select transistor and a fourth drain select transistor;
a common drain select gate electrode shared between the first drain select transistor and the third drain select transistor;
a first separate drain select gate electrode connected to the second drain select transistor;
a second separate drain select gate electrode connected to the fourth drain select transistor,
wherein the first separate drain select gate electrode and the second separate drain select gate electrode are not electrically connected to each other;
wherein:
the memory device is configured such that during an erase operation, the common drain select gate electrode is biased with a first bias voltage and a selected one of the first separate drain select gate electrode or the second separate drain select gate electrode is biased with a second bias voltage; and
the first bias voltage is a lower voltage than the second bias voltage.

2. The memory device of claim 1, wherein the first and second vertical NAND strings are located in a same memory block.

3. The memory device of claim 1, wherein the common drain select gate electrode is shared between four vertical NAND strings.

4. The memory device of claim 1, further comprising:
a third vertical NAND string extending through the alternating stack, the third vertical NAND string comprising a third drain region and third memory cell charge storage transistors in a series connection with a fifth drain select transistor and a sixth drain select transistor;
a fourth vertical NAND string extending through the alternating stack, the fourth vertical NAND string comprising a fourth drain region and fourth memory cell charge storage transistors in a series connection with a seventh drain select transistor and an eighth drain select transistor;
a third separate drain select gate electrode connected to the sixth drain select transistor; and
a fourth separate drain select gate electrode connected to the eighth drain select transistor,
wherein:
the common drain select gate electrode is further shared between the fifth drain select transistor and the seventh drain select transistor; and
the first separate drain select gate electrode, the second separate drain select gate electrode, the third separate drain select gate electrode, and the fourth separate drain select gate electrode are not electrically connected to each other.

5. The memory device of claim 4, wherein the second drain select transistor, the fourth drain select transistor, the sixth drain select transistor, and the eighth drain select transistor each comprise three series connected transistors in each respective vertical NAND string.

6. The memory device of claim 4, wherein the first drain select transistor, the third drain select transistor, the fifth drain select transistor, and the seventh drain select transistor each comprise two or more series connected transistors in each respective vertical NAND string.

7. The memory device of claim 1, wherein the memory device is configured for gate induced drain leakage erase.

8. The memory device of claim 1, wherein:
the first drain select transistor and the second drain select transistor are connected between a bit line and the first memory cell charge storage transistors on the first vertical NAND string; and
the third drain select transistor and the fourth drain select transistor are connected between the bit line and the second memory cell charge storage transistors on the second vertical NAND string.

9. The memory device of claim 8, wherein:
the first drain select transistor is connected to the bit line and the second drain select transistor is connected between the first drain select transistor and the first memory cell charge storage transistors; and
the third drain select transistor is connected to the bit line and the fourth drain select transistor is connected between the third drain select transistor and the second memory cell charge storage transistors.

10. The memory device of claim 1, wherein:
the memory device is configured such that during a programming operation, the common drain select gate electrode is biased with a first bias voltage, a selected one of the first separate drain select gate electrode or the second separate drain select gate electrode is biased with a second bias voltage, and an un-selected one of the first separate drain select gate electrode or the second separate drain select gate electrode is biased with a third voltage; and
the first bias voltage and the second bias voltage are both higher voltages than the third bias voltage.

11. A method of operating a memory device comprising an alternating stack of insulating layers and electrically conductive layers located over a substrate; a first vertical NAND string extending through the alternating stack, the first vertical NAND string comprising a first drain region and first memory cell charge storage transistors in a series connection with a first drain select transistor and a second drain select transistor; a second vertical NAND string extending through the alternating stack, the second vertical NAND string comprising a second drain region and second memory cell charge storage transistors in a series connection with a third drain select transistor and a fourth drain select transistor; a common drain select gate electrode shared between the first drain select transistor and the third drain select transistor; a first separate drain select gate electrode connected to the second drain select transistor; and a second separate drain select gate electrode connected to the fourth drain select transistor, wherein the first separate drain select gate electrode and the second separate drain select gate electrode are not electrically connected to each other, the method comprising:

applying a first bias voltage to the common drain select gate electrode during an erase operation of the first memory cell charge storage transistors or the second memory cell charge storage transistors; and applying a second bias voltage to the common drain select gate during a programming operation of the first memory cell charge storage transistors or the second memory cell charge storage transistors, wherein the first bias voltage is lower than the second bias voltage.

12. The method of claim 11, further comprising activating only one of the first vertical NAND string or the second vertical NAND string during the programming operation.

13. The method of claim 11, wherein the erase operation is a gate induced drain leakage erase operation.

14. A method of operating a memory device comprising an alternating stack of insulating layers and electrically conductive layers located over a substrate; a first vertical NAND string extending through the alternating stack, the first vertical NAND string comprising a first drain region and first memory cell charge storage transistors in a series connection with a first drain select transistor and a second drain select transistor; a second vertical NAND string extending through the alternating stack, the second vertical NAND string comprising a second drain region and second memory cell charge storage transistors in a series connection with a third drain select transistor and a fourth drain select transistor; a common drain select Rate electrode shared between the first drain select transistor and the third drain select transistor; a first separate drain select gate electrode connected to the second drain select transistor; and a second separate drain select gate electrode connected to the fourth drain select transistor, wherein the first separate drain select gate electrode and the second separate drain select gate electrode are not electrically connected to each other, the method comprising:

applying, during an erase operation, a first bias voltage to the common drain select gate electrode and a second bias voltage to a selected one of the first separate drain select gate electrode or the second separate drain select gate electrode, wherein the first bias voltage is a lower voltage than the second bias voltage.

15. The method of claim 14, further comprising:

applying, during a programming operation, a first bias voltage to the common drain select gate electrode, a second bias voltage to a selected one of the first separate drain select gate electrode or the second separate drain select gate electrode, and a third bias voltage to an un-selected one of the first separate drain select gate electrode or the second separate drain select gate electrode, wherein the first bias voltage and the second bias voltage are both higher voltages than the third bias voltage.

* * * * *